United States Patent [19]

Teuscher

[11] 3,867,147

[45] Feb. 18, 1975

[54] LIGHT-SENSITIVE DIAZO COMPOUNDS AND REPRODUCTION MATERIAL EMPLOYING THE SAME

[75] Inventor: Leon A. Teuscher, Webster, N.Y.

[73] Assignee: American Hoeschst Corporation, Bridgewater, N.J.

[22] Filed: Oct. 29, 1973

[21] Appl. No.: 410,324

Related U.S. Application Data

[63] Continuation of Ser. No. 826,297, May 20, 1969, abandoned.

[52] U.S. Cl. .......... 96/33, 96/35.1, 96/36.2, 96/36.3, 96/36.4, 96/49, 96/75, 96/85, 96/86 P, 96/87 R, 96/91 R, 96/91 N, 96/91 D, 96/115 P, 96/115 R, 260/141, 260/142

[51] Int. Cl. .......... G03f 7/08, G03f 7/12, G03c 1/54

[58] Field of Search .......... 96/33, 36.1, 49, 75, 91, 96/86 R, 86 P, 115 R, 35.1; 260/141, 142

[56] References Cited

UNITED STATES PATENTS

| | | | |
|---|---|---|---|
| 2,063,631 | 12/1936 | Schmidt et al. | 96/91 |
| 2,498,722 | 2/1950 | Straley | 260/141 |
| 2,541,727 | 2/1951 | Von Glahn et al. | 96/91 |
| 2,593,839 | 4/1952 | Buc | 96/91 |
| 2,593,911 | 4/1952 | Neumann et al. | 96/91 |
| 2,649,373 | 8/1953 | Neugebauer et al. | 96/75 |
| 2,679,498 | 5/1954 | Sever et al. | 96/91 |
| 2,717,832 | 9/1955 | Sulich | 96/91 |
| 3,155,512 | 11/1964 | DeBoer | 260/141 |
| 3,220,832 | 11/1965 | Uhlig | 96/75 |
| 3,235,382 | 2/1966 | Neugebauer et al. | 96/75 |
| 3,235,383 | 2/1966 | Steppan et al. | 96/75 |
| 3,236,646 | 2/1966 | Steppan et al. | 96/75 |
| 3,246,986 | 4/1966 | Borchers | 96/75 |
| 3,300,309 | 1/1967 | Chu | 96/75 |
| 3,503,330 | 3/1970 | Chu | 96/75 |
| 3,510,307 | 5/1970 | Borchers et al. | 96/75 |

FOREIGN PATENTS OR APPLICATIONS

| | | | |
|---|---|---|---|
| 941,835 | 11/1963 | Great Britain | 96/91 |

OTHER PUBLICATIONS

Kosar, J., "Light-Sensitive systems," Wiley & Sons, 8/1965, p. 322–324.

*Primary Examiner*—Charles L. Bowers, Jr.
*Attorney, Agent, or Firm*—James E. Bryan

[57] ABSTRACT

This invention relates to novel light-sensitive compounds, a process for the preparation of the light-sensitive compounds, and the use of the light-sensitive compounds, the latter being, in each case, a condensation product of an aromatic diazonium compound which comprises repeating units of each of the general types $$A(\text{-}D)_n \text{ and } B,$$

which are linked by a bivalent intermediate member derived from formaldehyde, wherein A is a radical of a compound containing at least two members selected from the group consisting of an aromatic ring and a heterocyclic ring of aromatic nature, which compound is capable of condensation in at least one position with an active carbonyl compound in an acid medium, D is a diazonium salt group linked to an aromatic carbon atom of A, $n$ is an integer from 1 to 10, and B is a radical of a compound free of diazonium groups and being capable of condensation in at least one position with an active carbonyl compound in an acid medium, the condensation product containing about 0.01 to 50 B units per unit of $A(\text{-}D)_n$.

62 Claims, No Drawings

LIGHT-SENSITIVE DIAZO COMPOUNDS AND REPRODUCTION MATERIAL EMPLOYING THE SAME

This is a continuation, of application Ser. No. 826,297, filed May 20, 1969.

This invention relates to novel light-sensitive compounds, a process for the preparation thereof, and to light-sensitive reproduction material, which latter comprises a support having a reproduction layer thereon containing at least one of the novel compounds which are light-sensitive condensation products of aromatic diazonium salts.

It is known to use light-sensitive aromatic diazonium compounds for sensitizing reproduction materials which are useful for the production of single copies or printing plates.

High molecular weight diazonium salts with several diazonium groups in the molecule have been advantageously employed, particularly in the production of tanned images or planographic printing forms, the reproduction layer of which is to be rendered insoluble or oleophilic by the action of light. These diazonium compounds usually have a resinous character and are obtained, for example, by the introduction of diazonium groups into phenol-formaldehyde condensation resins either by nitration, reduction, and diazotization or by other known reactions. The diazo resins thus obtained have certain disadvantages, however, e.g., a very limited storability, and therefore have not become of practical importance.

Polyfunctional diazonium salts have been obtained in another way, i.e., certain aromatic diazonium salts have been condensed in an acid condensation medium with active carbonyl compounds, particularly formaldehyde. This type of high molecular weight diazonium compound is used on a large scale in the production of reproduction materials, particularly in the production of printing forms. Of these compounds which are described, for example, in U.S. Pats. Nos. 2,063,631 and 2,667,415, particularly the condensation products of diphenylamine diazonium salts with formaldehyde have become of great technical importance.

The preparation of such and similar diazo resins is further described in U.S. Pat. Nos. 2,679,498; 3,050,502; 3,311,605; 3,163,633; 3,406,159, and 3,277,074.

The production of tanned images by combining such diazo resins with hydrophilic collids and, if desired, dyestuffs or pigments, in reproduction layers is described, for example, in U.S. Pat. No. 2,100,063; 2,687,958, and 3,010,389.

By far the greatest importance, however, of this class of diazo resins is in reproduction materials for the photomechanical production of planographic and offset printing forms. The diazo resins may be employed in the reproduction layers of these materials without further additives or, for example, in combination with water-soluble colloids or with water-insoluble polymers which are not light-sensitive. Exemplary of suitable supports for such reproduction layers are water-resistant papers with suitable lithographic surfaces, i.e., superficially saponified cellulose acetate, metal supports such as aluminum, zinc, copper, brass, chromium, niobium, and tantalum; multimetal supports; lithographic stone; and the like. Metal supports are preferable for long printing runs and aluminum is usually employed. The use of metal as a supporting material for reproduction layers containing the listed diazo resins has the disadvantage, inter alia, that the adhesion of the exposure products of the diazo resins on the metal supports usually is not very good and, furthermore, that the metal may have a decomposing effect on the diazo resin.

A number of suggestions have been made for avoiding these difficulties, e.g. to pretreat the metal surface with silicates (U.S. Pat. No. 2,714,066), with organic polyacids (U.S. Pat. No. 3,136,636), with phosphonic acids and their derivatives (U.S. Pat. No. 3,220,832), with potassium hexafluorozirconate (U.S. Pat. No. 2,946,683), furthermore to use diazo resins prepared in phosphoric acid (U.S. Pat. No. 3,235,384), to add phosphoric acid to the diazo resins and to use them in a metal salt-free state (U.S. Pat. No. 3,236,646), to use anodized aluminum surfaces, and the like.

Despite finding wide technical use, the known diazo resins have other disadvantages. With the low molecular weight condensates which are advantageously employed, with respect to storability, only unsatisfactory ink acceptance of the exposure products is achieved on non-metallic supports into which the mass can easily penetrate, e.g., on superficially saponified cellulose acetate film.

Another drawback of the known diazo resins lies in that their usually employed double salt with zinc chloride, and particularly the metal salt-free products containing phosphate or other anions, yield reproduction layers having a high sensitivity to moisture and thus to fingerprints. In the case of careless handling, the reproduction layer may be easily damaged.

For overcoming this drawback it has been suggested in U.S. Pat. No. 3,300,309, for example, to react the diazo resins with certain phenolic coupling components to obtain addition products sparingly soluble in water and yielding reproduction layers which are less sensitive to moisture. These addition products, which contain relatively loose bonds of the nature of a salt or complex, can be easily decomposed again, e.g. by organic solvents, and their stability thus is not sufficient under all conditions.

Furthermore, the light-sensitivity is not satisfactory, particularly in the case of the known diazo resins which have excellent thermostability, e.g. condensation products of 3-alkoxy-4-diazo-diphenylamine with formaldehyde.

A common disadvantage of the diazo resins hitherto preferably technically employed, furthermore resides in the fact they can be separated only with difficulty in a metal salt-free form, e.g. as chlorides, sulfates, or as salts of simple organic sulfonic acids, and their salts are often only insufficiently soluble in organic solvents.

It now has been found that the drawbacks of the prior art can be overcome, or at least considerably reduced, by using new diazo condensation products instead of the diazonium salts hitherto employed for the above applications.

The present invention relates to novel light-sensitive compounds, a process for making the compounds and the use of the compounds in light-sensitive reproduction material, the latter comprising a support and a reproduction layer which contains, as the light-sensitive substance, a condensation product of aromatic diazonium compounds, which latter includes at least one unit each of the general types:

$A(-D)_n$ and B, which are connected by a bivalent intermediate member derived from a condensable carbonyl compound and wherein A is a radical of a compound containing at least two aromatic carbocyclic and/or aromatic heterocyclic nuclei, which compound is capable of condensation in at least one position with an active carbonyl compound in an acid medium, D is a diazonium salt group attached to an aromatic carbon atom of A, n is an integer from 1 to 10, and B is a radical of a compound free of diazonium groups, which compound is capable of condensation in at least one position with an active carbonyl compound in an acid medium, the condensation product containing, on the average, about 0,01 to 50 B units per unit of $A(-D)_n$.

The reproduction materials of the invention have a number of advances over the known materials produced with the hitherto known diazo resins. Many of the new diazo mixed condensates do not penetrate into certain supports, e.g. superficially saponified cellulose acetate, to such an extent as do the known diazo condensates. The result is that the exposure products remaining after development have better oleophilic properties on their surfaces. Most of the new reproduction materials, furthermore, have an increased light-sensitivity, a lower moisture-sensitivity, an improved compatibility with polymers usually employed as layer additives, and other advantages compared to corresponding known diazonium salts, as is further described in detail below.

The light-sensitive condensation products preferably are in the form of diazonium salts. They also can be converted, in known manner, from this form into light-sensitive azides, diazo amino compounds, diazo sulfonates, and the like, and, in this form, be used as constituents of the reproduction materials of the invention.

The new condensation products can be prepared by condensing, in a strongly acid medium, at least one aromatic diazonium compound of the general formula $A(-D)_n$ and at least one compound B, the symbols having the above-indicated meanings, with at least one active carbonyl compound, in a free form, or with agents producing such a carbonyl compound.

Practically all compounds capable of condensation in known manner in a strongly acid medium with compounds having reactive hydrogen atoms are suitable as active carbonyl compounds in the preparation of the condensation products of the invention. Suitable compounds therefor are indicated in U.S. Pat. No. 2,063,631.

Formaldehyde is highly preferred as the carbonyl compound, because it is by far the most reactive and, simultaneously, is the least expensive member of this group of compounds. The other aliphatic, the aromatic and the heterocyclic aldehydes, and still more the ketones, are considerably less reactive and, in addition, frequently may take part in undesirable side reactions under the condensation conditions. The term "formaldehyde" as used in the present specification is meant to include: aqueous solutions of formaldehyde, gaseous formaldehyde, formaldehyde oligomers and polymers, such as trioxane and paraformaldehyde, and other substances which yield formaldehyde, e.g. urotropine. The methylene groups linking groups $A(-D)_n$ and B are derived from formaldehyde.

Another process for preparing diazo mixed condensates of the general type stated above which process has certain advantages, is described below. This process is not a part of the present invention and is fully described and claimed in co-pending Application Ser. No. 826,296 filed May 20, 1969, now abandoned. Principally mixed condensates similar to those described in the present application as being prepared according to the process stated below, can also be prepared by reacting $A(-D)_n$ compounds and B compounds in the presence of an active carbonyl compound, i.e., by the process described and claimed in the present application.

In the simplest and also preferred modification of the process described in the co-pending Application, the use of active carbonyl compound as such is completely dispensed with for mixed condensation and, instead of the component B, a modified second component $B_1$ of the general formula $$E(-CHR_a - O - R_b)_m$$

is used, wherein

E is a residue obtained by the splitting off of *m* H atoms from a compound B of the above-indicated meaning, $R_a$ is H, an aryl, alkyl or heterocyclic group, preferably hydrogen, $R_b$ is H, an alkyl or acyl group with 1 to 4 carbon atoms, or a phenyl group, and is preferably hydrogen, methyl, ethyl or acetyl, and

*m* is an integer from 1 to about 10.

It is assumed that, during condensation, component $B_1$ reacts completely or partially with component $A(-D)_n$ or with itself (when an excess of component $B_1$ is present), with intermolecular splitting off of $HOR_b$, thus forming the condensation products.

This process has a plurality of variations relating to the performance of the condensation, the quantitative ratios employed or the use of other additives, e.g. active carbonyl compound, components B, and the like.

Condensation in accordance with the invention is performed in the presence of a strongly acid condensation medium. Preferably employed are concentrated moderately strong to strong acids of which the content of acid predominates with respect to that of diluent. The condensation medium further should be so selected that it is liquid under condensation conditions.

The lower limit of the quantity of acid condensation medium which is employed for the mixed condensations according to all process variations described is determined by the viscosity of the mixture, and the upper limit by the economy of the process. The procedure preferably is such that, on the one hand, as little acid as possible is used and that, on the other hand, an easily stirrable and easily mixable condensation mixture is obtained. When selecting the type and quantity of acid to be used, the condensability and solubility of the components in the acid should be considered.

The most favorable conditions for each combination of $A(-D)_n$ and $B_1$ or B and active carbonyl compound are determined in preliminary tests. Particular care should be observed with regard to the exothermic condensation reaction so that it does not proceed too vigorously, since this would impede the control of the reaction procedure and furthermore might lead to decomposition of the diazo compounds.

Exemplary of acids suitable as condensation media are those listed in U.S. Pat. No. 3,235,382, column 1, line 71, to column 2, line 5.

Particularly advantageous condensation media are phosphoric acid, methanesulfonic acid, and sulfuric acid, which acids are employed in concentrations of at least 40 %, preferably 70 to 100 percent by weight. The remainder generally is water, but also may entirely or partially consist of solvents, e.g., methanol, acetic acid, N-methyl-pyrrolidone, and the like. 85 percent phosphoric acid, 80 percent sulfuric acid, and 90 percent methanesulfonic acid are successfully employed, for example.

85 percent phosphoric acid is a rather mild condensation medium in which the condensations can be performed very gently. It is, therefore, the most preferred condensation medium for all combinations of compounds which will react sufficiently fast under these rather gentle conditions. 90 percent methanesulfonic acid is a stronger medium. This acid has the further great advantage that it is capable of dissolving a plurality of components B and $B_1$.

Halogen hydracids, such as at least 15 percent, preferably concentrated, aqueous hydrochloric acid or hydrobromic acid, are suitable as condensation media only to a limited extent, e.g. in the production of mixed condensates with highly reactive phenols. The use of these acids is less favorable with other components B, e.g. phenol ethers and aromatic hydrocarbons or the derivatives $B_1$ thereof, since, under such conditions, halogen alkyl compounds of low reactivity are formed which do not further react under relatively moderate condensation conditions.

For the same reason, diazonium salts such as diazonium phosphates or sulfates are superior in many cases to the halides as starting materials for condensation.

When diazonium salts are to be used for mixed condensation, which salts are in the form of the often used metal halide double salts, it is generally advisable to dissolve them in the condensation medium, then pass dry nitrogen or dry air through the mixture until all the chloride ions have escaped in the form of gaseous hydrochloric acid, and then use the halide-free solution for condensations.

The quantity of the acid serving as the condensation medium may vary within wide limits. It is possible, for example, to use 1 to 100 parts by weight of acid per part by weight of the mixture of $A(-D)_n + B +$ active carbonyl compound or of $A(-D)_n + B_1$, as shown in the examples. The quantity of acid also may be higher without generally obtaining further advantages, however. It is important to employ the condensation medium in a quantity of sufficient to ensure an easily mixable reaction medium.

Depending upon the condensation medium, the condensation partners and their concentration in the condensation medium, it may be necessary to accelerate the condensation reaction by heating or to slow it by cooling. It is advisable to use a condensation temperature not in excess of 70° C, since the stability of the diazo compounds $A(-D)_n$ generally is limited at a higher temperature. It is possible, however, to prepare many of the diazo condensation products of the invention also above 70° C. The preferable temperature range for the preparation of the condensates is from + 10° C to + 50° C, however.

It is of advantage to perform all variations of the mixed condensations in homogeneous reaction media, because reproducible results are most easily obtained in such media. Therefore, components which are not liquid preferably are employed in the form of solutions, the solvent used preferably being the acid serving as the condensation medium. If some of the components are only sparingly soluble in the condensation medium, they may be used in the form of very fine suspensions or as emulsions in the condensation medium. In any case, care should be taken that the condensation mixture is thoroughly mixed mechanically.

If the condensation process is impeded by an insufficient solubility of the starting materials or end products, a homogeneous condensation medium may be achieved by adding an organic solvent. Of course, tests must be made in each case to determine which organic solvents are suitable. Glacial acetic acid has proved to be suitable for many cases, for example. Other suitable solvents are, e.g.: formic acid, N-methyl-pyrrolidone, and methanol. When adding an organic solvent, it should be considered that this often reduces the efficiency of the condensation medium, as compared with the unmixed concentrated acid and that the use of a solvent also may cause side reactions.

The quantity of active carbonyl compound, preferably formaldehyde, employed per mole of the sum of the molar quantities of the mixture of diazo compound $A(-D)_n$ and component B (0.25 mole of $A(-D)_n$ and 0.75 mole of B, for example, is 1 mole; a chain of precondensed units $A(-D)_n$ or of precondensed units B is understodd as 1 molecule) generally ranges from 0.5 to 4, preferably from 0.65 to 2 moles.

When the carbonyl compound is used in the above range, soluble condensation products will be obtained, as a rule, from diazo compounds $A(-D)_n$ and components B which contain one or two reactive positions per molecule. The use of soluble condensation products is preferred for the reproduction materials of the invention. If one of the components $A(-D)_n$ and B, or both of them, have three or more positions capable of condensation, it may be of advantage in some cases to use smaller quantities, within the above range, of active carbonyl compound, if soluble products are to be obtained.

For the preparation of the mixed condensates, the proportions of the reactants $A(-D)_n$ and B and the conditions of the condensation process may be varied within wide limits.

It is, in principle, possible to produce mixed condensates of any desired composition, i.e. all mixed condensates ranging in their composition from a diazo condensate containing only a trace of a second component B condensed therein, to a condensate of a second component B containing only traces of a diazo compound $A(-D)_n$ condensed therein. Generally, mixed condensates containing, on the average, 0.01 to 50 moles of second component per mole of $A(-D)_n$, may be useful for the preparation of valuable light-sensitive reproduction materials. Apart from special cases, the most important mixed condensates are those which contain 0.1 to 20 moles of second component per mole of $A(-D)_n$. Within this range, the mixed condensates normally display properties which are clearly distinguished from those of the corresponding homocondensates.

If a mixed condensate contains, e.g., 0.11 mole of component B per mole of $A(-D)_n$, which corresponds to 10 mole per cent of the condensate, this means, summarily, that in an ideal case each molecule of the condensate contains 9 units of $A(-D)_n$ per unit of component B. In this case, a wholly true mixed condensate can be formed only at a condensation degree of at least 10. However, since the condensation degree is often below 10, and furthermore, except in cases of a very high tendency toward co-condensation, since it must be expected that the same units accumulate in individual molecules of the mixed condensate, it will frequently occur that, during mixed condensation, mixtures of true mixed condensates with homocondensates are formed which cannot be easily separated in all cases. In the present specification, the term "mixed condensates" also includes such mixtures.

If a mixed condensate of a specific composition $A(-D)_n : B = a : b$ is to be prepared, the starting materials may be thoroughly mixed in a proportion of $a : b$ and the mixture condensed, provided that the reactivity of the two compounds towards the active carbonyl compound is the same. However, since the reactivity of the individual components towards formaldehyde, e.g., is normally different, it will be generally advanageous to determine the proportion of the reactants and the condensation conditions required to obtain a product having the desired composition by simple tests in each case. When the reactivity of component $A(-D)_n$ towards the carbonyl compound differs significantly from that of component B, condensation may be initiated with the component which can be less easily condensed, and the other component may be added later.

In the simplest case, mixed condensation is effected by dissolving component $A(-D)_n$ and component B in an acid suitable as the condensation medium, and adding the carbonyl compound, either in the form of the substance itself or as a solution, while stirring.

However, the performance of the mixed condensation process is not limited to the method just described. Thus, it is possible in many cases to mix components $A(-D)_n$ and B with the carbonyl compound and to introduce the mixture or the individual components into the acid either in the form of a solution or as the substances themselves. Alternatively, the carbonyl commpound may be dissolved in the acid and the two components may be introduced one after the other or as a mixture, in the form of the substances themselves or as solution(s). As a further alternative, one of the components may be contained in the acid, in solution, and the other component and the carbonyl compound may be added either separately or in admixture, in the form of the substances themselves or in solution.

The condensation reaction may be initiated with only one component and the second component may be added later, if desired with an additional quantity of carbonyl compound. It is even possible by one of these methods, to condense diazo resins, e.g., those prepared by acid condensation of diphenylamine-4-diazonium salts with carbonyl compounds and having lower condensation degrees, with one or several components B and an active carbonyl compound in an acid medium. In some cases, a mixed condensation of a lower molecular weight homocondensate of a second component with $A(-D)_n$ in the presence of carbonyl compound in an acid medium is possible, and even a mixed condensation of homocondensates of a component $A(-D)_n$ with homocondensates of a component B or mixed condensates of several components B in an acid medium in the presence of carbonyl compound may be successfully performed.

By varying the condensation conditions stated above, different final products (solubility, degree of incorporation of component B and the like) may be obtained, even when the starting materials are used in the same proportion. Therefore, it is necessary to maintain uniform condensation conditions when it is desired to repeat the production of a mixed condensate having uniform characteristics.

When components $B_1$ are employed in the preparation of the mixed condensates either alone or with other substances, generally those components $B_1$ are preferred in the preparation of soluble condensates in which m is 2 or slightly greater than 2, i.e. about 3 or 4. Within this class, components with $m = 2$ are particularly preferably since they yield condensation products of a simpler structure and, also when employing several moles of $B_1$ per mole of $A(-D)_n$, the tendency to formation of cross-linked and sometimes insoluble condensation products is reduced in many cases. Components $B_1$ in which m is greater than 2 preferably are employed in smaller quantities, the quantity of such compounds generally does not exceed 1 mole per mole of diazo compound.

The upper limit must be ascertained for each individual case by experiment. An important application of those components in which $m$ is greater than 2 is their combined use with compounds in which $m = 2$.

Components $B_1$ in which $m = 1$ also may be used for condensation, but in this case diazo condensates are obtained which carry only one diazo group per molecule, when $n = 1$ in $A(-D)_n$. The use of such condensation products in the reproduction layers generally is not preferred. It is of advantage, however, to combine components of type $B_1$, in which $m$ is 1, with those in which m = 2 or a number greater than 2. In these cases, the first mentioned component $B_1$ ($m = 1$) may perform the function of a "control" for the size of the molecules formed during condensation.

When $m$ is 2 or a number greater than 2 in the component $B_1$ and $B_1$ is employed in a quantity, per mole of $A(-D)_n$, which corresponds to less than 1 equivalent of $-CHR_1-OR_b$ groups (1 mole of component $B_1$ with $m = 2$ contains 2 group equivalents, for example), it is advisable to add an active carbonyl compound, preferably formaldehyde, to the reaction mixture, the quantity added being at least such that the sum of the group equivalents $-CHR_n-OR_b$ and the molar quantity of the formaldehyde added, multiplied by 2, (i.e. its condensation equivalents) is at least 1 equivalent per mole of daizo compound. Additional quantities of formaldehyde may be added, but generally the above defined sum of the condensation equivalents should not exceed 4. Larger quantities of formaldehyde may be added in special cases, however. As a further possibility of producing higher condensates from components $B_1$ in which $m = 1$, active carbonyl compound, preferably formaldehyde, may be added during the production of the condensate, also in those cases where 1 or more moles of component $B_1$ are used per mole of diazo compound. In these cases, a minimum quantity of formaldehyde of 0.5 mole per mole of component $B_1$ and per mole of diazo compound exceeding the molar quantity of $B_1$ may be added. The quantity of formaldehyde added generally will not exceed 2 moles per mole of diazo compound and component $B_1$.

The mean molecular weights of the condensation products may vary within wide limits, depending on the selection of the condensation partners and conditions. It has been found that, for the production of good reproduction materials, mixed condensates having molecular weights between about 500 and 10,000 are generally preferred. It should be considered that these values are mean values and that the molecular weights of the individual constituents of each condensate obtained are statistically distributed about this mean value. The type of distribution is shown in some of the examples below by way of a fractionation of the condensates obtained.

The mixtures obtained by condensation can be used directly or further processed. The mixture also can be worked up and the condensates can be separated in a solid form.

Working up of the condensation mixtures can be performed in various ways. The method is adapted to the chemical and physical properties of the particular reaction product. Mixed condensates containing a relatively large quantity of second component often can be separated by stirring the condensation mixture in water. It often occurs in these cases that a water-soluble mixed condensate can be separated from the aqueous mother liquor in the form of any sparingly soluble salt. When mixed condensate is watersoluble but sparingly soluble in organic solvents, it is often possible to separate the product by diluting the reaction mixture with an organic solvent, e.g. with a lower alcohol or a lower ketone, and the like.

An advantage of many of the condensates prepared according to the process of the invention resides in their easy separability in the form of salts free from complex-forming metal salts. Many condensates, for example, yield sulfates, chlorides, and bromides which are sparingly soluble in water and can be precipitated from aqueous solutions of the condensation mixtures by the addition of the corresponding acids or their salts soluble in water.

Some separation processes are described in the examples below.

Suitable components A(-D)$_n$ and B for the preparation of the condensation products of the invention are, principally, all compounds which are capable of condensation in an acid medium with active carbonyl compounds and are not de-composed under the condensation conditions.

Group effectiing the condensability of the components A(-D)$_n$ and B are the following:

1. Aryl radicals and heterocyclic radicals which have nuclear positions capable of condensation. Preferred are radicals in which these nuclear positions are activated. This activation may be effected, for example, by annellation with additional aromatic rings or by substitution by groups such as -OH, -O-alkyl, -O-aryl, -SH, -S-alkyl, S-aryl, -alkyl, -aryl, -amino, -alkylamino, -dialkylamino, arylamino, -diarylamino, and the like. In addition to these activating substituents, the condensable aromatic or heterocyclic radicals also may contain condensation-inhibiting groups, e.g. nitro or sulfonic acid groups, if the activation caused by other groups is only reduced but not eliminated.

2. Radicals which themselves are capable of condensation and may be directly linked to iso- or heterocyclic radicals or to aliphatic radicals or, if desired, may be directly linked to one another. Such radicals are groups such as carboxylic acid amide, sulfonic acid amide, N-alkylsulfonic acid amide, N-arylsulfonic acid amide, nitrile, urea, thiourea, urethane, ureido, thioureido, glyoxaldiureine, imidazolone, guanidine, dicyanodiamide, and amino groups directly attached to aromatic rings.

The following compound types or individual compounds are illustrative of the components of general formulae A(-D)$_n$, B, and $B_1$, which are used for the preparation of the diazo condensation products of the invention.

Diazonium compounds A(-D)$_n$.

The basic idea is that a benzene nucleus carrying the diazo group, apart from only few exceptions (e.g. 4-diazophenol) not included here, is deactivated to such an extent that condensation in nuclear positions of this ring is no longer possible under less severe conditions.

The diazonium compounds to be used in accordance with the present invention thus contain in the radical A, in addition to the aromatic iso- or heterocyclic nucleus carrying the diazo group, at least one iso- and/or heterocyclic ring having at least one condensable nuclear position and/or with substituents of the above Type 2, which are themselves capable of condensation.

An important group of diazonium compounds particularly for processing into condensation products in accordance with the present invention has a structure according to the following general formula $$(R_1 - R_3 -)_p R_2 - N_2X$$

in which p is a positive whole number from 1 to about 3, preferably 1;

X is the anion of the diazonium salt, it also may be formed by an acid substituent of the molecule.

$R_1$ is an aromatic iso- or aromatic heterocyclic group, if desired substituted, which has at least one position capable of condensation, and preferably is a phenyl group, if desired substituted.

Preferable substituents are those which increase the reactivity of the nucleus with respect to condensation, e.g. the alkyl, alkoxy, alkylmercapto, aryloxy, arylmercapto, hydroxy, mercapto, amino, and anilino groups.

$R_2$ is an aromatic ring of the benzene or naphthalene series, which, in addition to the diazo group, may carry other substituents;

$R_3$ is a connecting member between the rings $R_1$ and $R_2$, e.g. of the following types, of which the radical $R_1$ is always to be considered on the left-hand side, and the group $R_2$ on the right-hand side, if $R_3$ is not symmetrical:

Simple homopolar bond

—$(CH_2)_q$ - $NR_4$ - ($q$ is a number from 0 to 5, $R_4$ is H, or alkyl with 1 to 5 carbon atoms, or aralkyl with 7 to 12 carbon atoms or aryl with 6 to 12 carbon atoms)

—$(CH_2)_q$-$NR_4$-$(CH_2)_r$-$NR_5$- (r is a number from 2 to 5, $R_5$ is H or alkyl with 1 to 5 carbon atoms)

—O-$(CH_2)_r$-$NR_4$—

—S-$(CH_2)_r$-$NR_4$—

—O-$R_6$O— ($R_6$is arylene with 6 to 12 carbon atoms)

—O—

—S—

—CO-$NR_4$—

—$SO_2$-$NR_4$—

Exemplary of compounds of the formula $(R_1 - R_3 -)_p R_2-N_2X$ are 2,3',5-trimethoxy-diphenyl-4-diazoniumchloride
2,4',5-triethoxy-diphenyl-4-diazoniumchloride
4-[3-(3-methoxy-phenyl)-propylamino]-benzenediazoniumsulfate
4-[N-ethyl-N-(4-methoxy-benzyl)-amino]-benzenediazoniumchloride
4-[N-(naphthyl-(2)-methyl)-N-n-propyl-amino]-benzenediazoniumsulfate
4-[N-(3-phenoxy-propyl)-N-methyl-amino]-2,5-dimethoxy-benzenediazoniumtetrafluoroborate
4-[N-(3-phenylmercapto-propyl)-N-ethyl-amino]-2-chloro-5-methoxy-benzenediazoniumchloride
4-[4-(3-methyl-phenoxy)-phenoxy[-2,5-dimethoxy-benzenediazoniumchloride
4-(4-methoxy-phenylmercapto)-2,5-diethoxy-benzenediazoniumchloride
2,5-diethoxy-4-phenoxy-benzenediazonium-chloride
4-(3,5-dimethoxy-benzoylamino)-2,5-diethoxy-benzenediazoniumhexafluorophosphate
carbazole-3-diazoniumchloride
3-methoxy-diphenyleneoxide-2-diazoniumchloride
diphenylamine-4-diazoniumsulfate Mixed condensates particularly suitable for use in the reproduction layers of the invention are obtained by using diazo compounds of the general formula $$(R_1 - R_3 -)_p R_2 - N_2X$$

in which $p$ is an integer from 1 to 3, preferably 1, $R_1$ is a phenyl group either unsubstituted or substituted by one or more alkyl or alkoxy groups, $R_2$ is a benzene ring which, in addition to the diazonium group, may carry one or two identical or different substituents which may be halogen atoms, alkyl groups with 1 to 4 carbon atoms, or alkoxy groups with 1 to 5 carbon atoms, and $R_3$ is a homopolar bond or one of the members

— O —
— S —
NH—.

A particularly important group of diazo compounds having structures according to the general formula $R_1 - R_3 - R_2 - N_2X$, and which are preferably used in accordance with the present invention for the preparation of the diazo condensation products, are the salts of the diphenylamine-4-diazonium ion and its substitution products since these are particularly easily condensable in many cases and the condensation products yield particularly valuable reproduction layers.

Preferably employed substituents which may be linked to the phenyl nuclei of the diphenylamine-4-diazonium compounds are alkyl and alkoxy groups wit 1 to 6, preferably 1 to 2, carbon atoms, furthermore the halogens and the following groups

| | |
|---|---|
| —COOR | (R is H, alkyl-or aryl) |
| —CONH₂ | |
| —CN | |
| —COR | (R is alkyl or aryl) |
| —SO₂OR | (R is H, alkyl or aryl) |
| —NHCOR | (R is alkyl or aryl) |
| —NHR and NRR' | (R and R' are alkyl, aryl, aralkyl) |

Exemplary of such substituents which may be linked to the phenyl nuclei of the diphenyldiazonium group are methyl, propyl, isobutyl, trifluoromethyl, methoxy, difluoromethoxy, ethoxy, hydroxyethoxy, ethoxyethoxy, fluorine, chlorine, bromine, iodine, ethoxycarbonyl, phenoxycarbonyl, acetyl, methoxysulfonyl, ethoxysulfonyl, acetylamino, methylamino, ethylamino, dimethylamino, diethylamino, methylethylamino, phenylamino, benzylamino, methylbenzylamino, and ethylbenzylamino.

Suitably diphenylamine-4-diazonium salts are, for example, the diazonium salts derived from the following amines: 4-amino-diphenylamino, 4-amino-3-methoxy-diphenylamine, 4-amino-2-methoxy-diphenylamine, 40'-amino-2-methoxy-diphenylamine, 4'-amino-4-methoxy-diphenylamine, 4-amino-3-methyl-diphenylamine, 4-amino-3-ethyl-diphenylamine, 4'-amino-3-methyl-diphenylamine, 4'-amino-4-methyl-diphenylamine, 4-amino-3-ethoxy-diphenylamine, 4-amino-3-hexyloxy-diphenylamine, 4-amino-3-$\beta$-hydroxy-ethoxy-diphenylamine, 4'-amino-2-methoxy-5-methyl-diphenylamine, 4-amino-3-methoxy-6-methyl-diphenylamine, 4'-amino-3,3'-dimethyl-diphenylamine, 3'-chloro-4-amino-diphenylamine, 4'-amino-4-n-butoxy-diphenylamine, 4'-amino-3',4-dimethoxy-diphenylamine, 4-amino-diphenylamine-2-sulfonic acid, 4-amino-diphenylamine-2-carboxylic acid, 4-amino-diphenylamine-2'-carboxylic acid, and 4'-bromo-4-amino-diphenylamine.

Preferably employed are 4-amino-diphenylamine and 3-methyl-4-amino-diphenylamine, particularly preferable are the 3-alkoxy-4-amino-diphenylamines having 1 to 3 carbon atoms in the alkoxy group, especially the 3-methoxy-4-amino-diphenylamine.

Diazonium compounds $A(-D)_n$ useful in the condensation reaction in accordance with the invention also may be homocondensation products of the described diazo compounds with active carbonyl compounds, i.e. relatively low-molecular weight types of the known diazo resins, for example, which, in accordance with the invention, can be regarded as larger molecules capable of further condensation and having several diazo groups.

The diazonium compounds $A(-D)_n$ may be reacted in the form of any soluble salt of a moderately strong to strong acid, e.g. in the form of a salt of sulfuric acid, orthophosphoric acid, hydrochloric acid, trifluoroacetic acid, methanesulfonic acid, benzenesulfonic acid, and the like. Preferably employed are the sulfates and the phosphates.

Components B

Similarly, a plurality of compounds are suitable as components B in the preparation of the mixed condensates. An important class are the substituted or unsubstituted aromatic hydrocarbons and aromatic heterocyclic compounds provided they have nuclear positions capable of condensation, in an acid medium, with carbonyl compounds.

A large number of unsubstituted aromatic isocyclic and heterocyclic compounds are thus suitable as components B, e.g. benzene (reacts difficultly), naphthalene, anthracene, phenanthrene, pyrene, indene, fluorene, acenaphthene, thiophene, furane, benzofurane, diphenylene oxide, benzothiophene, acridine, carbazole, phenothiazine, and the like.

Isocyclic and heterocyclic aromatic compounds, particularly those which are only rather difficultly condensable, advantageously may contain one or more identical or different substituents activating the nucleus, the condensation being facilitated and the solubility of the components per se, as well as of their products, generally being improved thereby.

Exemplary of such substituents are:

$-NR_7R_8$
$-N(R_8)_2$
$-OR_7$
$-OR_8$
13 $R_8$
$-SR_7$
$-SR_8$ wherein $R_7$ may be H, -CO-alkyl, -CO-aryl, -CO-heteroyl, -CO-aralkyl, $-SO_2$-alkyl, $-SO_2$-aryl, $-SO_2$-aralkyl, $-SO_2$-heteroyl, $-CONH_2$ $-CSNH_2$, -COHN-alkyl, -CONH-aryl, -CO-O-alkyl, -CO-O-aryl, -CS-O-aryl, and -CS-O-alkyl, and $R_8$ may be H, an alkyl, aryl or an aralyl group.

The meanings or certain expressions are as follows:

Alkyl: A branched or unbranched alkyl group with 1 to 10 carbon atoms which may be substituted, e.g. by -halogen, -alkoxy, -OH, —COOH, $-CONH_2$, —CN, $-CO-CH_3$, $-SO_3H$, or $-PO_3H_2$, or hydrogens in neighboring positions may be replaced by oxygen (epoxides) or removed (multiple bonds). The alkyl radical also may be interrupted, e.g., by —O—, —S—, -N(alkyl)-, $-SO_2-$, or —SO-.

Aryl: A mono- or polynuclear aromatic ring which, including alkyl, alkoxy or aralkyl groups which may be linked to it, contains 6 to 20 carbon atoms. The aryl nucleus may carry additional substituents.

Aralkyl: A group containing 7 to 20 carbon atoms which is composed of alkyl and aryl radicals (corresponding to the above definition).

Alkoxy: O-alkyl group, the alkyl having the above meaning.

The alkyl, aryl, aralkyl, and alkoxy groups may be present once or several times, either alone or together. For not exceeding the portion of these substituents with respect to the molecular weight of B, the portion of the four above-described substituents is limited in compound B with respect to the structure of the molecule, the primarily given aromatic iso- or heterocyclic ring or the condensed ring system is to be substituted only to such an extent that, in the case of substitution, this compound is increased

| | |
|---|---|
| by alkyl groups | only by a maximum of 10 carbon atoms |
| by aryl groups | only by a maximum of 20 carbon atoms |
| by aralkyl groups and | only by a maximum of 20 carbon atoms, |
| by alkoxy groups | only by a maximum of 10 carbon atoms. |

The total increase in C atoms by means of these four types of substituents together should not exceed 30 C atoms with respect to the original aromatic nucleus.

It results therefrom that substituents of longer chains, i.e. those which have a relatively large number of C atoms, occur less frequency together than those with few C atoms. Generally, the short-chain alkyl and alkoxy groups (1 to 4 carbon atoms) and the smaller aromatic radicals are preferred in aryl and aralkyl groups (up to 12 C atoms) since the corresponding compounds are more easily soluble in the condensation media and condensation thus can be performed more easily. Limitation of substitution, as described above, results from the same reason.

The condensable iso- or heterocyclic aromatic rings also may have substituents exerting a deactivating effect on the nuclei, e.g. $O_2N$-, HOOC-, N ≡ C-, $HO_3S$, $H_2O_3P$—, Cl-, Br-, and the like, provided condensability is not eliminated thereby. This will particularly be the case when the ring as such is easily condensable or when it carries substituents having a considerable activating effect. Another possibility for introducing deactivating substituents without reducing the condensability of the ring is to place the substituents in side-chains, e.g. aliphatic side-chains.

Substituents deactivating nuclear condensation also may be present in those cases in which the reactivity of the condensable nucleus is not necessary because the nucleus has substituents at which condensation can take place. Such substituents have been listed above, for example the groups $-CO-NH_2$, $-SO_2NH_2$, and $-SO_2NH$-alkyl.

According to the above, the compounds to be employed as components B or components $B_1$ derived therefrom belong to the following groups of substances, for example:

aromatic compounds (iso- and heterocyclic) unsubstituted aromatic amines
phenols and thiophenols
phenolethers and thiphenolethers
aromatic compounds substituted by alkyl, aralkyl or aryl groups
urea, thiourea, carboxylic acid amides (aliphatic and aromatic), and
sulfonic acid amides (aliphatic and aromatic).

Exemplary individual representatives are listed below.

Soluble types of the new diazo condensation products preferably are used in this invention. In addition to a corresponding selection of the components $A(-D)_n$ and B or $B_1$ according to their properties and their ratios there are preferably further used, for promoting the formation of soluble condensation products, components B and/or $B_1$ having molecular weights (amines are regarded as free amines, not in the form of salts: acid groups are considered in the H form) less than 500, preferably less than 250. In the case of aromatic compounds, those compounds are preferred within these which do not contain more than 4, preferably 1 to 2, especially 2, aromatic single rings (anellated and/or linked via homopolar bonds and/or via intermediate members).

The use of the compounds B or $B_1$ in low molecular weight range is advantageous also because often they are more readily soluble in the condensation medium and thus can react more easily.

Of the indicated classes of compounds from which the compounds B and $B_1$ derive, generally those are preferred which are unsaponifiable or only difficultly saponifiable under acid condensation conditions. The same applies to the diazo compounds $A(-D)_n$.

For this reason, those compounds B or $B_1$ of the series of the aromatic iso- and heterocyclic compounds are advantageous which are unsubstituted or carry as substituents the groups alkyl, aralkyl, aryl, alkoxy, alkylmercapto, aryloxy, arylmercapto, OH, Sh, and amino, if desired in addition to unsaponifiable deactivating substituents, e.g. COOH. Of these compounds, those aromatic iso- and heterocyclic compounds are particularly preferred which are unsubstituted and/or contain as substituents one or more of the radicals alkyl, aralkyl, aryl, alkoxy, alkylmercapto, aryloxy, and arylthio, particularly when condensates are desired which should not contain saltforming groups other than the diazo group.

Exemplary of particularly suitable types of these classes of substances are compounds B or $B_1$ derived from diphenylether and diphenylsulfide which may contain one or two substituents selected from the group consisting of halogen atoms, alkyl groups, and alkoxy groups, however which are preferably unsubstituted.

If these compounds are condensed with diphenylamine-4-diazonium salts which are unsubstituted or substituted by a lower alkyl group or a lower alkoxy group containing up to 3 carbon atoms, mixed condensates are obtained in a very smooth reaction, which can be precipitated readily and in good yields in the form of salts of hydrochloric acid, of hydrobromic acid, or of suitable sulfonic acids mentioned below, especially when the component $B_1$ is employed in proportion of 0,5 to 2 moles per mole of diazo compound.

The new condensation products of the invention generally contain 0.01 to 50 moles, preferably 0.1 to 20 moles, on the average, of units of component B and/or $B_1$ per mole of units of component $A(-D)_n$. A particularly preferred range is from 0.2 to 2 moles of B and/or $B_1$ per mole of $A(-D)_n$.

The use of the condensates may be effected in various ways. In some cases, the new condensation products may be employed in the form of crude condensates, i.e. without separating the condensation medium. This is especially possible, when the quantity of condensation medium per mole of diazo compound can be maintained small.

Generally, the new condensation products are separated in the form of any salt and in this form, after the addition of any desired additional layer constituents, are used for the production of the reproduction material The diazo condensation products may be separated as salts of the following acids and then be employed: hydrohalogenic acids, such as hydrofluoric acid, hydrochloric acid, and hydrobromic acid; sulfuric acid; nitric acid; phosphoric acids (5-valent phosphorus), particularly orthophosphoric acid; inorganic iso- and heteropolyacids, e.g., phosphotungstic acid, phosphomolybdic acid; aliphatic or aromatic phosphonic acids or their semiesters, arsonic acids; phosphinic acids; trifluoroacetic acid; amidosulfonic acid; selenic acid; fluorboric acid; hexafluorophosphoric acid, and perchloric acid; furthermore aliphatic and aromatic sulfonic acids, e.g. methanesulfonic acid, benzenesulfonic acid, toluenesulfonic acid, mesitylenesulfonic acid, p-chlorobenzenesulfonic acid, 2,5-dichlorobenzenesulfonic acid, sulfosalicyclic acid, naphthalene-1-sulfonic acid, naphthalene-2-sulfonic acid, 2,6-di-tert.-butylnaphthalenesulfonic acid, 2,6-di-tert.-butyl-naphthalenedisulfonic acid, 1,8-dinitro-naphthalene-3,6-disulfonic acid, 4,4'-diazidostilbene-3,3'-disulfonic acid, 2-diazo-1-naphthol-4-sulfonic acid, 2-diazo-1-naphthol-5-sulfonic acid, 1-diazo-2-naphthol-4-sulfonic acid, and the like. Other organic sulfonic acids suitable for the separation of the condensates are listed in columns 2 to 5 of U.S. Pat. No. 3,219,447.

The new diazo condensation products also can be separated in the form of the double salts with metal halides or -pseudo halides. e.g. of the metals zinc, cadmium, cobalt, tin, and iron, or as the reaction products with sodium tetraphenyl borate or with 2-nitroindanedione-(1,3), and then be used in known manner.

By the action of sodium sulfite, sodium azide or amines, they also can be converted into the corresponding diazosulfonates, azides or diazoamino compounds and be employed in this form, as is known in the case of the diazo resins.

The following advantages of the new diazo condensation products have been indicated before:

a. Minor penetration of the diazo compound into supports favoring this phenomenon, e.g. superficially saponified cellulose acetate film. The result is that the image areas have excellent oleophilic properties after exposure to light.

b. Minor sensitivity of the reproduction layers to fingerprints.

Both advantages generally become more and more noticeable with the increase of the proportion of incorporated component. Whereas the advantage becomes generally apparent in case (a) with condensates containing as little as 0.1 mole of B and/or $B_1$ per mole of $A(-D)_n$, the desired effect is obtained in case (b) only from about 0.5 mole, in some cases only at a higher degree of incorporation of these components.

The use of the new condensation products has other advantages in addition to those indicated above. Compared with the known diazo resins, an improved effective light-sensitivity of the reproduction layers prepared with the new condensation products can be observed. i.e. when using the same light source, shorter exposure times are required. Also, this effect generally increases with an increase of the content of B and/or $B_1$ and differs, depending upon the type of component B or $B_1$ selected. The effect generally is the more apparent the higher the molecular weight of component B or $B_1$. Generally, an increase of the components by another aromatic ring has a greater effect than the same increase of the molecular weight by other groups.

With an increasing content of a suitable second component B or $B_1$, the resin character of the mixed condensates becomes increasingly more pronounced, while the salt character decreases with the decreasing content of diazonium salt groups in the molecule of the condensate. Consequently, such mixed condensates are more compatible with polymerisates which do not contain ionizable groups.

For the same reason, the mixed condensates often possess good film-forming properties and the films show in the fully exposed state an improved flexiblity and in many cases a good resistance to various etching agents. Thus, it is possible with a number of mixed condensates to produce reproduction layers of satisfactory etching resistance without the customary addition of resins, which layers may be used, e.g. for the photomechanical preparation of halftone gravure plates, printed circuits etc.

Mixed condensates are particularly suitable for this purpose which contain components that are not capable of forming a salt with acid or alkaline etching agents and have no tendency for hydrolytic splitting, i.e. second components selected from the group of aromatic hydrocarbons, either unsubstituted or substituted by alkyl, alkoxy, alkylmercapto, aryloxy or arylmercapto groups.

A particularly favorable group of condensation products is derived from components B or $B_1$ containing 2 benzene rings linked via a bridge member.

Particularly preferred in this series are the mixed condensates from components B and particularly $B_1$, which are derived from diphenylether or diphenylsulfide, with dephenylamine-4-diazonium salts, particularly 3-alkoxydiphenylamine-4-diazonium salts. These condensates have a high light-sensitivity and those made from 3-alkoxydiphenylamine-4-diazonium salts have simultaneously a surprising high storability. The corresponding condensation products, particularly with components $B_1$, can be prepared particularly easily and under moderate conditions. Diphenylether derivates of Type $B_1$ suitable for the preparation of the condensation products are commercially available.

In contradistinction to the known diazo resins, the new condensation products can be separated in many cases very easily from an aqueous solution by the addition of hydrochloric acid or common salt solution in the form of the chlorides or analogously as bromides. For this reason, a number of the new condensation products can be advantageously employed in those cases where the halides of the known diazo resins, which can be separated in a cumbersome manner only, have been preferably employed, e.g. for the production of screen printing forms. Furthermore, the chlorides can be easily converted into the salts of acids of low volatility, e.g. into the orthophosphates, which, of course, also may be obtained directly, e.g. by condensation of the diazonium phosphates in phosphoric acid.

A special group of the new condensation products has particular advantages with respect to the acid resistance of the exposure products and their adhesion to metallic supports. These are the condensation products carrying phosphonic acid groups. The exposure products of these condensates have good adhesive properties on aluminum foils roughened by metal brushes only, for example, without the foils being provided with one of the known chemical adhesive layers, and even then when the products are employed in the form of the zinc chloride double salts.

Another special group of mixed condensates has special advantages particularly for the hardening of hydrophilic colloids. Mixed condensates belonging thereto are mixed condensates of diphenylamine-4-diazonium salts and urea or similar compounds. Colloid layers which are hardened with these condensates with the action of light, have better hydrophillic properties after hardening than have those sensitized with the hitherto known diazo resins. This effect is important for the production of printing forms, as described in U.S. Pat. No. 3,085,008, for example.

It also should be noted that mixed condensates preprared from diazonium salts and an excess of phenols are capable of yielding positive copies upon aqueous alkaline development (if desired with the addition of a small quantity of solvent).

The new condensation products can be combined with water-soluble and water-insoluble polymers in the reproduction materials of the invention. Particularly, the production of reproduction layers containing water-insoluble polymers is simplified when using the new condensation products, since the latter can be particularly easily obtained in the form of salts compatible with these polymers, which are readily soluble in a number or organic solvents.

The reproduction layer is prepared in a manner analogous to that in the case of the known diazo resins, i.e. the diazo condensates are dissolved as such or, if desired, together with additional layer constituents in a suitable solvent and a support is coated with the solution thus obtained. Suitable supports are, e.g. those mentioned in page 3 of the present Specification.

In some cases, it is also possible to apply the mixed condensate in the form of a very fine suspension. Coating may be performed, for example, by immersing or casting and draining, by casting and whirling off the excess solution, by brushing, swabbing or by roller application, as well as other coating methods. The coating is then dried at room temperature or at an elevated temperature.

A number of substances may be added, as other constituents, to the reproduction layers. Exemplary thereof are:

Acids, e.g. phosphoric acids (particularly those of the 5-valent phosporus, preferably orthophosphoric acid), phosphonic acids, phosphinic acids, and arsonic acids, furthermore the strong acids described in U.S. Pat. No. 3,235,382, such as sulfuric acid, hydrobromic acid, organic sulfonic acids, e.g. toluenesulfonic acid, methanesulfonic acid, and naphthalene-1,5-disulfonic acid, furthermore arsenic acid, and hexafluorophosphoric acid, furthermore the organic poyacids described in U.S. Pat. No. 3,179,518, e.g. polyacrylic acid, polyvinylphosphonic acid, polyvinylsulfonic acid, mellitic acid, and polyvinylhydrogenphthalate.

Water-soluble polymers, e.g. polyvinyl alcohol, polyethylene oxide, partially saponified polyvinyl acetate with an acetyl content up to about 40 per cent, polyacrylamide, polydimethylacrylamide, polyvinylpyrrolidone, polyvinyl methyl formamide, polyvinyl methyl acetamide and copolymers of monomers forming these polymers or with monomers which along form water-insoluble polymers, in such a quantity that the water-solubility of the copolymers is maintained, furthermore natural substances or modified natural substances, such as gelatin, methyl cellulose, carboxymethyl hydroxyethyl cellulose, alginates, and the like.

Polymers sparingly soluble or insoluble in water, e.g. phenol resins, epoxy resins, oil-modified alkyl resins, amineformaldehyde resins, such as urea and melamine resins, polyamides, polyurethanes, polyvinyl resins, polyacrylic and polymethacrylic acid esters, polyvinyl acetals, polyvinylchloride, polyesters, and polyethers, as obtained, for example, by the polymerization of vinyl ethers, of oxiranes, oxetanes or tetrahydrofuran. The polymers also may carry groups capable of enhancing solubility in alkaki, e.g. carboxyl, carboxylic acid anhydride, sulfonic acid, sulfonic acid amide, and phosphonic acid groups, furthermore sulfuric acid semiester, phosphoric acid monoester and phosphonic acid monester groups. The polymers may be incorporated into the reproduction layers either individually or, when they are compatible with one another, also in the form of mixtures.

Printing forms of substantially increased length of run are obtained from reproduction layers containing the mixed condensates in combination with polyvinyl formal resins, particularly on grained aluminum supports.

Colored or uncolored pigments
Dyestuffs
Plasticizers
Wetting agents
Sensitizers
Indicators
Fatty acids Aldehydes, particularly formaldehyde, also may be added to the reproduction layers.

All additives should be so selected, of course, that they are compatible with the diazo condensates and, furthermore, absorb light to as low a degree as possible in the wave length range important for light-decomposition of the diazo compounds.

The additives generally may be incorporated into the reproduction layers in the following quantities: Acids: On metal supports and superficially saponified cellulose acetate films, acids of 5-valent phosphorus, particularly orthophosphoric acid, generally are employed in quantitites of 0.01 to 4 moles, phosphonic and arsonic acids in quantities of 0.01 to 3 moles, per mole of diazo groups. On paper supports as described in U.S. Pat. No. 2,778,735, in addition to phosphoric acid, there also may be used strong acids, e.g. those described above in quantities of 1 to 100 moles at the most per mole of diazo groups. In this connection, 1 mole means the quantity which contains 1 gramatom P, As or an equivalent COOH.

The organic polyacids, insofar as they are readily water-soluble, generally are used in quantities of only 0.01 to 3 moles per mole of diazo groups.

The water-soluble polymers generally are used in quantities up to 100 parts by weight per part by weight of diazo compound, preferably not more than 20 parts by weight.

The addition of polymers insoluble in water generally will not exceed 20 parts by weight per part by weight of diazzo compound; the preferred range is not more than about 10 parts by weight.

When the reproduction layers contain water-soluble and/or water-insoluble polymers, colored or uncolored pigments generally are added to them only in quantities not exceeding 50 percent by weight, calculated on the weight of the polymers.

Plasticizers, dyestuffs, wetting agents, sensitizers, indicators, and fatty acids generally are incorporated into the reproduction layers in quantities not exceeding 20 per cent by weight, preferably not exceeding 10 per cent by weight, calculated on the weight of the other layer constituents.

Reproduction layers containing or consisting of the new diazo condensates also may be combined with known light sensitive systems. This applies, for example, to the known diazo resins (formaldehyde condensates of the substituted or unsubstituted 4-diazo-diphenylamine), p-quinonediazides, imimoquinonediazides, azido compounds, photo-crosslinkable polymers with azido groups, chalcone groupings, cinnamic acid groupings, allyl ester and allyl ether groups, and to photopolymer layers.

Depending upon the layer constituents, suitable solvents for the preparation of the coating solutions are, for example, water, alcohols such as methanol, ethanol, and ethylene glycol monoethyl ether, dimethyl formamide, diethyl formamide, and the like. Water, if desired with the addition of an organic solvent, is preferably employed in the case of metal halide double salt, sulfates, and phosphates of the new diazo condensates.

Pure organic solvents or those containing only a little water are preferred in the case of chlorides, bromides, and salts of the new diazo condensates, which are water-insoluble to a large extent, e.g., the salts of organic sulfonic acids, fluoboric acid, and hexafluorophosphoric acid. In these cases, to the alcohols or amides which normally are good solvents for these compounds, there are added solvents which dissolve them only sparingly, e.g. ethers such as dioxane, and tetrahydrofuran: esters such as acetic acid ethyl ester, butyl acetate, and ethylene glycol monoethyl ether acetate: ketones such as methyl ethyl ketone, cyclohexanone, and the like, in order to improve the levelling properties of the coating compositions.

The reproduction materials thus produced may be used directly after production, but there also may be days, weeks or months between production and processing. It is advantageous to store them at a cool, dry place.

The reproduction material is processed by imagewise exposure through an original. For image-wise exposure to light, any light source, conventional for reproduction purposes, may be used which emits in the long-wave ultraviolet range and in the short-wave visible range, e.g. carbon arc lamps, high-pressure mercury vapor lamps, xenon impulse lamps, and others.

After exposure to light, development is effected with a suitable developer. Suitable developers are, for example, water, mixtures of water with organic solvents, aqueous salt solutions, aqueous solutions of acids, e.g. of phosphoric acid, to which salts or organic solvents may added, or alkaline developers, e.g. aqueous solutions of sodium salts of phosphoric acid or silicia acid. Also organic solvents may be added to these developers. In some cases, it is also possible to develop with undiluted organic solvents. The developers may contain additional constituents, e.g. wetting agents, and hydrophilizing agents.

Development is performed in known manner, e.g. by immersing or wiping over or rinsing with the developer liquid.

The reproduction layers prepared with the new diazo condensation products yield negative copies of the originals employed in nearly all cases. When adding phenol resins to the reproduction layers, particularly in excess of the mixed condensate, positive copies of the original are obtained, however, with alkaline development.

Depending upon the composition of the layer, the supporting material, and processing, it is possible to produce with the new diazo condensates, for example, single copies, relief images, tanned images, printing forms for screen printing, relief printing, intaglio printing, and planographic printing, or printed circuits. In many cases, it is possible to improve the abrasion resistance and the chemical resistance of the image stencil by burning in.

The reproduction materials according to the invention can be stored for months, provided suitable components have been selected. Alternatively, the reproduction layers may be applied to a support immediately preceding use, if this is desirable. The mixed condensates according to the invention are very suitable for use in so-called "wipe-on" processes, in which a metal support, particularly an aluminum support, which has been mechanically and/or chemically pretreated in an appropriate manner, is coated either manually or with the aid of simple devices with a light-sensitive layer by the printer for the photomechanical preparation of a printing plate. For this purpose, the high light-sensitivity of the diazo compounds and the excellent oleophilic properties of their light-decomposition products are also of particular advantage.

The novel diazo mixed condensates may also be used by the printer for sensitizing pre-coated (but not pre-sensitized) screen printing fabrics. Alternatively, they may be used for the preparation of pre-sensitized screen printing stencils, which have the advantage over known chromate-sensitized screen printing stencils that they possess a considerably better storability. The good light-sensitivity of the novel diazo compounds is also of advantage for screen printing.

The invention is further illustrated by the following series of compound types and individual compounds, which are suitable as components B or components $B_1$ derived therefrom for the preparation of the condensation products to be employed in accordance with the present invention.

The preparation of compounds of the general formula $B_1$ is known and described in detail in the literature. Some of the compounds of Type $B_1$ are commercially available.

The following list of components B and $B_1$ represents a classification. The characteristic feature in each case is the substituent activating condensation. When two or more different activating substituents occur, attribution to a certain group is at random, of course.

A number of unsubstituted aromatic iso- and heterocyclic compounds have been listed before as components B.

In some cases, it is possible to employ also aromatic compounds substituted only by deactivating substituents as components B or as the original compound for components $B_1$.

Examples thereof are in the first group of the following list.

Preferably employed, however, are compounds listed in the following groups, i.e. compounds B carrying at least one activating substituent as well as compounds of Type $B_1$ carrying activating substituents or no further substituents except the $-CHR_1 - OR_b$ groups.

Aromatic compounds substituted only by deactivating groups

2-Chloro-naphthalene
Naphthalene-2-phosphonic acid
Anthracene-2carboxylic acid
Pyrene-4-sulfonic acid
Anthracene-2-sulfonic acid amide
6-Chloro-1-hydroxymethyl-naphthalene
4,4'-Bis-acetoxymethyl-diphenysulfone
4,4'-Bis-methoxymethyl-benzophenone
4-Chloro-hydroxymethyl-benzene Aromatic amines and the acylation products thereof Aniline, benzanilide, acetanilide, p-toluene-sulfonic acid anilide
3,5-Dimethyl-aniline
2-Methyl-aniline
3-Ethyl-aniline
N-Methyl-aniline
3-Methyl-N-ethyl-aniline
N,N-Dimethyl-aniline
3-Chloro-aniline
4-Ethoxy-aniline
N-Methanesulfonyl-3-ethoxy-aniline
3-Methoxy-aniline
3-Methoxy-N,N-dimethyl-aniline
3-Ethylmercapto-aniline
2-Methyl-N-benzyl-aniline
Diphenylamine
4-Methyl-diphenylamine
4-Hexyloxy-diphenylamine
4-Chloro-diphenylamine
4-Amino-diphenylamine
3',4'-Dimethoxy-3-methyl-diphenylamine
4'-Bromo-2,5-diethoxy-diphenylamine
4-Nitro-diphenylamine
Diphenylamine-4-sulfonic acid amide
N-methyl-diphenylamine
N-Benzyl-diphenylamine
4-Methoxy-N-benzyl-aniline
m-Phenylene-diamine
N,N-Dibutyryl-m-phenylene-diamine
1-Methyl-phenylene-diamine-(3,5)
4-Amino-diphenyl
3-Amino-diphenylmethane
1-Amino-naphthalene
2-Dimethylamino-naphthalene
6-Acetamino-2-methoxy-naphthalene
2,6-Diamino-naphthalene
2-Amino-anthracene
3-Amino-pyrene
3-Dimethylamino-pyrene
2-Anilino-pyridine
3-Amino-carbazole
3-Dimethylamino-diphenyleneoxide
4-Amino-diphenylether
4-Amino-diphenylsulfide Phenols, i.e. compounds in which the OH group is linked directly to an isocyclic or heterocyclic aromatic ring system and which may include one or more aromatic rings. These rings may carry any further substituents with the conditions that at least one position capable of condensation is maintained in the molecule.

Examples:

a. Phenols of the general formula

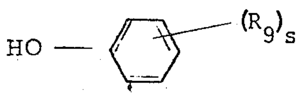

wherein $R_9$ is a monovalent radical and s is a number from 0 to 4.

Examples of combinations of $R_9$ and $s$:

| $R_9$ | $s$ | isomers |
|---|---|---|
| alkyl (1 to 3 carbon atoms) | 1–4 | all |
| alkyl (4 to 10 carbon atoms) | 1–2 | all |
| halogen (F, Cl, Br, I) | 1–2 | all |
| aralkyl, if desired substituted (7 to 20 carbon atoms) | 1–2 | all |
| aryl, if desired substituted (6 to 20 carbon atoms) | 1–2 | all |
| alkoxy and alkylmercapto (1 to 3 carbon atoms) | 1–3 | all |

-Continued

Examples of combinations of $R_9$ and *s*:

| $R_9$ | *s* | isomers |
|---|---|---|
| alkoxy, alkylmercapto and aralkoxy, if desired substituted (4 to 10 carbon atoms) | 1–2 | all |
| aryloxy, arylmercapto, if desired substituted (6 to 20 carbon atoms) | 1–2 | all |
| alkylamino, dialkylamino (1 to 4 carbon atoms) | 1–2 | all |
| arylamino (6 to 10 carbon atoms) | 1–2 | all |
| aryl—$SO_2$— (6 to 14 carbon atoms) | 1 | preferably in paraposition to the OH group |
| $SO_3H$, $PO_3H_2$, $AsO_3H_2$, COOH and the corresponding esters and amides | 1 | preferably in parapostion to the OH group |

Specific representatives are:

Phenol
2-Hydroxy-methylbenzene
4-Hydroxy-cyclohexylbenzene
4-Hydroxy-tert.-butylbenzene
2-Hydroxy-1,4-diethyl-benzene
3-Hydroxy-4-isopropyl-1-methyl-benzene
3-Hydroxy-1,2,4,5-tetramethyl-benzene
4-Fluoro-phenol
3-Iodo-phenol
2,5-Dichloro-phenol
4-Hydroxy-diphenylmethane
4-Hydroxy-cumene
4-Hydroxy-diphenyl
4'-Hydroxy-2,4-dimethyl-diphenyl
4-Hydroxy-diphenylmethane-4'-sulfonic acid
2-Hydroxy-1,4-dimethoxy-benzene
6-Hydroxy-1,3-diethoxy-benzene
4'-Hydroxy-phenyl-(2,4-dimethoxy-benzyl)-ether
4'-Hydroxy-2,4,6-trimethyl-diphenylether
4-Hydroxy-diphenylether
4'-Hydroxy-phenyl-[2,4-dibutoxy-naphthyl-(1)]-ether
3'-Hydroxy-4-methyl-diphenylsulfide
4-Amino-phenol
3-Benzoylamino-phenol
4-Benzenesulfonylamino-phenol
2-Ethylamino-phenol
3-Dimethylamino-phenol
4'-Hydroxy-phenyl-(2-methyl-phenyl)-sulfone
Phenol-4-sulfonic acid
Phenol-4-carboxylic acid
Phenol-2-carboxylic acid
Phenol-4-carboxylic acid methyl ester
Phenol-2-carboxylic acid diethylamide
4-Hydroxy-acetophenone
4-Hydroxy-benzophenone
4-Hydroxy-cinnamic acid
3-Hydroxy-cinnamic acid amide
4-Hydroxy-benzylidene-acetophenone b) Phenols of which the phenolic OH group is in a polynuclear aromatic system. Representatives are:

2-Hydroxy-naphthalene
5-Hydroxy-2,6-dimethyl-naphthalene
4-Hydroxy-2-methoxy-naphthalene
4-Hydroxy-1-butoxy-naphthalene
2-Methoxy-naphthalene-6-sulfonic acid amide
5,7-Dichloro-1-hydroxy-naphthalene
2-Hydroxy-naphthalene-6-sulfonic acid
2-Hydroxy-naphthalene-3-carboxylic acid anilide
1-Hydroxy-phenanthrene
2-Hydroxy-anthracene
4-Hydroxy-pyrene
2,6-Diacetoxy-naphthalene c) Multivalent phenols, e.g.:

1,3-Dihydroxy-benzene
1,3-Dibenzoyloxy-benzene
4,4'-Dihydroxy-diphenylmethane
2,2-Bis-(4-hydroxy-3-methyl-phenyl)-propane
Bis-(4-hydroxy-phenyl)-sulfone
4,4'-Dihydroxy-benzophenone
4,4'-Dihydroxy-3,3'-dichloro-diphenylether
1,5-Dihydroxy-naphthalene Derivatives of Type $B_1$ of phenols The "phenol alcohols" obtained from the above-mentioned phenols by means of formaldehyde addition as well as the ethers and esters thereof at the aliphatic OH group can be used in the process of the invention. Numerous phenol alcohols are described in the literature. A summary can be found, for example, in the monograph of Martin "The Chemistry of Phenolic Resins," John Wiley & Sons, N.Y., 1956. Also, the periodical "Die Makromolekulare Chemie," 44, pages 44 to 45 (1961) should be noted. Also suitable are phenol alcohols and the esters and ethers thereof, which are obtained in another manner, e.g. by halogen methylation or reduction of phenol aldehydes or phenol carboxylic acids or the esters thereof.

In addition to the phenol alcohols and their above-mentioned derivatives, it is also possible to employ the derivatives obtained by esterification of the phenolic OH group of these compounds by means of carboxylic and sulfonic acids.

The following phenol alcohols and derivatives thereof are suitable, for example:

2-Hydroxy-hydroxymethyl-benzene
6-Hydroxy-2,4-dimethyl-1,3,5-tris-hydroxymethyl-benzene
6-Acetoxy-3-methyl-1,5-bis-acetoxymethyl-benzene
5-Chloro-2-hydroxy-1,3-bis-hydroxymethyl-benzene
5-tert.-Butyl-2-hydroxy-1,3-bis-methoxymethyl-benzene
5-Benzyl-2-acetoxy-1,3-bis-acetoxymethyl-benzene
5-Phenoxy-2-hydroxy-1,3-bis-hydroxymethyl-benzene
5-Methoxycarbonyl-2-hydroxy-1,3-bis-hydroxymethyl-benzene
5-Cumyl-2-hydroxy-1,3-bis-methoxymethyl-benzene
5-Methylmercapto-2-hydroxy-1,3-bis-hydroxymethyl-benzene
5-Ethoxy-2-hydroxy-1,3-bis-methoxymethyl-benzene
5-Fluoro-2-hydroxy-6-methyl-1,3-bis-hydroxymethyl-benzene
5-Chloro-2-hydroxy-4,6-dimethyl-1,3-bis-hydroxymethyl-benzene
5-Chloro-4-hydroxy-2-methyl-1,3-bis-hydroxymethyl-benzene
3,5-Dibromo-2-hydroxy-hydroxymethyl-benzene
2,2'-Dihydroxy-dibenzylether
Dihydroxymethyl-hydroquinone
4-Hydroxy-3,5-bis-hydroxymethyl-diphenylether
2,2'-Bis-(4-hydroxy-3,5-bis-hydroxymethyl-phenyl)-propane
Bis-(4-hydroxy-5-methyl-3-hydroxymethyl-phenyl)-sulfone 3,4-Dihydroxy-hydroxymethylbenzene
2,3-Dihydroxy-1,4-bis-hydroxymethyl-benzene
2-Hydroxy-3-methoxy-hydroxymethylbenzene
2,2'-Dihydroxy-3,3'-bis-hydroxymethyl-diphenylmethane
1-Hydroxy-anthraquinone
Naphthosultone Thiophenols It is possible to use, instead of the phenols, the corresponding thiophenols, But the phenols are by far superior to the thiophenols since, inter alia, the latter are substantially more expensive, have a tendency toward side reactions, and many of them have an unpleasant smell. The same applies to the corresponding compounds of Type $B_1$.

Ethers of phenols and thiophenols and aromatic hydrocarbons

Suitable are, for example, the alkyl, aralkyl, and aryl ethers of the compounds indicated under "phenols" and "thiophenols." Aromatic hydrocarbons are suitable for condensation when they are substituted in the aromatic nucleus by alkyl, aryl, or aralkyl groups.

In the case of this group of compounds, it should be noted that ether, thioether, and alkyl groups exert less activating effect on the nucleus for condensation than do phenolic OH or SH groups. Consequently, substituion of this group of compounds by deactivating substituents is not possible to such an extent as with phenols.

Individual representatives of this group of compounds are as follows: (see also the preceding groups where ether, thioether or alkyl groups occur in addition to other activating substituents).

Methoxybenzene
2-Methoxy-1-methyl-benzene
2-Ethoxy-1,4-Diethyl-benzene
4-Methoxy-methylbenzene
2-Methoxy-diphenyl
1,3-Diethoxy-benzene
4-Methoxy-cinnamic acid
3,5-Dimethoxy-benzylideneacetophenone
Resorcinol diacetamide
1,4-Dimethoxy-benzene
1,2,4-Trimethoxy-benzene
2-Phenoxy-ethanol and its methylether
Phenoxyacetic acid
Phenoxyacetic acid amide
Phenoxymethylphosphonic acid
4-Methyl-phenoxymethylphosphonic acid
4-tert.-Butyl-phenoxymethylphosphonic acid
4-Chloro-phenoxymethylphosphonic acid
Phenylglycidylether and its reaction products in the acid condensation medium
4-Methoxy-diphenyl
3-(4-Methoxy-phenyl)-diphenyl
Diphenylether
3,2'-Dimethyl-diphenylether
3,3'-Dichloro-diphenylether
4,4'-Dibutoxy-diphenylmethane
4,4'-Dimethoxy-diphenyl
4,4'-Dibutoxy-diphenylether
2,4-Dimethoxy-5-methyl-diphenylether
3-Bromo-4-methoxy-diphenylether
2-Isopropyl-5-methyl-diphenylether
4,4'-Dimethoxy-diphenylmethane
3-Phenyl-diphenylether
4-Chloro-diphenylether
Bis-diphenyl-(4,4')-ether
Naphthyl-(1)-phenylether
Di-[naphthyl-(1)]-ether
1,3-Diphenoxy-benzene
2,2-Bis-[4-phenoxy-phenyl]-propane
1,2-Bis-phenoxy-ethane
1,2,3-Tris-phenoxy-propane
1,3-Bis-phenoxy-propanol-(2)
2-Methoxy-naphthalene-6-sulfonic acid amide
2,6-Dimethoxy-naphthalene
2-Methoxy-naphthalene-6-sulfonic acid
1-Methoxy-phenanthrene
4-Nitrodiphenyl ether
2-Ethoxy-anthracene
4-(2,3-Dihydroxy-propoxy)-pyrene
8-Methoxy-quinoline
1-Methoxy-naphthalene-4-carboxylic acid anilide
4,4'-Bis-ethylmercapto-diphenylether
4,4'-Dimethoxy-diphenylsulfide
4-Phenoxy-diphenylsulfide
2,4'-Dimethoxy-diphenylsulfide
Toluene
1,2-Dimethyl-benzene
1,3-Dimethyl-benzene
1,4-Diethyl-benzene
1,3,5-Trimethyl-benzene
1,2,4,5-Tetramethyl-benzene
Pentamethyl-benzene
1,3-Diisopropyl-benzene
2,6-Dimethyl-naphthalene
2-tert.-Butyl-naphthalene
9,10-Dimethyl-anthracene
1-Methyl-7-isopropyl-phenanthrene
Diphenyl
Diphenylmethane
Dibenzyl
Stilbene
1-Phenyl-naphthalene
Dinaphthyl-(1,1')-methane Compounds of Type $B_1$ derived from phenolethers, thiophenolethers, aromatic hydrocarbons, and heterocyclic compounds Compounds of Type $B_1$ of this group of compounds are obtained, for example, by halogenmethylating the basic structures described in the last paragraph and then converting the halogenmethyl groups to the groups $—CH_2OH$, $—CH_2O$ alkyl or $CH_2O$ acyl.

Numerous halogenmethyl compounds (carrying this group directly in the aromatic nucleus) suitable as intermediate products for the preparation of compounds of the type described here are known.

Compounds of Type $B_1$ derived from phenolethers also can be obtained by alkylation or aralkylation of the phenolic OH group of phenol alcohols.

Suitable representatives of these groups of compounds are, for example:

Benzylalcohol
Dibenzylether
1,3-Bis-hydroxymethyl-benzene
1,4-Bis-methoxymethyl-benzene
1,5-Bis-acetoxymethyl-naphthalene
1,4-Bis-hydroxymethyl-naphthalene
1-Hydroxymethyl-naphthalene
2-Hydroxymethyl-naphthalene
9,10-Bis-methoxymethyl-anthracene
9-Hydroxymethyl-phenanthrene
2,5-Bis-methoxymethyl-thiophene 2-Hydroxymethyl-furan
Bis-methoxymethyl-diphenyleneoxide
Benzhydrol
1,4-Bis-(α-hydroxybenzyl)-benzene
3-Methyl-hydroxymethylbenzene
2,5-Dimethyl-hydroxymethylbenzene
2-Methyl-5-isopropyl-hydroxymethylbenzene
4,6-Dimethyl-1,3-bis-hydroxymethyl-benzene
2,5-Dimethyl-1,4-bis-hydroxymethyl-benzene
2,4,6-Trimethyl-1,3-bis-hydroxymethyl-benzene
2,4,6-Trimethyl-1,3,5-tris-methoxymethyl-benzene
2,3,5,6-Tetramethyl-1,4-bis-acetoxymethyl-benzene
2,4,5,6-Tetramethyl-1,3-bis-ethoxymethyl-benzene
2-Methyl-1,5-bis-acetoxymethyl-naphthalene
2-Ethyl-9,10-bis-methoxymethyl-anthracene
2,4-Diisopropyl-hydroxymethylbenzene
4,6-Diisopropyl-1,3-bis-hydroxymethyl-benzene
4,6-Diisopropyl-1,3-bis-methoxymethyl-benzene
1,3-Bis-(3-hydroxymethyl-phenoxy)-propane
1,5-Bis-(4-hydroxymethyl-phenoxy)-pentane
1,3-Dihydroxymethyl-2-methoxy-5-n-hexyl-benzene
1,3-Dihydroxymethyl-2-ethoxy-5-ethyl-benzene
1,3-Dihydroxymethyl-2-benzyloxy-5-methoxycarbonyl-benzene
1,3-Dihydroxymethyl-2-methoxy-5-bromo-benzene
1,3-Dihydroxymethyl-2-methoxy-5-cumyl-benzene
1,3-Dihydroxymethyl-2-ethoxy-5-methylmercapto-benzene
1,3-Dihydroxymethyl-2-ethoxy-5-phenoxy-benzene
1,3-Dihydroxymethyl-2,5-diethoxy-benzene
1,3-Dihydroxymethyl-2-methoxy-5-benzyl-benzene
2,6-Bis-hydroxymethyl-naphthalene
Bis-methoxymethyl-diphenylenesulfide
Bis-methoxymethyl-dimethyldiphenyleneoxide
2,6-Bis-hydroxymethyl-naphthalene
1,3-Dimethoxymethyl-2-methoxy-5-fluoro-benzene
1,3-Dimethoxymethyl-2-ethoxy-5-methoxy-benzene
1,3-Dimethoxymethyl-2-methoxy-5-phenyl-benzene
Bis-[2-(4-hydroxymethyl-phenoxy)ethyl]ether
1,3-Dimethoxymethyl-2-ethoxy-5-bromo-benzene
1,3-Diacetoxymethyl-2-ethoxy-5-tert.-butyl-benzene
1,3-Diacetoxymethyl-2-methoxy-5-phenylmercapto-benzene
1,3-Diacetoxymethyl-2-methoxy-5-chloro-benzene
1,3-Diacetoxymethyl-2,5-dimethoxy-benzene
1,3-Bis-(methyl-4-benzyl-6-hydroxymethyl-phenoxy)-propane
3,4-Dimethoxy-hydroxymethylbenzene
6-Bromo-3,4-dimethoxy-hydroxymethylbenzene
4,5-Dimethoxy-2-methyl-hydroxymethylbenzenzene
2,3-Dimethoxy-hydroxymethylbenzene
2,2′-Dimethoxy-3,3′-bis-hydroxymethyl-5,5′-dimethyl-diphenylmethane
Dihydroxymethyl-hydroquinonedimethylether
4-methoxy-3,5-bis-hydroxymethyl-diphenylether
Bis-(4-ethoxy-5-methyl-3-hydroxymethyl-phenyl)-sulfone
4-Methoxymethyl-diphenylether
2-Hydroxymethyl-diphenylether
4,4′-Bis-hydroxymethyl-diphenylether
4,4′-Bis-acetoxymethyl-diphenylether
4,4′-Bis-methoxymethyl-diphenylether
4,4′-Bis-ethoxymethyl-diphenylether
2,4′-Bis-methoxymethyl-diphenylether
2,4,4′-Tris-methoxymethyl-diphenylether
2,4,2′-Tris-methoxymethyl-diphenylether
2,4,2′,4′-Tetrakis-methoxymethyl-diphenylether
Bis-methoxymethyl-4,4′-dimethyl-diphenylether
Bis-methoxymethyl-2,4-dimethoxy-5-methyl-diphenylether
Bis-methoxymethyl-3,3′-dimethyl-diphenylsulfide
Bis-methoxymethyl-2,4′-dimethoxy-diphenylsulfide
2,2′-Dimethyl-4,4′-bis-hydroxymethyl-diphenylether
4-Chloro-4′-methoxymethyl-diphenylether
1,3-Bis-(4-methoxymethyl-phenoxy)-benzene
1,3-Bis-(4-methoxymethyl-phenoxy)-propane
4,4′-Bis-acetoxymethyl-diphenylmethane
4,4′-Bis-methoxymethyl-diphenyl
4,4′-Bis-methoxymethyl-diphenylsulfide
6-Methylmercapto-3-methyl-hydroxymethylbenzene
2,2-Bis-[4-(4-methoxymethyl-phenoxy)-phenyl]-propane
4,4′-bis-phenoxymethyl-diphenylether
Bis-methoxymethyl-4-phenoxydiphenylsulfide
Bis-methoxymethyl-2-isopropyl-5-methyl-diphenylether
Bis-methoxymethyl-3-bromo-4-methoxy-diphenylether
Bis-methoxymethyl-4-nitro-diphenylether The preceding compounds of Type B have at least one nuclear position in an aromatic ring which can be condensed in an acid medium. The following compounds of Type B also are capable of condensation if they contain no aromatic rings or the rings contain no condensable nuclear positions or if the rings are largely deactivated due to substitution thereon.

This group of compounds contains at least one substituent which is able to react with an active carbonyl compound with condensation. Examplary of such substituents are:

—NH-CO-$NH_2$
—NH-CS-$NH_2$
—CO-$NH_2$
—CO-NH-alkyl
—$SO_2$-$NH_2$
—$SO_2$-NH-CO-$NH_2$
—$SO_2$-NH-alkyl
—NH-CO-NH-alkyl
—CN,
and
amino groups directly linked to aromatic, particularly to heterocyclic aromatic, rings.

These substituents, of course, also may be linked to aromatic nuclei which themselves are capable of condensation by appropriate substitution. consequently, condensation may occur in the nucleus as well as in the first-mentioned substituent.

Exemplary of this general group of compounds are:

Urea
Thiourea
Ethyleneurea
N,N′-dimethylurea
Glyoxaldiureine
Oxamide
Succinic acid diamide
Adipic acid diamide
Adipic acid monoamide
Sebacic acid diamide
Iminodiacetic acid diamide
Di-n-propylether-3,3′-dicarboxylic acid diamide
Citric acid triamide
Benzamide
Terephthalic acid diamide
Isophthalic acid diamide
Benzenesulfonic acid amide m-Benzenedisulfonic acid diamide
p-Toluenesulfonic acid amide
2,6-Di-tert.-butyl-naphthalene-1,5-disulfonic acid diamide
Adipic acid dinitrile
p-Toluenesulfonic acid -N-ethylamide
2,4,6-Trimethyl-benzenesulfonic acid amide
Tetrahydronaphthalenesulfonic acid amide
Tetrahydronaphthalenesulfonic acid methylamide ($SO_2$ group in the hydrogenated ring)
3-Nitro-benzenesulfonic acid amide
4-Methoxy-benzenesulfonic acid amide
Benzene-1-sulfonic acid amide-3-carboxylic acid amide
Benzenetrisulfonic acid triamide
Phenol-2,4-disulfonic acid diamide
p-Aminobenzenesulfonic acid amide
Melamine (as well as the lower amides of cyanuric acid)
Benzoguanamine It is also possible to derive compounds of Type $B_1$ from compounds B of this type and to use them.

Exemplary thereof are:

Bis-hydroxymethyl-urea
Bis-hydroxymethyl-ethyleneurea
Bis-hydroxymethyl-oxamide
Bis-hydroxymethyl-succinic acid diamide
Bis-methoxymethyl-adipic acid diamide
Bis-hydroxymethyl-sebacic acid diamide
Hydroxymethylbenzamide
Bis-hydroxymethyl-terephthalic acid diamide
Hydroxymethylbenzenesulfonic acid amide
Tetra-(hydroxymethyl)-melamine
Hexa-(methoxymethyl)-melamine The preceding list shows the most important groups of compounds to be used as components B or $B_1$. The possibilities, however, are not limited thereby; it is also possible to use, for example, cyanuric acid hydrazides, guanidine derivatives, aminopyrimidines, and the like, as components B.

For further possibilities, reference is made to the literature concerning condensation resins, e.g. Houben-Weyl, "Methoden der organischen Chemie," 4th edition, volume 14/2, pages 193 to 402, "Polyadditions- bzw. Kondensationsprodukte von Carbonyl- und Thiocarbonylverbindungen."

The following examples describe the production of copying materials according to the invention, employing light-sensitive mixed condensates. In spite of their large number, the scope of the present invention is by no means limited thereby.

For better identification of the mixed condensates, in addition to the result of the elemental analysis, the molecular proportion - calculated from the values obtained by the analysis - is started in many examples in which diazo compound, component B and/or component $B_1$ take part in the structure of the product. This proportion was calculated under somewhat simplified assumptions. Although these statements can not and do not determine the exact structure of the mixed condensates according to the invention, they suffice for identifying condensation products which are reproducible in their characteristics.

As mentioned above, in many cases the condensation conditions, in particular the quantities employed, are important and even necessary for further identification.

The examples contain all the information required for the preparation of the mixed condensates.

In the examples, parts by weight and parts by volume relate to each other as grams to milliliters. Percentages are by weight if not otherwise stated. The temperatures are degrees Centigrade. In the values of the analysis, N means the total nitrogen content and ND the diazo nitrogen.

Normally, no great stress was placed on a complete drying of the condensation products, so that the products obtained may contain small quantities of water or condensing agent. Moreover, varying quantities of metal salts may be entrained in some cases during precipitation. However, the contents of the products of active substance can be easily determined by the values of the analysis.

The term "crude condensate" used in the examples means, generally, the crude condensation mixture obtained during condensation, which normally also contains the condensing medium and perhaps a solvent.

For better orientation, the diazo compounds $A(-D)_n$ and the components B and $B_1$ used for the preparation of the mixed condensates contained in the reproduction material according to the invention are listed in the following Table 1 by numbers. In the examples, reference is made to these numbers.

Table 1

| | |
|---|---|
| **Diazo Compounds** | |
| Diazo 1: | Diphenylamine-4-diazonium salt |
| Diazo 2: | 3-Methoxy-diphenylamine-4-diazonium salt |
| Diazo 3: | 4'-Methoxy-diphenylamine-4-diazonium salt |
| Diazo 4: | 2'-Carboxy-diphenylamine-4-diazonium salt |
| Diazo 5: | 2,4',5-Triethoxy-diphenyl-4-diazonium salt |
| Diazo 6: | 4-(4-Methyl-phenylmercapto)-2,5-dimethoxy-benzene diazonium salt |
| Diazo 7: | 2,5-Dimethoxy-4-phenoxy-benzene diazonium salt |
| Diazo 8: | 4-(2,5-Diethoxy-benzoylamino)-2,5-diethoxy-benzene diazonium salt |
| Diazo 9: | 3-Methoxy-diphenyleneoxide-2-diazonium salt |
| Diazo 10: | 2-Sulfo-4-diazo-diphenylamine (inner salt) |
| Diazo 11: | 4-[N-Methyl-N-naphthyl-(1)-methylamino]-benzene diazonium salt |
| Diazo 12: | 4-Diazo-diphenylamine-3-carboxylic acid (inner salt) |
| Diazo 13: | 2,5-Dimethoxy-4-(N-methyl-N-phenylmercaptoacetylamino)-benzene diazonium salt |
| Diazo 14: | 4-[N-Methyl-N-(β-phenyl-mercaptoethyl)-amino]-benzene diazonium salt |
| **Components B and $B_1$** | |
| No. 1: | 3,5-Dimethyl-aniline |
| No. 2: | Diphenylamine |
| No. 3: | 4-Chloro-diphenylamine |
| No. 4: | 3-Methoxy-diphenylamine |
| No. 5: | 4-Methyl-diphenylamine |
| No. 6: | 4-Nitro-diphenylamine |
| No. 7: | 2-Dimethylamino-naphthalene |
| No. 8: | Phenol |
| No. 9: | 4-tert.-Butyl-phenol |
| No. 10: | 4-Nitro-phenol |
| No. 11: | 4-Hydroxy-cinnamic acid |
| No. 12: | 4-Hydroxy-benzoic acid |
| No. 13: | 2-Hydroxy-naphthalene-6-sulfonic acid |
| No. 14: | Benzene |
| No. 15: | Phenanthrene |
| No. 16: | Mesitylene |
| No. 17: | Anisole |
| No. 18: | 2-Phenoxy-ethanol |
| No. 19: | Phenoxy-acetic acid |
| No. 20: | 3-Methyl-phenoxymethyl-phosphonic acid |
| No. 21: | 4-Chloro-phenoxymethyl-phosphonic acid |
| No. 22: | 4-tert.-Butyl-phenoxymethyl-phosphonic acid |
| No. 23: | 2-Methoxy-naphthalene-6-sulfonic acid |
| No. 24: | Diphenylene-oxide |
| No. 25: | p-Toluene-sulfonic acid amide |
| No. 26: | N,N'-Dimethylol-succinic acid diamide |
| No. 27: | Sebacic acid diamide |
| No. 28: | Hexa-methoxymethyl-melamine |
| No. 29: | N,N'-Dimethylol-urea |
| No. 30: | N,N'-Dimethylol-terephthalic acid diamide |
| No. 31: | 2,6-Dimethylol-4-methyl-phenol |
| No. 32: | 2,6-Dimethylol-4-methyl-anisole |

Table 1-Continued

| Diazo Compounds | |
|---|---|
| No. 33: | Di-hydroxymethyl-durene |
| No. 34: | Di-acetoxymethyl-durene |
| No. 35: | 1,3-Dimethyl-4,6-dimethylol-benzene |
| No. 36: | 1,3-Diisopropyl-4,6-dimethylol-benzene |
| No. 37: | 1,5-Di-acetoxymethyl-naphthalene |
| No. 38: | 1,4-Dimethylol-benzene |
| No. 39: | Commercial bis-methoxymethyl-diphenylether (Composition stated in Example 21) |
| No. 40: | 4,4'-Di-acetoxymethyl-diphenylether |
| No. 41: | 4,4'-Di-methoxy-methyl-diphenylether |
| No. 42: | 2,5-Di-ethoxymethyl-thiophene |
| No. 43: | 9,10-Di-methoxymethyl-anthracene |
| No. 44: | Benzhydrol |
| No. 45: | 1,4-Bis-(α-hydroxybenzyl)-benzene |
| No. 46: | 1,3-Diisopropyl-4,6-di-methoxymethyl-benzene |
| No. 47: | 4,4'-Di-methoxymethyl-diphenylsulfide |
| No. 48: | Methoxymethyl-diphenyl-ether, obtained by reaction of technical chloromethylated diphenyl-ether with sodium methylate (composition see Example 84) |
| No. 49: | 2,2'-Bis-(4-hydroxymethyl-phenoxy)-diethylether |
| No. 50: | 1,3-Bis-(4-hydroxymethyl-phenoxy)-propane |
| No. 51: | Bis-methoxymethyl-diphenylene oxide |
| No. 52: | 4,4'-Bis-methoxymethyl-diphenylmethane |
| No. 53: | Methoxymethylated biphenyl |
| No. 54: | Methoxymethylated 4,4'-dimethyl-diphenylether |
| No. 55: | Methoxymethylated 2-isopropyl-5-methyl-diphenylether |
| No. 56: | Methoxymethylated 3-bromo-4-methoxy-diphenylether |
| No. 57: | Methoxymethylated bidenzo-thiophene |
| No. 58: | Methoxymethylated 1,4-diphenoxybenzene |
| No. 59: | 2,6-Bis-(methoxymethyl)-4-methyl-phenol |
| No. 60: | Diphenylether |
| No. 61: | N,N'-Dimethylol-oxamide |
| No. 62: | Adipic acid diamide |
| No. 63: | N,N'-Dimethylol adipic acid diamide |
| No. 64: | Trimethylolcitramide |
| No. 65: | p-Toluenesulfonic acid amilide |
| No. 66: | p-Toluenesulfonic acid ethylamide |
| No. 67: | 1,3-Benzene-disulfonic acid diamide |
| No. 68: | Phenylthiourea |
| No. 69: | Phenylurea |
| No. 70: | 2-Benzoylamino-1,4-diethoxy-benzene |
| No. 71: | 3-Amino-pyrene |
| No. 72: | 2-Phenyl-amino-pyridine |
| No. 73: | Thiophene |

Examples 1 to 35

In the following examples, the good to excellent oleophilic properties of the exposure products of 35 of the novel condensation products, when applied to superficially saponified cellulose acetate film, are shown in combination with an improved light-sensitivity, in comparison with pure formaldehyde condensates. The compositions of the condensation products and of the coating solutions used are listed in the following Table 2.

Table 2

| Ex. | Mixed Condensate (MC) | | | | | | Coating Solution | | |
|---|---|---|---|---|---|---|---|---|---|
| | Diazo Compound $A(-D)_x$ | Component B or | $B_1$ | $CH_2O$ | Separated in the form of | Proportion of $A\text{-}D)_x$ to B or $B_1$ in MC (approx.) | % MC | Further Additives | Solvent (parts by vol.) |
| 1 | Diazo 2, $Cl^-$ | 6 | — | + | $Cl^-\cdot ZnCl_2/2$ | 1:0.5 | 2 % | — | $H_2O$ |
| 2 | Diazo 2, $H_2PO_4^-$ | 5 or 5 + 2 | — | + | $H_2PO_4^-$. $H_3PO_4$ | 1:0.75 | 2 % | — | $H_2O$/ n-butanol 96:4 |
| 3 | Diazo 2, $H_2PO_4^-$ | 5 | — | + | $H_2PO_4^-$, $H_3PO_4$ | 1:0.42 | 2 % | — | $H_2O$ |
| 4 | Diazo 2, $Cl^-$ | 8 | — | + | crude condensate | 1:0.15 to 1:0.25 | 1 % crude condens. | — | $H_2O$ |
| 5 | Diazo 1, $Cl^-$ | 8 | — | + | crude condensate | 1:03 | 1 % crude condens. | — | $H_2O$ |
| 6 | Diazo 1, $Cl^-$ | 11 | — | + | $CH_3SO_3^-$ | 1:1.1 | 1.8% | — | $H_2O$ |
| 7 | Diazo 1, $HSO_4^-$ | 10 | — | + | $HSO_4^-$ | 1:0.8 | 2 % | — | EGMME/DMF $H_2O$ 55:35:10 |
| 8 | Diazo 1, $HSO_4^-$ | 14+15 | — | + | $Cl^-$ | excess of 9.6 C— atoms per $N_2$ group | 0.9% | — | $H_2O$ (insoluble compon. being filtered off) |
| 9 | Diazo 1, $HSO_4^-$ | 16 | — | + | $Cl^-$. $ZnCl_2/2$ | 1:1 | 2 % | — | $H_2O$/ethanol 8:2 |
| 10 | Diazo 1, $HSO_4^-$ | 17 | — | + | $Cl^-$. $ZnCl_2/2$ or $HSO_4$ | 1:0.5 | 1.2% | — | $H_2O$ |
| 11 | Diazo 2, $HSO_4^-$ | 18 | — | + | $H_2PO_4^-$. $H_3PO_4$ | 1:1 | 2.0% | — | $H_2O$ |
| 12 | Diazo 1, $Cl^-$ | 19 | — | + | $CH_3SO_3^-$ | 1:1.46 | 2.0% | — | $H_2O$ |
| 13 | Diazo 2, $HSO_4^-$ | 27 | — | + | $Cl^-$. $ZnCl_2/2$ | 1:0.65 | 1.6% | — | $H_2O$ |
| 14 | Diazo 3, $HSO_4^-$ | — | 30 | – | $Cl^-$. $ZnCl_2/2$ | C:N = 23.6:5 | 1.2% | — | EGMME/DMF $H_2O$ 55:37:8 |
| 15 | Diazo 2, $H_2PO_4^-$ | — | 31 | – | $H_2PO_4^-$. $H_3PO_4$ | 1:1 | 1.65% | — | $H_2O/C_2H_5OH$ 8:2 |
| 16 | Diazo 2, $HSO_4^-$ | — | 33 | – | $Cl^-$ | 1:1.1 | 1.0% | — | EGMME |
| 17 | Diazo 2, $HSO_4^-$ | — | 32 | – | $Cl^-$ | 1:1.1 | 1.0% | — | $H_2O$ |
| 18 | Diazo 1, $HSO_4^-$ | — | 35+37 | – | $Cl^-$ | excess of 9.6 C— atoms per $N_2$ group | 0.8% | — | $H_2O$ |
| 19 | Diazo 2, $HSO_4^-$ | — | 36 | – | $Cl^-$ | 1:2.4 | 1.65% | — | EGMME |
| 20 | Diazo 4, $H_2PO_4^-$ | — | 34 | – | $Cl^-$ | 1:1.1 | 1.0% | — | EGMME |

Table 2 – Continued

| Ex. | Mixed Condensate (MC) | | | | | | Coating Solution | | |
|---|---|---|---|---|---|---|---|---|---|
| | Diazo Compound $A(-D)_n$ | Component B or | Component $B_1$ | $CH_2O$ | Separated in the form of | Proportion of $A(-D)_n$ to B or $B_1$ in MC (approx.) | % MC | Further Additives | Solvent (parts by vol.) |
| 21 | Diazo 2, $HSO_4^-$ | — | 39 | – | $Cl^-$ | excess of 10.6 C—atoms per $N_2$ group | 1.0% | — | $H_2O$ |
| 22 | Diazo 1, $HSO_4^-$ | — | 45 | – | $Cl^-$ | 1:0.716 | 0.92 | — | EGMME |
| 23 | Diazo 1, $HSO_4^-$ | — | 44 | + | $Cl^-$ | 1:0.9 | 0.5% | — | EGMME |
| 24 | Diazo 2, $HSO_4^-$ | — | 39 | + | crude condensate | 1:0.2 | 2.0% | – | $H_2O$ |
| 25 | Diazo 2, $HSO_4^-$ | — | 36 | – | $Cl^-$ | 1:1.05 | a)0.1<br>b)0.1% | 2 molecules of $H_3PO_4$/ diazo group<br>0.1% of $ZnCl_2$/ diazo group | $H_2O$<br>½ molecule |
| 26 | Diazo 1, $HSO_4^-$ | — | — | + | $Cl^-$, $ZnCl_2/2$ | — | 0.1 % | — | $H_2O$ |
| 27 | Diazo 1, $H_2PO_4^-$ +Diazo 2, $H_2PO_4$ | — | 42 | – | $H_2PO_4^-$, $H_3PO_4$ | 1:2 | 1.2 % | – | $H_2O$ |
| 28 | Diazo 7, $Cl^-ZnCl_2/2$ | — | 46 | – | $Cl^-$, $ZnCl_2/2$ | 1:1.18 | 2.0% | – | $H_2O$ |
| 29 | Diazo 7, $Cl^-ZnCl_2/2$ | — | 46 | – | $Cl^-$, $ZnCl_2/2$ | 1:1.5 | 2.0%<br>0.1% | —<br>— | $H_2O$<br>$H_2O$ |
| 30 | Diazo 8, $Cl^-ZnCl_2/2$ | — | 38 | – | $Cl^-$, $ZnCl_2/2$ | 1:0.4 | 2.0% | – | $H_2O$ |
| 31 | Diazo 9, $Cl^-ZnCl_2/2$ | — | 38 | – | $Cl^-$, $ZnCl_2/2$ | 1:0.625 | 1.0% | – | $H_2O$ |
| 32 | Diazo 2, $HSO_4^-$ | 25 | — | + | $Cl^-$ | 1:0.68 | 2.0% | — | $H_2O$ |
| 33 | Diazo 2, $Cl^-$ | — | 41 | + | $Cl^-$ | 1:5.4 (see preparation) | 1.0% or 0.1% | — | $H_2O$ |
| 34 | Diazo 6, $Cl^-ZnCl_2/2$ | — | 38 | – | $Cl^-$, $ZnCl_2/2$ | 1:0.7 | 1.0% or 0.1% | — | $H_2O$ |
| 35 | Diazo 2, $HSO_4^-$ | — | 41 | + | $Cl^-$ | excess of 17 C—atoms/$N_2$ group | 1.0% | — | $H_2O$ |

EGMME = ethyleneglycol monomethylether
DMF = Dimethyl formamide

In the case of purely aqueous coating solutions, coating may be effected by swabbing, whereas solutions containing predominantly organic solvents are applied by means of a plate whirler. Warm air is used for drying. After image-wise exposure under a negative original, the material is developed, e.g. by wiping over with water or one of the known buffered solutions of water-soluble coupling components, e.g. such of the pyrazolone series. The material is then inked up with greasy ink, with the exposure products accepting the ink. In a number of cases, it is also possible to reinforce the image by means of lacquers, e.g. by the usual emulsion lacquers. In all cases, the oleophilic properties of the exposure products of the novel diazo condensates are superior to those of the hitherto known formaldehyde condensates of the corresponding diazo compounds.

This fact is illustrated by the following comparisons:

Formaldehyde condensates of Diazo Compounds 1 and 2, produced in phosphoric acid as described in Example 1 of U.S. Pat. No. 3,311,605 and Example 1 of U.S. Pat. No. 3,406,159, respectively, yield exposure products which have only poor ink receptivity or accept no ink at all, when they are coated and processed as described above.

By adding phosphoric acid to the coating solution, even poorer results are obtained.

In contradistinction thereto, the novel condensation products produced in phosphoric acid, e.g. those of Examples 2, 3, 11, 15 to 17, 19, 21, 23, 27, 32, 33, and 35, possess good to excellent ink receptivity in the image areas. The good oleophilic properties are not lost by the used in Exs. 8 and 16 to 22, e.g., may contain 2 molecules of phosphoric acid per diazo group, without a reduction worth mentioning of the ink receptivity of the exposure products. In Example 35, there are even 10 molecules of phosphoric acid present per diazo group. It is also indicated by Examples 4, 5, and 24, in which crude condensates produced in phosphoric acid are used for coating without separation of the condensing agent.

In these examples, it is also demonstrated that the incorporation of small amounts of component B or component $B_1$ is sufficient to cause an appreciable effect according to the invention. This effect occurs even in the case of an incorporation of only 0.15 mol of component B per mol of diazo compound, although optimum results are not obtained in this case.

Examples 25, 26, 29 and 32 show the superiority of the novel condensation products as compared with the formaldehyde condensates prepared in sulfuric acid and precipitated in the form of the zinc chloride double salt, which are preferred at present as diazo resins. Even with 0.1 per cent solutions of the novel mixed condensates (Example 25) and the addition of 2 molecules of phosphoric acid per diazo group, printing forms of good ink-receptivity are obtained from which prints can be made on the conventional offset presses.

When using a 0.1 per cent solution of the corresponding formaldehyde condensate (Example 26) and processing in the same manner, no ink-receptivity worth mentioning is achieved. A moderately satisfactory ink-receptivity is only achieved by increasing the concentration of this diazo compound to many times this quantity.

The preparation and composition of the mixed condensates used in Examples 1 to 35 is now described in detail as follows:

EXAMPLE 1

10.8 parts by weight of 3-methoxy-diphenylamine-4-diazonium chloride (Diazo 2, chloride, Table 1) (97 percent) are dissolved in 16 parts by volume of methane sulfonic acid (90 percent). 1.8 parts by weight of paraformaldehyde are introduced into the solution and condensation is effected for 10 minutes, maintaining a temperature below 30°C. A solution which has been prepared from 4.3 parts by weight of 4-nitrodiphenylamine (Component B, No. 6, Table 1) and 32 parts by volume of 90 percent methane sulfonic acid is immediately added dropwise, at 25°C, with stirring, and stirring is continued for 1.75 hours. The crude condensate is stirred into 600 parts by volume of water without delay, whereupon Fraction I of the mixed condensate precipitates in the form of a resinous mass. For purification, this mass is dissolved in 120 parts by volume of ethyleneglycol monomethylether and reprecipitated by introducing the solution into 750 parts by volume of isopropanol. The precipitate is drawn off by suction and air-dried. Fraction I: 5.3 parts by weight of a mixed condensate in the form of the methane sulfonate which, according to analysis, contains about 1.5 units of 4-nitro-diphenylamine per diazo group. (N 11.6%, ND 3.8%, S 4.8%; atomic ratio: 6.08:2:1.1)

From the filtrate of the first precipitate (Fraction I), a Fraction II is obtained by adding zinc chloride and sodium chloride, and this Fraction II is reprecipitated by dissolving it in water and adding zinc chloride and sodium chloride. Yield: 8.0 parts by weight.

Fraction II: A mixed condensate which contains about 0.5 mole of 4-nitro-diphenylamine per mole of diazo compound. (N 8.2 percent, ND 4.1 percent, Cl 29.2 percent, ZN 5.1 percent; atomic ratio: 4:2:5.6:0.54).

EXAMPLE 2

14.6 parts by weight of 4-methyl-diphenylamine (Component B, No. 5, Table 1) are dissolved at 80°C. in 120 parts by volume of 86.7% phosphoric acid. After cooling to 40°C., 25.8 parts by weight of 3-methoxy-diphenylamine-4-diazonium phosphate (Diazo 2, phosphate, Table 1) are introduced, the mixture is stirred until all components are dissolved, and the mass is then cooled to room temperature. At this temperature, a solution of 4.8 parts by weight of paraformaldehyde in 48 parts by volume of 86.7 percent phosphoric acid is added dropwise, with stirring, and stirring is then continued for 15 hours. The crude condensate forms no residue when it is dissolved in water. For precipitation of the condensate, the reaction mixture is first diluted with 440 parts by volume of methanol and then added to 6,000 parts by volume of isopropanol. The resulting fine suspension is heated to 40°C. with stirring, until it deposits readily as soon as the stirrer is turned off. The precipitate is drawn off by suction, twice suspended, each time in 1000 parts by volume of isopropanol, washed, and then dried under reduced pressure at 40°C. Yield: 32.5 parts by weight. According to analysis, the mixed condensate, which is in the form of the acid phosphate, contains approximately 0.75 mole of 4-methyl-diphenylamine per mole of diazo compound. ( C 48.4%, ND 4.6%, P 10.8%; atomic ratio: 24.5:2:2.12)

A superficially saponified cellulose acetate support may be coated, with equal success, with a mixed condensate which has been prepared analogously, except that 20 per cent of the 4-methyl-diphenylamine has been replaced by diphenylamine.

EXAMPLE 3

The procedure described in Example 2 is repeated, using, however, the following starting materials: 7.3 parts by weight of 4-methyldiphenylamine (Component B, No. 5, Table 1), 80 parts by volume of 86.7% phosphoric acid, 25.8 parts by weight of 3-methoxy-diphenylamine-4-diazonium phosphate (Diazo 2, phosphate, Table 1), and 3.6 parts by weight of paraformaldehyde in 32 parts by volume of 86.7 percent phosphoric acid. 400 parts by volume of methanol and 5,000 parts by volume of isopropanol are used for precipitation, and the precipitate is washed twice, each time in 600 parts by volume of isopropanol. Yield: 33.2 parts by weight. According to analysis, the mixed condensate, which is in the form of the acid phosphate, contains approximately 0.42 mole of 4-methyl-diphenylamine incorporated therein per mole of diazo compound. (C 43.5 percent, ND 5.1 percent, P 12.4 percent, atomic ratio: 19.9:2:2.2.)

EXAMPLE 4

242 parts by weight of 3-methoxy-diphenylamine-4-diazonium chloride (Diazo 2, chloride, Table 1) are dissolved in a mixture of 265.5 parts by weight of 95 percent phosphoric acid and 8.55 parts by weight of water; 29.7 parts by weight of paraformaldehyde are added to the solution. Condensation is effected for 48 hours at 40°C. The reaction mixture is divided into three equal parts. Into each of these three parts, a phenol solution consisting of 18.8 parts by weight of phenol (Component B, No. 8, Table 1) and 4.4 parts by weight of water is introduced drop by drop in the quantities stated below:

1: 5.22 p.b.w. = 0.15 mole of phenol per mole of diazo compound

2: 6.97 p.b.w. = 0.20 mole of phenol per mole of diazo compound

3: 8.64 p.b.w. = 0.25 mole of phenol per mole of diazo compound

Condensation is continued for 3 hours after addition of the phenol solutions. The crude condensates obtained form clear solutions in water.

EXAMPLE 5

6.6 parts by weight of paraformaldehyde are introduced into 63.4 parts by weight of 86.7 percent phosphoric acid with stirring, and then 46.3 parts by weight of diphenylamine-4-diazonium chloride (Diazo 1, chloride, Table 1) are added. After a two hours' condensation at 40°C., 6.2 parts by weight of a phenol-water mixture (proportion by weight 9:1) are added and condensation is continued for 17 hours at 40°C. A crude condensate is thus obtained which forms a clear solution in water.

EXAMPLE 6

4.6 parts by weight of diphenylamine-4-diazonium chloride (Diazo 1, chloride, Table 1) and 3.3 parts by weight of 4acid (Component B, No. 11, Table 1) are dissolved at room temperature in 30 parts by volume of methane sulfonic acid (90%). The solution is cooled to +3°C., and then 1.2 parts by weight of paraformaldehyde are slowly introduced at this temperature. Condensation is continued for 30 minutes at the same temperature. At this stage, the crude condensate is capable of forming a clear solution in water. The reaction mixture is immediately diluted with 10 parts by volume of methanol while cooling, and the reaction product is precipitated by stirring the mixture into 400 parts by volume of isopropanol. The resulting precipitate is twice suspended, each time in 200 parts by volume of isopropanol, drawn off by suction, and dried under reduced pressure. Yield: 7.4 parts by weight. The mixed condensate (methane sulfonate) contains about 1 mole of 4-hydroxy-cinnamic acid per mole of diazo compound. (C 52.4%, ND 5.1%, S 6.3%; atomic ratio: 24:2:1.08)

EXAMPLE 7

12 parts by weight of diphenylamine-4-diazonium sulfate (Diazo 1, sulfate, Table 1) (97.6 percent) and 5.6 parts by weight of 4-nitro-phenol (Component B, No. 10, Table 1) are dissolved at room temperature in 25 parts by volume of 96 percent sulfuric acid. The solution is rapidly cooled to +5°C. and then 2.4 parts by weight of paraformaldehyde are introduced with stirring, while the temperature is maintained at +5°C. to +10°C. Stirring is continued for 3 hours at this temperature, and then the condensate is precipitated in the form of the sulfate by stirring the mixture into 500 parts by volume of isopropanol. After washing four times, with 200 parts by volume of isopropanol each time, the precipitate is drawn off by suction and dried under reduced pressure. Yield: 17.1 parts by weight. According to analysis, the product contains condensed therein about 0.8 mole of 4-nitrophenol per mole of diazo compound. (C 47.0%, ND 5.7%, S 7.7%; atomic ratio: C:ND:S = 19.25:2:1.18)

EXAMPLE 8

0.78 part by weight of benzene (Component B, No. 14, Table 1) is dissolved in 100 parts by volume of methane sulfonic acid (90%), 6.17 parts by weight of diphenylamine-4-diazonium sulfate (Diazo 1, sulfate, Table 1) (95 percent) are then added and, as soon as the entire mass is dissolved, 1.2 parts by weight of paraformaldehyde are added, with stirring. A previously prepared hot solution (100°C.) of 1.78 parts by weight of phenanthrene (Component B, No. 15, Table 1) in 20 parts by volume of glacial acetic acid is immediately poured into the thoroughly stirred mixture and the entire mass is condensed for 14 hours at room temperature. A crude condensate which forms a clear solution in water is obtained, i.e. a true mixed condensate. In known manner, e.g. by the addition of saturated common salt solution, the condensation product may be precipitated and isolated as the chloride. Yield: 4.5 parts by weight. The product contains a small quantity of common salt. (C 60.7%, N 9.0%; atomic ratio: 23.6:3)

EXAMPLE 9

11.3 parts by weight of mesitylene (Component B, No. 16, Table 1) are introduced with vigorous stirring at +5°C. into 100 parts by volume of 80% sulfuric acid. During continued vigorous stirring, an intimate mixture of 32.3 parts by weight of 3-methoxy-diphenylamine-4-diazonium sulfate (Diazo 2, sulfate, Table 1) and 6 parts by weight of paraformaldehyde is introduced into the mixture within 20 minutes while keeping the temperature from rising about +12°C. After continued stirring for 1 hour at +10°C. to +15°C., the mixture is immediately introduced into 4,000 parts by volume of ice water and then heated to 60°C. in order to dissolve the entire mass. The zinc chloride double salt is separated in known manner from the solution clarified over charcoal by the addition of zinc chloride and sodium chloride. In order to liberate the zinc chloride double salt from excess common salt, the crude product is dissolved in 260 parts by volume of dimethyl formamide (after drying), filtered off from salts, and again precipitated by stirring it into 2,000 parts by volume of isopropanol, thoroughly washed with isopropanol, and dried under reduced pressure at 40°C. Yield: 23.2 parts by weight. According to analysis, the condensate contains about 0.7 mole of the second component per mole of diazo compound. (C 56.4%, N 9.4%; atomic ratio: 21:3)

EXAMPLE 10

30 parts by weight of 97.6% diphenylamine-4-diazonium sulfate (Diazo 1, sulfate, Table 1) and 5.4 parts by weight of anisole (Component B, No. 17, Table 1) are distributed, with vigorous stirring and at room temperature, in 100 parts by volume of 80 percent sulfuric acid. 4.5 parts by weight of paraformaldehyde are introduced, with vigorous stirring, at 20°C. during 10 and stirring is continued for another hour at room temperature and then for 2 hours at 40°C. For the separation of the condensate, the mixture is diluted with 120 parts by volume of methanol, stirred into 2,400 parts by volume of isopropanol, the precipitate is filtered off by suction and washed twice suspending it in 1,200 parts by volume of isopropanol. The condensate is dried at 40°C. under reduced pressure. Yield: 30 parts by weight. According to analysis, the mixed condensate, which is in the form of the sulfate, contains about 0.5 mole of the second component per mole of diazo compound. (C 51.3 percent, N 10.7%; atomic ratio: 16.8:3)

Alternatively, the crude condensate may be processed by dissolving it in 2,000 parts by volume of water and precipitating the mixed condensate by means of zinc chloride and sodium chloride, in known manner.

EXAMPLE 11

6.9 parts by weight of 2-phenoxy-ethanol (Component B, No. 18, Table 1) and 16.2 parts by weight of 3-methoxy-diphenylamine-4-diazonium phosphate (Diazo 2, phosphate, Table 1) are dissolved at room temperature in 50 parts by volume of 86.7% phosphoric acid. 3 parts by weight of paraformaldehyde are added with stirring at room temperature and the mixture is condensed for 16 hours at 40°C. The crude condensate, which is completely soluble in water, is diluted with the same volume of methanol and the product is precipitated by stirring the mixture into 1,200 parts by volume of isopropanol. The precipitate is rapidly filtered by suction, washed twice by suspending it in 500 parts by volume of isopropanol, and dried under reduced pressure at 40°C. Yield: 22.7 parts by weight. According to analysis, the mixed condensate contains about 1 mole of the second component per mole of diazo compound. (C 46.4%, N 7.0%, P 8.7%; atomic ratio: 23.2:3:1.68)

A similar condensation product may be obtained by condensing the following starting materials for 16 hours at 40°C. according to the above-described method:

32.3 parts by weight of 3-methoxy-diphenylamine-4-diazonium sulfate (Diazo 2, sulfate, Table 1), 13.8 parts by weight of 2-phenoxyethanol (Component B, No. 18, Table 1), 60 parts by volume of 86.7% phosphoric acid and 6 parts by weight of paraformaldehyde. The crude condensate is dissolved in 400 parts by volume of water, the solution is filtered over active charcoal and, after heating to 40°C., slowly precipitated by adding 50 parts by volume of 50% zinc chloride solution. The precipitate is filtered by suction, washed with 5% sodium chloride solution and dried under reduced pressure. Yield: 54 parts by weight. According to analysis, the mixed condensate contains about 1 mole of the second component per mole of diazo compound. (C 48.0%, N 7.3%; atomic ratio: 23:3)

EXAMPLE 12

3 parts by weight of phenoxy acetic acid (Component B, No. 19, Table 1) are dissolved with stirring at 60°C. in 20 parts by volume of methane sulfonic acid (90%). The solution is cooled down to room temperature, 4.6 parts by weight of diphenylamine-4-diazonium chloride (Diazo 1, chloride, Table 1) are dissolved in the mixture, and 1.2 parts by weight of paraformaldehyde are slowly added with stirring, a temperature increase above 40°C. being avoided by cooling in a cold water bath from time to time. Stirring is continued for another 3 hours at room temperature. A crude condensate which is readily soluble in water is obtained. For the separation of the mixed condensate, the crude condensation mixture is diluted with 20 parts by volume of methanol and introduced, with stirring, into 400 parts by volume of isopropanol. The precipitate is rapidly filtered with suction, washed twice by suspending it in 150 parts by volume of isopropanol, and immediately dried at 40°C. under reduced pressure. Yield: 6.9 parts by weight. According to analysis, the mixed condensate, which is in the form of the methane sulfonate, contains about 1.4 moles of the second component per mole of diazo compound. (C 55.2%, N 7.4%; atomic ratio: 26.2:3)

EXAMPLE 13

4.84 parts by weight of 3-methoxy-diphenylamine-4-diazonium sulfate (Diazo 2, sulfate, Table 1) and 3.0 parts by weight of sebacic acid diamide (Component B, No. 27, Table 1) are dissolved in 30 parts by volume of 90% methane sulfonic acid. 0.9 part by weight of paraformaldehyde is then added and the mass is condensed for 45 hours at room temperature. The crude condensate is dissolved in 300 parts by volume of water, the solution is filtered over 1 part by weight of active charcoal, and the condensate is precipitated from the filtrate by the addition of 30 parts by volume of 50% zinc chloride solution. For purification, the separated precipitate is again dissolved in 500 parts by volume of water and precipitated again in the same manner. Yield: 5.9 parts by weight. From the analysis, it can be assumed that a second component is incorporated, but it appears that the carbonamide groups have been saponified to a certain degree. (C 39.3%, N 8.2%, ND 4.02%; atomic ratio: 23.8:4.07:2)

EXAMPLE 14

17.75 parts by weight of 4-methoxy-diphenylamine-4'-diazonium sulfate (91%) (Diazo 3, sulfate, Table 1) are dissolved in 150 parts by volume of 86 percent phosphoric acid. 11.2 parts by weight of dimethylol terephthalic acid diamide (Component $B_1$, No. 30, Table 1) are introduced in the form of a fine powder into the solution, with vigorous stirring, and condensation is effected for 21 hours at room temperature. The crude condensate is dissolved in 1,000 parts by volume of water at 40°C and the condensation product is then precipitated from the solution by adding 200 parts by volume of 50% zinc chloride solution. The double salt is separated, dissolved in 500 parts by volume of water at 50°C., and reprecipitated by adding zinc chloride. Yield: 26.8 parts by weight. (C 46.6%, N 11.5%) According to analysis, the product contains the elements N and C in a proportion of 5:23.6.

EXAMPLE 15

6.5 parts by weight of 3-methoxy-diphenylamine-4-diazonium phosphate (Diazo 2, phosphate, Table 1) are dissolved in 60 parts by volume of 86.7% phosphoric acid at 40°C. The solution is cooled down to room temperature and a solution of 3.4 parts by weight of 2,6-dimethylol-4-methylphenol (Component $B_1$, No. 31, Table 1) in 7 parts by volume of N-methylpyrrolidone is rapidly added, while stirring. The mixture is cooled to such an extent that the temperature of the mixture does not exceed 50°C. The mixture is then condensed for 2 hours at 40°C. A crude condensate soluble in water without any residue is obtained. For precipitating the condensation product, the crude condensation mixture is stirred into 1,000 parts by volume of isopropanol, the precipitate is filtered with suction, washed twice with 200 parts by volume of isopropanol, and dried. Yield: 7.5 parts by weight. The acid phosphate of a condensate is obtained which, according to analysis, has an excess content of about 9 carbon atoms per diazo group, as compared to the uncondensed diazo compound. About 1 mole of the second component is thus condensed per mole of diazo compound. (C 47.3%, N 7.6%, ND 5.1%, P 9.4%; atomic ratio: 21.7:3:2:1.67)

EXAMPLE 16

32.3 parts by weight of 3-methoxy-diphenylamine-4-diazonium sulfate (Diazo 2, sulfate, Table 1) are dissolved in 100 parts by volume of 86% phosphoric acid. 19.4 parts by weight of bis(hydroxymethyl)-durene (Component $B_1$, No. 33, Table 1) are added, with stirring, in small portions at room temperature and condensation is performed for 25 hours at room temperature.

The crude condensate is dissolved in 1,000 parts by volume of water, a somewhat turbid solution being obtained, which is clarified by pressure filtration. The chloride of the condensation product is precipitated by heating the filtrate to 70°C. and adding 220 parts by volume of hydrochloric acid (36hydrochloric acid diluted with the same volume of water). For purification, precipitation is repeated in the same manner. Yield: 33.8 parts by weight. According to analysis, the condensation product has an excess content of about 13 carbon atoms per diazo group, as compared to the uncondensed diazo compound. This corresponds to a ratio of about 1.1 moles of second component per mole of diazo compound. (C 65.0%, N 8.7%, Cl 9.2%; atomic ratio: 26.1:3:1.25)

EXAMPLE 17

17.8 parts by weight of 3-methoxy-diphenylamine-4-diazonium sulfate (Diazo 2, sulfate, Table 1) are dissolved in 55 parts by volume of 86% phosphoric acid. 10 parts by weight of finely powdered 4-methyl-2,6-bis-(hydroxymethyl)-anisole (Component $B_1$, No. 32, Table 1) are then slowly added with stirring. Stirring is continued for 5 hours at room temperature for 8.5 hours at 40°C., and the mass is then left standing for 30 hours at room temperature. The condensation mixture is disolved in 300 parts by volume of water (clear solution) and the condensate is precipitated with stirring at +5°C. with 150 parts by volume of saturated common salt solution. The precipitate is separated and reprecipitated in the same manner. 18.7 parts by weight of a sticky condensation product are obtained which, according to analysis, has an excess content of 11.2 carbon atoms per diazo group, as compared with the uncondensed diazo compound. This corresponds to a ratio of about 1.1 moles of second component per mole of diazo compound. (C 60.3%, N 8.7%, Cl 10.2%; atomic ratio: 24.2:3:1.38)

EXAMPLE 18

15.42 parts by weight of diphenylamine-4-diazonium sulfate (95%) (Diazo 1, sulfate, Table 1) are dissolved in 100 parts by volume of methane sulfonic acid (90%). 6.8 parts by weight of finely powdered 1,5-bis-(acetoxymethyl)-naphthalene (Component $B_1$, No. 37, Table 1) are then added while stirring. After condensing for 1.5 hours at room temperature, the crude condensate is capable of forming a clear solution in water. 4.15 parts by weight of 1,3-dimethyl-4,6-dimethylol-benzene (Component $B_1$, No. 35, Table 1are then introduced into the mixture, with stirring, and condensation is continued for another 45 minutes at room temperature. The crude condensate is dissolved in 500 parts by volume of water (clear solution). The condensation product is precipitated at +10°C. by the addition of 200 parts by volume of hydrochloric acid (36.5% acid diluted with the same volume of water). For purification, the product is dissolved in water and again precipitated, as the chloride, by the addition of hydrochloric acid. Yield: 14.5parts by weight.

According to analysis, the condensation product has an excess content of 10.7 carbon atoms per diazo group, as compared to the uncondensed diazo compound. (C 67.2%, N 10.4%; atomic ratio: 22.6:3)

EXAMPLE 19

32.4 parts by weight of 3-methoxy-diphenylamine-4-diazonium sulfate (Diazo 2, sulfate, Table 1) are dissolved in 320 parts by volume of 86% phosphoric acid. At an initial internal temperature of 25°C., 44.5 parts by weight of 1,3-diisopropyl-4,6-dimethylol-benzene (Component $B_1$, No. 36, Table 1) in a very finely powdered form are introduced, with stirring. Stirring is continued for 1 hour without heating and condensation is then performed for 20 hours at +40°C. A crude condensate is obtained which forms a clear solution in water.

The condensation product is precipitated from the aqueous solution of the crude condensate by means of hydrochloric acid, again dissolved in water for purification, and reprecipitated with hydrochloric acid. Yield: 64 parts by weight. (C 68.2%, N 5.1%; atomic ratio: 46.8:3) It can be assumed, from the result of analysis, that about 2.4 moles of second component are incorporated per mole of diazo compound.

EXAMPLE 20

At room temperature and while stirring, 2.8 parts by weight of bis-(acetoxymethyl)-durene (Component $B_1$, No. 34, Table 1) are cautiously added to a solution of 3.4 parts by weight of 2′-carboxydiphenylamine-4-diazonium phosphate (Diazo 4, phosphate, Table 1) in 20 parts by volume of 90 percent methane sulfonic acid, and stirring is continued for 24 hours at room temperature. In order to isolate the reaction product, the clear condensation mixture is stirred into 250 parts by volume of water. The precipitate is drawn off by suction, washed with 250 parts by volume of water, again dissolved at 50°C, and reprecipitated by adding 50 parts by volume of 18% hydrochloric acid. Filtration of the precipitate is improved by heating the suspension briefly to 80°C. and again cooling. The product is drawn off by suction, washed with 1 N hydrochloric acid, and dried at 35°C. The yield is 3.7 parts by weight. (C 64.0%, N 8.5%; atomic ratio: 26.3:3) According to analysis, the mixed condensate contains about 1.1 moles of the second component per mole of diazo compound.

EXAMPLE 21

33.2 parts by weight of 3-methoxy-diphenylamine-4-diazonium sulfate (Diazo 2, sulfate, Table 1) (97.5%) are dissolved in 100 parts by volume of 86% phosphoric acid. During 15 minutes, 25.9 parts by weight of methoxymethyl-diphenyloxide (for composition, see below) (Component $B_1$, No. 39, Table 1) are added dropwise, while stirring. A clear crude condensate is obtained which is stirred for another 1.5 hours at room temperature and then for 6 hours at 40°C. The condensate is dissolved in 500 parts by volume of water and the solution is cleared of a slight turbidity by filtration. The condensation product is precipitated by means of hydrochloric acid. Common salt also may be used for precipitation. If a product is to be obtained which is substantially free from phosphoric acid, it is advisable to reprecipitate the product in the same manner. Yield: 37.6 parts by weight. According to analysis, the condensation product has a content of 16 more carbon atoms per diazo molecule than does the uncondensed diazo compound. (C 61.7%, N 7.4%, Cl 9.3%; atomic ratio: 29.2:3:1.5)

The methoxymethyl-diphenyloxide used has the following composition:

| | |
|---|---|
| diphenylether | 1.3% |
| mono-o-(methoxymethyl)-diphenylether | 2.2% |
| mono-p-(methoxymethyl)-diphenylether | 11.8% |
| unknown similar monomethoxymethyl component | 3.9% |
| o,p′-di-(methoxymethyl)-diphenylether | 21.9% |

| | |
|---|---|
| p,p'-di-(methoxymethyl)-diphenylether | 47.3% |
| tri-(methoxymethyl)-diphenylether | 1.3% |
| tetra-(methoxymethyl)-diphenylether | 9.5% |

When introducing methoxymethyl-diphenyloxide into the acid in the absence of a diazo compound, it initially dissolves, with vigorous stirring. After a few seconds to a few minutes, a condensate precipitates which is insoluble in the acid and in boiling water.

A mixed condensate yielding exposure products having the same oleophilic properties is obtained by replacing the sulfate of Diazo 2 by an equimolecular quantity of the sulfate of Diazo 1, in an otherwise identical process. However, the mixed condensate containing the Diazo 2 yields reproduction layers of better storability.

EXAMPLE 22

4.65 parts by weight of diphenylamine-4-diazonium sulfate (Diazo 1, sulfate, Table 1) (95%) are dissolved in 600 parts by volume of 86% phosphoric acid. Then 4.65 parts by weight of 1,4-bis-(α-hydroxybenzyl)-benzene (Component $B_1$, No. 45, Table 1) are dissolved in 30 parts by volume of glacial acetic acid which is sufficiently heated to cause solution. The hot acetic acid solution is then poured into the diazo solution while agitating vigorously. Condensation is effected at room temperature over a period of 21 hours. The condensation mixture is then dissolved in 2,000 parts by volume of water, filtered until clear, and precipitated by adding 300 parts by volume of concentrated hydrochloric acid. The precipitate is separated, dissolved at 60°C. in 500 parts by volume of water, filtered, and precipitated by adding 50 parts by volume of 6 N hydrochloric acid solution in water. The product which precipitates is reprecipitated once more in the same manner. 4.8 parts by weight of the chloride of the condensation product are thus obtained. According to analysis, the proportion of C:N:Cl is 26.6:3:1.05. This corresponds to a ratio of about 0.73 mole of the second component per mole of diazo compound. (C 69.2%, N 9.1%, Cl 8.1%)

EXAMPLE 23

30.84 parts by weight of diphenylamine-4-diazonium sulfate (95%) (Diazo 1, sulfate, Table 1) are dissolved in 1,000 parts by volume of 86% phosphoric acid. During 1 hour, a solution of 18.4 parts by weight of benzhydrol (Component $B_1$, No. 44, Table 1) in 200 parts by volume of glacial acetic acid is then added dropwise, while stirring. Condensation is performed for 24 hours at room temperature. A clear crude condensate which dissolves in water without residue is obtained. Half of the crude condensate is introduced into 2,500 parts by volume of water heated to 40°C. The condensation product initially forms a clear solution and crystallizes in the form of small flakes upon cooling. Yield: 21.9 parts by weight. (C 56.6%, N 8.1%, P 8.9%; atomic ratio: 24.5:3:1.5).

According to analysis, the condensation product has a content of 12.5 more carbon atoms pr diazo group than does the uncondensed compound. This corresponds to a ratio of about 1 mole of second component per mole of diazo compound.

The other half of the crude condensate is mixed with 1.5 parts by weight of paraformaldehyde and condensed for 20 hours at room temperature. The crude condensate is dissolved in 2,000 parts by volume of water and cleared of a slight turbidity by filtration. It can be separated in known manner in the form of the zinc chloride double salt. Yield: 22.9 parts by weight. (C 59.9%, N 8.5%; atomic ratio: 24.6:3)

EXAMPLE 24

For the preparation of the crude condensate, 11 parts by weight of 3-methoxy-diphenylamine-4-diazonium sulfate (Diazo 2, sulfate, Table 1) are introduced into 39.9 parts by weight of 86% phosphoric acid and the mixture is cooled to room temperature. Then, 5.17 parts by weight of a mixture of methoxymethylated diphenylethers of the composition given in Example 21 (Component $B_1$, No. 39, Table 1) are introduced dropwise, and the mixture is stirred for one hour.

Then, the mixture is heated to 40°C., a mixture of 22.1 parts by weight of the same diazo compound with 2.4 parts by weight of parafomaldehyde is added, and condensation is performed for 24 hours at 40°C. The crude condensate is used directly for the preparation of the coating composition.

EXAMPLE 25

For the preparation of the diazo condensation product, 81 parts by weight of Diazo 2, sulfate (Table 1) are dissolved in 500 parts by volume of 85% phosphoric acid, 61 parts by weight of 1,3-diisopropyl-4,6-dimethylol-benzene (Component $B_1$, No. 36, Table 1) are introduced during 15 minutes, and the mass is condensed for 39 hours at 40°C. The condensation mixture, which forms a clear solution in water, is then dissolved in 2,500 parts by volume of water and reprecipitated by adding 500 parts by volume of 18% aqueous hydrochloric acid solution. After suction filtration and washing with 0.5 N hydrochloric acid, the product is dried with air. Yield: 113 parts by weight of the chloride of the condensation product. (C 66.2%, N 8.8%; atomic ratio: 26.3:3) From the result of analysis, the condensate contains about 1 mole of second component per mole of diazo compound.

EXAMPLE 26

Diazo resin in the form of the zinc chloride double salt, is obtained by condensing equimolecular quantities of Diazo 1, sulfate (Table 1) and formaldehyde in 80% sulfuric acid, analogously to the process described in U.S. Pat. No. 2,063,631.

EXAMPLE 27

4.84 parts by weight of 3-methoxy-diphenylamine-4-diazonium phosphate (Diazo 2, phosphate, Table 1) and 4.4 parts by weight of diphenylamine-4-diazonium phosphate (Diazo 1, phosphate, Table 1) are dissolved in 300 parts by volume of 86% phosphoric acid. 6 parts by weight of 2,5-bis-(ethoxy-methyl)-thiophene (Component $B_1$, No. 42, Table 1) are then added dropwise with vigorous stirring. The mixture becomes reddish but remains clear. Condensation is performed for 2.5 hours at room temperature. The crude condensate forms a clear solution in water.

For precipitating the reaction product, the mixture is introduced into thoroughly stirred isopropanol at about 65°C. and cooled down to room temperature. The precipitate is filtered by suction, thoroughly washed with isopropanol and dried. Yield: 10.9 parts by weight. According to analysis, the condensation product, in the form of an acid phosphate, contains the components 3-methoxy-4-diazo-diphenylamine, 4-diazo-diphenylamine, and thiophene in a ratio of 0.7 to 0.3 to 2. (C 46.9%, N 6.7%, S 10.1%, $OCH_3$ 3.1%; atomic ratio: 24.6:3:1.98:0.73)

When introducing the 2,5-bis-(ethoxymethyl)-thiophene into phosphoric acid in the absence of the diazo compound, a homocondensate of this compound is immediately formed which is practically insoluble in acid and in water.

EXAMPLE 28

3.6 parts by weight of 2,5-dimethoxy-4-phenoxy-benzene diazonium chloride (Diazo 7, Table 1) in the form of the double salt with 0.5 mole of zinc chloride (containing NaCl, N = 7.7%) are dissolved in 60 parts by volume of 93 percent phosphoric acid. Dry air is passed through the solution until no further hydrogen chloride escapes. 2.7 parts by weight of 1,3-diisopropyl-4,6-di-(methoxymethyl)-benzene (Component $B_1$, No. 46, Table 1) are then added and the mass is condensed for 1 hour at room temperature and for 2 hours at 40°C. The condensation mixture is dissolved in water where it forms a clear solution, the condensate is precipitated with zinc chloride, separated, and dried. Yield: 2.9 parts by weight. (C 57.6%, N 4.4%; atomic ratio: 30.6:2) Analysis shows that the mixed condensate contains about 1.2 moles of the second component per mole of diazonium compound.

EXAMPLE 29

3.6 parts by weight of the diazonium salt used as the starting material in Example 28 (Diazo 7, zinc chloride double salt, Table 1) are dissolved in 60 parts by volume of 90% methane sulfonic acid and dry air is passed through the solution until no further hydrogen chloride escapes.

Then, 2.7 parts by weight of 1,3-diisopropyl-4,6-bis-(methoxymethyl)-benzene (Component $B_1$, No. 46, Table 1) are introduced and the mass is condensed for one hour at room temperature and for 2 hours at 40°C.

The mixture is introduced into water and freed from undissolved components by the addition of charcoal, followed by suction filtration.

The condensation product is precipitated from the filtrate in the form of the zinc chloride double salt. Yield: 5.8 parts by weight. (C 41.0%, N 2.7%; atomic ratio: 35.3:2) This corresponds to a content of approximately 1.5 moles of the second component per mole of diazo compound.

EXAMPLE 30

1.75 parts by weight of 4-(2,5-diethoxy-benzoylamino)-2,5-diethoxy-benzene diazonium chloride (Diazo 8, Table 1), in the form of the zinc chloride double salt (N = 4.8%), are dissolved in 10 parts by volume of 90% methane sulfonic acid, and dry air is passed through the mixture until no further hydrogen chloride escapes. Then 0.14 part by weight of 1,4-bis-hydroxymethyl-benzene (Component $B_1$, No. 38, Table 1) is added. After condensing for 4 hours at room temperature, the mixture is diluted with water, filtered, and the condensate is precipitated from the filtrate by means of a zinc chloride solution. Yield: 2.2 parts by weight. (C 25.2%, N 3.6%; atomic ratio: 24.5:3)

EXAMPLE 31

0.78 part by weight of 3-methoxy-diphenylene-oxide-2-diazonium chloride, in the form of the double salt with 0.5 mole of zinc chloride (N = 7.2%) (Diazo 9, Table 1) is dissolved in 10 parts by volume of 90% methane sulfonic acid, and dry air is passed through the mixture until no further hydrogen chloride escapes. Then, 0.14 part by weight of 1,4-dimethylol-benzene (Component $B_1$, No. 38, Table 1) is added, and condensation is effected for 4 hours at room temperature. The condensation product is precipitated by means of zinc chloride. Yield: 1.4 parts by weight. (C 22.4%, N 2.9%; atomic ratio: 18:2) From analysis, it can be assumed that about 0.6 mole of the second component are incorporated per mole of diazo compound.

EXAMPLE 32

16.2 parts by weight of 3-methoxy-diphenylamine-4-diazonium sulfate (Diazo 2, sulfate, Table 1) are dissolved in 100 parts by volume of 93% phosphoric acid. 8.6 parts by weight of p-toluene-sulfonic acid amide (Component $B_1$, No. 25, Table 1) and 22.5 parts by weight of a 40% aqueous formaldehyde solution are mixed separately, and the mixture is briefly boiled. A tough condensation product precipitates. After heating for 10 minutes on a steam bath, the mass is cooled and the solution over the resin is removed. The resin is washed by kneading it with 10 parts by volume of water. After removal of the wash water, the resin is dissolved in 8 parts by volume of hot methanol and the turbid mixture thus obtained is poured into the diazo solution while vigorously stirring. After condensing for 2.5 hours at 40°C. and leaving the mixture standing for 15 hours at room temperature, a solution is obtained in which a moderate quantity of an undissolved white substance is suspended. By drawing it off through a plastic filter, a clear condensate is obtained which forms a clear solution in water. The filtrate is dissolved in 250 parts by volume of water, and the condensation product is precipitated in the form of a tough mass by adding 210 parts by volume of a saturated aqueous common salt solution. The mass is purified by reprecipitating it again in the same manner, and is then dried over phosphorus pentoxide, under reduced pressure, to yield a triturable, solid product. Yield: 7.6 parts by weight. (C 52.2%, N 11.5%, S 4.5%; atomic ratio: 21.2:4:0.685)

From the result of analysis, it can be assumed that units of the diazo compound and of the second component are present in the condensate in a ratio of about 1 : 0.7.

EXAMPLE 33

A condensation product is produced from 3-methoxy-diphenylamine-4-diazoniumchloride and formaldehyde as described in Example 1 of US Patent No. 3,406,159 and separated in the form of an acid phosphate which still contains some phosphoric acid (N 9.3%, atomic ratio C:N:P P = 14:3:2.3)

The product has an average degree of condensation of about 3 units of methoxydiphenylamine diazonium salt per molecule, as determined for the diazo amino compound with diisobutylamine in benzene by the cryoscopic method for determining molecular weight.

10 parts by weight of the diazo condensation product are dissolved in 85 parts by weight of 85% phosphoric acid. 5.7 parts by weight of 4,4'-bis-methoxymethyl-diphenylether (Component $B_1$, No. 41, Table 1) are added dropwise, during 10 minutes, and the mixture is then condensed for 20 hours without additional heating. The clear condensation mixture, which forms a clear solution in water, is diluted with 100 parts by volume of water and then 330 parts by volume of a saturated aqueous solution of common salt are added. The precipitate thus formed is purified by dissolving it again in water, reprecipitating it with a common salt solution, and the precipitated product is then dried. Yield: 8.1 parts by weight. (C 48.3%, N 4.3%; atomic ratio: 39.4:3)

According to analysis, the diazo homocondensate and the second component are present in the mixed condensate in a molar proportion of about 1:5.4.

EXAMPLE 34

5 parts by weight of 4-p-tolylmercapto-2,5-dimethoxy-benzene diazonium chloride, in the form of the zinc chloride double salt (N 6.9%) (Diazo 6, Table 1) are dissolved in 40 parts by volume of 80 percent sulfuric acid and dry air is passed through the solution until no further hydrogen chloride escapes.

0.88 part by weight of 1,4-bis-(hydroxymethyl)-benzene (Component $B_1$, No. 38, Table 1) is added to the solution in portions, the solution is stirred for 1 hour at room temperature, and is then allowed to stand overnight. Thereafter, it is poured into 300 parts by volume of water, 2 parts by weight of charcoal are added to remove a slight turbidity, and the solution is then drawn off by suction. From the clear filtrate, the condensation product is precipitated by adding zinc chloride and common salt. Yield: 5.4 parts by weight, air-dried. (C 31.0%, N 3.5%; atomic ratio: 20.6:2) The condensate contains about 0.7 mole of the second component per mole of diazo compound.

EXAMPLE 35

32.3 parts by weight of 3-methoxy-diphenylamine-4-diazonium sulfate (Diazo 2, sulfate, Table 1) are dissolved in 265 parts by weight of 93% phosphoric acid. 25.8 parts by weight of 4,4'-bis-(methoxymethyl)-diphenylether (Component $B_1$, No. 41, Table 1) are added dropwise to the solution and condensation is effected for 2 hours at 40°C. 16 parts by weight of paraformaldehyde are added to the mixture, which yields a clear solution in water, condensation is continued for 6 hours at 40°C., and the mixture is then allowed to stand overnight. The mixture, which dissolves in water without leaving a residue, is then dissolved in water and a saturated common salt solution is added. The voluminous precipitate which forms is maintained at 40°C. for 1 hour, then drawn off by suction as much as possible, and the contents of the suction filter, i.e. a green paste, are then dried over phosphorus pentoxide, whereupon the product turns into a tough, green mass which smells strongly of formaldehyde. Yield: 175 parts by weight. (C 16.4%, N 1.9%, S 0.45%, P 13.7%; atomic ratio: C:N:P = 30.2:3:9.7) As compared with the uncondensed diazo compound, the condensate has a content of approximately 17 more C atoms.

EXAMPLES 36 to 43

Examples 36 to 43 show that, with the use of the new condensation products also in the presence of phosphoric acid, reproduction layers are obtained which are substantially less sensitive to fingerprints during handling than are reproduction layers produced in the same manner but with the use of the known formaldehyde condensates of the diazo compounds alone (same anion and same addition of phosphoric acid).

The coating solutions given in Table 3 are applied to an aluminum support which has been roughened with metal wire brushes and pretreated with polyvinyl phosphonic acid according to U.S. Pat. No. 3,220,832. The coating is then dried with hot air.

The decrease of the sensitivity to moisture of the material, which becomes noticeable in the sensitivity to fingerprints, naturally involves a decrease in the developability of the reproduction layer with water. Aqueous solutions of salts, which preferably additionally contain wetting agents or small additions of organic solvents, generally are suitable for development, however.

The developers used in the individual examples are given in the last column of Table 3, which contains the details of the examples.

| | |
|---|---|
| Developer I means: | 100 parts by volume of water<br>5 parts by weight of sodium lauryl sulfate (50%) (residue sodium sulfate) and<br>3 parts by weight of tartaric acid |
| Developer II means: | Developer I to which 2 parts by weight of benzyl alcohol are added. |

The production of the copy shows that the reproduction layers obtained with the use of the new condensation products are up to four times as light-sensitive as are the reproduction layers obtained with the use of the known formaldehyde condensates of the same diazo compounds. The image areas accept printing inks very well.

Table 3

| Ex. | Mixed Condensate (MC) | | | | | Coating Solution | | | Developer |
|---|---|---|---|---|---|---|---|---|---|
| | Diazo Compound $A(D)_n$ | Component B or $B_1$ | $CH_2O$ | Separated in the form of: | Proportion of A(D) to B or $B_1$ in MC (approx.) | % MC | Other Additives | Solvent | |
| 36 | — | as in Ex. 16 | — — | — — | — — | 0.5 per diazo group | 2 molecules of $H_3PO_4$ | EGMME | I |
| 37 | — | as in Ex. 17 | — | — | — | 0.5 | do. | do. | $H_2O$ |
| 38 | — | as in Ex. 18 | — | — | — | 0.4 | do. | do. | I |

Table 3 – Continued

| Ex. | Diazo Compound A(D)ₙ | Mixed Condensate (MC) Component B or B₁ | CH₂O | Separated in the form of: | Proportion of A(D) to B or B₁ in MC (approx.) | Coating Solution % MC | Other Additives | Solvent | Developer |
|---|---|---|---|---|---|---|---|---|---|
| 39 | — | as in Ex. 19 | — | — | — | 0.8 | do. | do. | II |
| 40 | — | as in Ex. 20 | — | — | — | 0.5 | do. | do. | I |
| 41 | — | as in Ex. 22 | — | — | — | 0.46 | do. | do. | I |
| 42 | Diazo 1, $H_2PO_4^-$ | — 43 | — | $H_2PO_4^-$. $H_3PO_4$ | 1:1.52 | 0.8 | 1 molecule of HCl per diazo group | EGMME/ $H_2O$ 96:4 p.b.v. | II |
| 43 | — | as in Ex. 8 | — | — | — | 0.47 | 2 molecules of $H_3PO_4$ per diazo group | EGMME | II |

p.b.v. = parts by volume
EGMME = ethyleneglycol monomethyl ether

TO EXAMPLE 42

4.4 parts by weight of diphenylamine-4-diazonium phosphate (Diazo 1, phosphate, Table 1) are dissolved in 300 parts by volume of 96.5% phosphoric acid. A boiling solution of 4.0 parts by weight of 9,10-bis-methoxymethyl-anthracene (Component $B_1$, No. 43, Table 1) in 30 parts by volume of glacial acetic acid is poured into the solution, with thorough stirring. Condensation is performed for 1.5 hours without further heating. The crude condensate is soluble in water without any residue. In order to isolate the condensation product, the condensation mixture is diluted with 150 parts by volume of methanol and the solution is poured, with stirring, into 2,000 parts by volume of isopropanol at about 65°C. The precipitate is filtered off with suction, washed with isopropanol, and dried. Yield: 5.4 parts by weight. According to analysis, the condensate has a content of 24.4 more carbon atoms per molecule of diazo compound than does the uncondensed diazo compound; this corresponds to about 1.5 moles of second component per mole of diazo compound. (C 52.9%, N 5.1%, P 11.3%; atomic ratio: 36.4:3:3)

The examples below show the wide use of the new condensation products on various support materials and in various reprographic processes.

In addition to the advantages of the improved oleophilic properties of the exposure products and the improved light-sensitivity, which also repeatedly occur in the following examples, these examples show further advantages of individual groups of mixed condensates.

EXAMPLE 44

An electrolytically roughened aluminum foil is coated by swabbing with a 2 % by weight aqueous solution of the chloride of a condensation product prepared from Diazo compound 2 and Component $B_1$ No. 40, Table I. After image-wise exposure to light through a negative, the foil is developed by wiping it over with 1.5 percent aqueous phosphoric acid and inked up with greasy ink. An efficient printing forme is obtained.

A favorable result also is obtained by coating the same support with a 2 percent solution of the acid phosphate of the condensation product described in Example 2 in water, to which 4 percent of n-butanol have been added. In this case, development is performed with water.

A similarly efficient printing forme is analogously obtained by applying the first solution to a mechanically grained aluminum foil, which has been pretreated in known manner with an alkali silicate.

Instead of using the chloride of the condensation product, it also is possible to use the corresponding zinc chloride double salt or cadmium chloride double salt. Developer II is suitable for development.

The condensation product is prepared in the following manner:

30.2 parts by weight of 3-methoxy-diphenylamine-4-diazonium-sulfate (Diazo 2, sulfate, Table I) are dissolved in 93.5 parts by volume of 86 % phosphoric acid. 29.3 parts by weight of finely pulverized 4,4-bis-acetoxymethyl-diphenylether (Component $B_1$ No. 40, Table I) are then added with vigorous stirring, the mixture is stirred for another 1.5 hours without heating and finally condensed for 3.5 hours at 40°C. The clear condensation mixture is dissolved in 500 parts by volume of water (clear solution) and the chloride of the condensation product is precipitated at 40°C by dropwise adding 220 parts by volume of hydrochloric acid (36 % HCl diluted with the same volume of water). For purification, the precipitate is dissolved in warm water and the chloride is again precipitated by the addition of hydrochloric acid. Drying is performed at 30°C by circulating air in a drying chamber. Yield: 38.7 parts by weight. (C 65.7 %, N 8.1 %, Cl 8.6 %; atomic ratio 28.5 : 3 : 1.26)

EXAMPLE 45

An aluminum foil roughened by means of metal brushes and pretreated with polyvinyl phosphonic acid according to U.S. Pat. No. 3,220,832 is coated with the following coating solutions, and the layer is dried:

| | 1 | 2 | 3 | 4 | 5 | 6 |
|---|---|---|---|---|---|---|
| diazo-formaldehyde condensate (parts by weight)*) | 0.4 | — | — | — | 0.04 | 0.13 |
| mixed condensate (parts by weight)**) | — | 0.34 | 0.34 | 0.34 | 0.31 | 0.23 |
| phosphoric acid, moles per mole diazo groups | 2.8 | 0 | 0.5 | 2.8 | 0.5 | 2.8 |

*) formaldehyde condensate from Diazo compound 2, chloride, (Table I) in 2.8 moles of phosphoric acid, by analogy to Example 1 of U.S. Pat. No. 3,406,159
**) The mixed condensate (chloride) is the same as in Example 44.

In each case solution is effected in 100 parts by volume of ethylene glycol monomethyl ether / butyl acetate (8 : 2 parts by volume).

Upon exposure to a three-phase carbon arc lamp of 2.4 kw under a negative original and a 21-step grey wedge with density increments of 0.15, the same quantity of hardened wedge steps is obtained in all cases of layers (judged after development and inking up with greasy ink) when the following exposure times are employed:

| | 1 | 2 | 3 | 4 | 5 | 6 |
|---|---|---|---|---|---|---|
| Duration of exposure in relative units | 70 | 18 | 18 | 35 | 25 | 50 |

The developer in Case 1 is water, in Cases 2 to 6 Developer II (see Examples 36 to 43). For the purpose of further increasing the length of printing run, it is possible to reinforce the printing formes obtained in this manner with suitable lacquers, e.g. the products described in U.S. Pat. Nos. 3,313,233, particularly Example 1, and 2,754,279.

After storage for 8 weeks at 52°C, the presensitized materials 1, 4, and 6 still can be easily processed. The layers containing less phosphoric acid or no phosphoric acid are less storable under these conditions.

For increasing the printing run of the printing formes produced from the reproduction material, it also is possible to provide the reproduction layer with a coating of water-insoluble polymers as described, for example, in U.S. Pat. No. 3,136,637.

It also is possible to further add to such coatings dyestuffs, pigments, and diazo compounds, e.g. the compounds described in U.S. Pat. Nos. 3,180,732 and 3,175,906. A corresponding working method is described in U.S. Patent Application Ser. No. 652,024 filed July 10, 1967, now U.S. Pat. No. 3,522,042.

As a mixed condensate there also may be used a product prepared from 1 mole of 3-methoxy-diphenylamine-4-diazonium sulfate (Diazo 2, sulfate, Table I) and 1.5 moles of 4,4'-bis-methoxymethyldiphenylether (Component $B_1$ No. 41, Table 1) analogously to Example 44 and separated as the chloride. In this case, even shorter exposure times are required but the addition of more phosphoric acid is necessary for achieving layers of the same storability.

EXAMPLE 46

The aluminum support used in Example 45, precoated with polyvinylphosphonic acid, is coated with the following solution:

1.25 parts by weight of a crude condensate of 3-methoxy-diphenylamine-4-diazonium chloride and formaldehyde in phosphoric acid (molar ratio 1:1:2.8), condensation for 40 hours at 40°C,
10.0 parts by weight of the condensation product described in Example 21,
5.1 parts by weight of 85% phosphoric acid,
2,400.0 parts by weight of ethylene glycol monomethyl ether, and
580.0 parts by weight of butyl acetate.

The coating is dried for 2 minutes at 100°C.

The sensitivity of the reproduction layer to fingerprints during handling is considerably reduced, compared to a reproduction layer containing only the first-mentioned crude condensate, and the light-sensitivity of the new reproduction layer is somewhat more than twice as high as that of a layer containing only the first-mentioned crude condensate. Development of the exposed reproduction material can be effected with Developer II described in Examples 36 to 43. The printing forme then can be lacquered with the conventional lacquers, e.g. those described in the preceding example, and its run thus can be further increased.

The reproduction material produced according to this example has a very good storability. Plates stored for three years in the absence of light at room temperature (not air-conditioned) still can be processed according to the above method into printable printing formes.

EXAMPLE 47

A paper printing foil produced according to the disclosure of U.S. Pat. No. 2,778,735, is coated with the following solution, by swabbing, and dried.

Coating solution: 2 parts by weight of the mixed condensation product described in Example 25 are dissolved in 97 parts by weight of warm water. The solution is reacted with 0.53 part by weight of sodium sulfite and stirred for 1 hour. The somewhat turbid solution is directly used for coating the support.

After image-wise exposure of the reproduction material and development with water, a very satisfactorily oleophilic image is obtained which accepts greasy ink well. The image areas have better oleophilic properties than have those obtained according to the same working method using a commercial diazo resin (diphenylamine-4-diazonium sulfate condensed in 80 % sulfuric acid with formaldehyde and precipitated as the zinc chloride double salt).

EXAMPLE 48

An electrolytically roughened aluminum foil is coated with a solution of the following constituents:

2.0 parts by weight of the diazo condensate described in Example 25,
80.0 parts by volume of water,
0.284 part by weight of zinc chloride,
0.527 part by weight of sodium sulfite, and
20.0 parts by volume of dimethylformamide.

After image-wise exposure under a line negative, the foil is developed with Developer II described in Examples 36 to 43, rinsed with water, treated with 1 % aqueous phosphoric acid and inked up with greasy ink. An efficient printing forme is obtained the image areas of which have better oleophilic properties than have those of a printing forme produced in the same manner using the same derivative of a commercial diazo resin (see Example 47).

When employing the above coating solution, it also is possible to obtain offset printing forms on mechanically grained aluminum treated in known manner with aqueous alkali silicate solution, with development in the same manner.

EXAMPLE 49

A polyethylene terephthalate film roughened by sand blasting is coated with the following finely ground coating mixture and the coating is dried:

1.25 parts by weight of poly-N-vinyl-N-methylacetamide (K value 91),

| | |
|---|---|
| 0.5 | parts by weight of Heliogen Blue B powder (CI 74,160). |
| 0.1 | (part by weight of finely divided silicon dioxide (Aerosil MOX 170), |
| 0.375 | part by weight of the diazo condensate described below, |
| 18.0 | parts weight of weight,of water, and |
| 1.6 | parts by weight of ethanol. |

After image-wise exposure under a negative, a blue colored positive tanned image is obtained by rinsing with water. The diazo condensate is prepared as follows:

32.4 parts by weight of 3-methoxy-diphenylamine-4-diazonium-sulfate (Diazo 2, sulfate, Table I), are dissolved in 320 parts by volume of 85 % phosphoric acid. 16.6 parts by weight of finely pulverized and screened 1,3-dimethyl-4,6-dimethylol-benzene (Component $B_1$ No. 35, Table 1) are added, with vigorous stirring, during 10 minutes, and stirring is continued for 30 minutes at room temperature. Condensation is then performed, with stirring, for 42 hours at 40°C. The crude condensate is soluble in water without any residue.

For separating the condensation product, the condensation mixture is dissolved in 1,000 parts by volume of water, the product is precipitated by the addition of 60 parts by volume of 45 % aqueous hydrobromic acid and the precipitate is filtered off with suction.

For purification, the product is again dissolved in 1,000 parts by volume of water of 50°C and the product is again precipitated by the addition of hydrobromic acid, washed with 1 % aqueous hydrobromic acid and the filtered product is air-dried. Yield: 42 parts by weight. (C 53.1 %, N 7.8 % Br 18.6 %; atomic ratio 23.8 : 3 : 1.25) About 1.1 moles of second component are present per mole of diazo compound.

Example 50

The same support as in Example 49 is coated with the following mixture:

| | |
|---|---|
| 4.0 | parts by weight of polyvinylpyrrolidone (K value 90), |
| 1.0 | part by weight of the diazo condensate described in Example 44, |
| 0.1 | part by weight of crystal violet (CI 42,555), |
| 12.0 | parts by weight of ethanol, and |
| 88.0 | parts by weight of water. |

After image-wise exposure under a negative, a blue colored positive tanned image is obtained by rinsing with water.

EXAMPLE 51

An electrolytically roughened aluminum foil is coated with the coating solution described in Example 50.

After image-wise exposure under a positive, the layer parts not hardened by the action of light are dissolved away by means of water. After drying, the support surface bared in the image areas by development is slightly etched in the conventional manner and finally coated with the lacquer described in U.S. Pat. No. 3,374,734. A positive printing forme is obtained by inking up and removing the hardened reproduction layer by brushing with warm dilute phosphoric acid.

EXAMPLE 52

A polyethylene terephthalate film provided with a hydrophilic mat layer of finely divided silica, titanium dioxide and hardened polyvinyl alcohol is coated with a 0.4 % solution of the naphthalene-1-sulfonate of the condensation product described in Example 49. The solvent used is a mixture of 80 parts by weight of ethylene glycol monomethyl ether and 20 parts by weight of butyl acetate.

After image-wise exposure under a negative, development is performed by wiping over with Developer I or II (Examples 36 to 43) and the plate wet with the developer is inked up with greasy ink. A positive printing forme is obtained.

As the support, there also may be used a sufficiently water-resistant paper foil having a hydrophilic mat layer of baryta, kaolin, and finely divided silica in hardened polyvinyl alcohol. The coating solution used in this case, however, is a 2 % solution of the condensation product in alcohol. After image-wise exposure through a negative, a positive printing form is obtained by means of Developer I.

EXAMPLE 53

A nylon fabric conventionally used in screen printing and which has been clamped in a frame is coated by means of a doctor knife with the mixture below. The coating is dried by a cool stream of air.

| | |
|---|---|
| 90.0 | parts by weight of a polyvinyl alcohol saponified to 98%, a 4% solution of which in water at 20°C has a viscosity of 8 to 11 cp., |
| 423.0 | parts by weight of water, |
| 15.0 | parts by weight of finely divided silica (Aerosil MOX 170), |
| 30.0 | parts by weight of dibutylphthalate, |
| 7.5 | parts by weight of the condensate described in Example 44, |
| and 1 0.5 | part by weight of crystal violet (CI 42,555). |

The screen is exposed for 6 minutes to a xenon impulse lamp of 5 kw at a distance of 1 m. A screen printing forme is obtained by rinsing with cold water.

EXAMPLE 54

A zinc plate (2 mm thick) slightly etched superficially by treating it with dilute nitric acid is coated on a plate whirler (80 revolutions per minute) with the coating solution below. The coating is preliminarily dired and then further dried for 2 minutes at 100°C.

Coating solution:

| | |
|---|---|
| 3.0 | parts by weight of the condensate described in Example 44, |
| 10.0 | parts by weight of a phenol-formaldehyde resin of the novolak type, melting range 75 to 83°C (Alnovol 320 K), |
| 60.0 | parts by weight of ethylene glycol monomethyl ether, and |
| 40.0 | parts by weight of dimethyl formamide. |

After storage for three days at room temperature, the reproduction material is exposed for 6 minutes under a line positive to a tube exposure device (Printaphot) containing 6 superactinic luminescent tubes (Philips Type TLA 20 W/05) which are mounted at a distance of 7 cm from the reproduction material. Development is performed with a 2 percent by weight aqueous trisodiumphosphate solution to which 5 percent by volume of ethylene glycol monomethyl ether had been added.

The copied plate is heated for 15 minutes to 180°C and then etched with 5 % by weight nitric acid. A positive relief printing forme is obtained.

EXAMPLE 55

A plastic film laminated to a thin copper foil is cleaned on the copper surface with an abrasive, rinsed with acetone, then coated with the solution described in Example 54, and the coating is dried. The plate is exposed under a positive representing a circuit diagram and developed in the manner described in Example 54. A copied circuit (positive) is obtained by etching away the copper in the bared areas by means of 40 % aqueous ferric chloride solution.

Example 56

An aluminum foil roughened by metal brushes and precoated with polyvinylphosphonic acid according to U.S. Pat. No. 3,220,832 is coated with the following coating solution and the coating is dried.

| | |
|---|---|
| 0.4 | part by weight of the condensation product described below, |
| 80.0 | parts by weight of ethylene glycol monomethyl ether, and |
| 20.0 | parts by weight of butyl acetate. |

Development of the material, image-wise exposed under a negative, for obtaining a positive printing forme is performed as in Example 45.

For the preparation of the condensation product, 12.9 parts by weight of 4,4'-bis-methoxymethyl-diphenylether (Component $B_1$ No. 41, Table 1 are added, with thorough stirring, to a solution of 3.23 parts by weight of 3-methoxy-diphenylamine-4-diazoniumsulfate (Diazo 2, sulfate, Table 1 in 12 parts by weight of 86 % phosphoric acid and condensation is performed for 24 hours at 40°C. The clear crude condensate is introduced into 100 parts by volume of 2N hydrochloric acid, a viscous tacky mass separating thereby. After decanting the aqueous mother liquor, this mass is kneaded with another 100 parts by volume of 2N hydrochloric acid and the aqueous phase is decanted again.

After drying under reduced pressure, the somewhat tacky condensate is used for coating. (C 64.6 %, N 3.4 %; atomic ratio 66.5 : 3)

Example 57

Aluminum supports which have been electrolytically roughened and then anodized as well as pretreated with polyvinylphosphonic acid according to U.S. Pat. No. 3,220,832 are each coated with one of the following coating solutions and the coating is dried.

| | (a) p.b.w. | (b) p.b.w. | (c) p.b.w. | (d) p.b.w. |
|---|---|---|---|---|
| Mixed condensate (see below) | 1.1 | 1.1 | 1.1 | 1.1 |
| Diazo condensate according to U.S. Pat. No. 3,406,159, Example 1, adjusted to 2.8 molecules of phosphoric acid per diazo group | 0.6 | 0.6 | 0.6 | 0.6 |
| p-toluenesulfonic acid $.H_2O$ | 0.2 | 0.2 | 0.2 | 0.2 |
| Resin 1 | 3.0 | — | — | — |
| Resin 2 | — | 3.0 | — | — |
| Resin 3 | — | — | 0.1 | — |
| Resin 4 | — | — | 0.1 | — |
| Resin 5 | — | — | — | 3.0 |
| Ethylene glycol monomethyl ether / butyl acetate 8 : 2 (parts by volume) | 100 | 100 | 100 | 100 |

The mixed condensate is obtained as follows:

32.3 parts by weight of 3-methoxy-diphenylamine-4-diazonium-sulfate (Diazo 2, sulfate, Table 1) are dissolved in 170 parts by weight of 85 % phosphoric acid, 25.8 parts by weight of 4,4'-bis-methoxymethyl-diphenylether (Component $B_1$ No. 41, Table 1) are added dropwise and condensation is performed for 5 hours at 40°C. After dilution with 250 parts by volume of water, the chloride of the condensation product is precipitated by the addition of 220 parts by volume of semi-concentrated hydrochloric acid. The chloride of the condensate is again dissolved in water and the mesitylenesulfonate of the diazo compound is obtained, with the sodium salt of mesitylenesulfonic acid, as a precipitate sparingly soluble in water. Yield: 53 parts by weight (C 67.2 %, N 6.3 %, S 4.6 %; atomic ratio 37.3 : 3 : 0.96)

The condensation product has a homologous polymeric structure. A mixed condensate prepared in practically the same manner (condensation and working-up conditions are described below) is converted by means of 1-phenyl-3-methyl-5-pyrazolone into the azo dyestuff of which the mean molecular weight is determined. This dyestuff furthermore is fractioned and the mean molecular weights of the individual fractions are determined.

| *Preparation of the mixed condensate: | |
|---|---|
| 3-methoxy-diphenylamine-4-diazoniumsulfate | 32.3 p.b.w. |
| 86 % phosphoric acid | 170.0 p.b.w. |
| 4,4'-bis-methoxymethyl-diphenylether (98 to 99 %) | 25.8 p.b.w. |
| Duration of condensation | 4.5 hrs. at 40°C |
| Separation as the chloride | twice with hydrochloric acid |
| Final form of separation | salt of the mesitylenesulfonic acid |
| Yield | 55.0 p.b.w. |

(C 67.2 %, N 6.4 %, S 4.5 %, P 0.2 %, Cl 0.23 %, $OCH_3$ 4.9 %; atomic ratio C : N : S : $OCH_3$ = 36.7 : 3 : 0.95 : 1.04)

The dyestuff is obtained in a yield of 9.23 parts by weight from 10 parts by weight of that product in ethylene glycol monomethyl ether, with the addition of $NH_3$ and phenylmethylpyrazolone.

The mean molecular weight of the dyestuff is determined by osmometric determination of the vapor pressure of a solution in chloroform and is 3,180.

For the purpose of fractionating, chloroform solutions of the dyestuff are applied to aluminum foils and dried. These thin dyestuff layers are then extracted with mixtures of solvent (chloroform) and non-solvent (methanol), extraction being begun with low solvent power mixtures and continued with mixtures of increasing solvent power. Details of the test performance and the mean molecular weights of the individual fractions are given in the following table.

| Fraction No. | Chloroform (ml). | Methanol (ml.) | Fraction Quantity (mg.) | N % | Mean Molecular weight |
|---|---|---|---|---|---|
| 1 | — | 150.0 | 3.2 | — | — |
| 2 | 60.0 | 90.0 | 13.9 | — | — |
| 3 | 67.5 | 82.5 | 65.8 | 11.8 | 1,115 |
| 4 | 75.0 | 75.0 | 89.6 | 11.8 | 1,451 |
| 5 | 82.5 | 67.5 | 9.12 | 11.5 | 1,828 |
| 6 | 90.0 | 60.0 | 152.6 | 11.3 | 2,530 |
| 7 | 97.5 | 52.5 | 247.3 | 10.8 | 4,012 |
| 8 | 105.0 | 45.0 | 429.4 | 10.6 | 6,165 |
| 9 | 112.5 | 37.5 | 156.6 | 10.3 | 6,674 |

The following resins are used:

| | |
|---|---|
| Resin 1: | Epoxy resin based on bis-phenol-A-epichlorohydrin, melting point 64 to 76°C, mean molecular weight 900. |
| Resin 2: | Polyvinyl butyral, containing 69 to 71% polyvinyl butyral, 1% polyvinyl acetate, and 24 to 27% polyvinyl alcohol units; the viscosity of a 6% solution at 20°C is 4 to 6 cp. (DIN 53015) |
| Resin 3: | Unplasticized urea resin of an approximate acid number of 2 (Resamin 106 F) |
| Resin 4: | Recinene-modified alkyd resin (phthalic acid anhydride 38%, oil content 30%, acid number less than 10, viscosity 49% in xylene 550 to 700 cp. (Alftalat 814 B) |
| Resin 5: | Polyvinyl acetate of a mean molecular weight of 100,000 |

The plates are image-wise exposed for 2 minutes under a negative to a zenon impulse lamp of 5 kw at a distance of 1 m and then converted into printing formes by wiping them over with a developer of the composition below, the printing formes yielding long printing runs, particularly in the cases of samples (a), (b), and (d).

The developer used is a mixture of

| | |
|---|---|
| 50.0 | parts by weight of water, |
| 15.0 | parts by weight of isopropanol, |
| 20.0 | parts by weight of n-propanol, |
| 12.5 | parts by weight of n-propylacetate, |
| 1.5 | parts by weight of polyacrylic acid, and |
| 1.5 | parts by weight of acetic acid. |

It also is possible to reinforce the printing formes in known manner by lacquering and thus to increase the length of the printing run.

Suitable layers also can be obtained by omitting the diazo condensate in the coating solutions (a) to (d) according to U.S. Pat. No. 3,406,159, Example 1, and by replacing the toluenesulfonic acid by about 0.5 to 2 moles of phosphoric acid per mole of diazo groups.

Instead of the mixed condensate employed, it also is possible to use mixed condensates of the same components but of another structural ratio, e.g. the following:

| | (1) | (2) |
|---|---|---|
| 3-methoxy-diphenylamine-4-diazoniumsulfate (Diazo 2, sulfate, Table 1) | 100 p.b.w. | 64.6 p.b.w. |
| 85 % phosphoric acid | 527 p.b.w. | 340 p.b.w. |
| 4,4'-bis-methoxymethyl-diphenylether (Component $B_1$ No. 41, Table 1) | 60 p.b.w. | 77.4 p.b.w. |
| Duration of condensation | 6 hrs. at 40°C left standing over night | 4.5 hrs. at 40°C — |
| Precipitated twice as the chloride and finally separated as the salt of | mesitylene sulfonic acid | mesitylenesulfonic acid |
| Yield | 140.0 p.b.w. | 126.0 p.b.w. |
| Analysis | C: 66.5% N: 6.8% S: 5.2% $OCH_3$: — | C: 69.2% N: 4.9% S: 4.0% $OCH_3$: 4.9% |
| Atomic ratio | 34.2 : 3 : 1 | 49.5 : 3 : 1.07 : 1.35 |

The mean molecular weight of the azo dyestuff of (2) with methylphenylpyrazolone, determined as described above, is 2,390.

EXAMPLE 58

The procedure is analogous to that of Example 57, but the following solution is used for coating:

| | |
|---|---|
| 1.0 | part by weight of the mixed condensate described in Example 27, |
| 1.6 | parts by volume of 1 N hydrochloric acid, |
| 1.0 | part by weight of Resin 2 of Example 57, |
| 0.4 | part by weight of the diazo condensate according to U.S. Pat. No. 3,406,159, Example 1, adjusted to 2.8 molecules of phosphoric acid per diazo group, |
| 4.0 | parts by volume of water, and |
| 96.0 | parts by volume of a mixture of ethylene glycol monomethyl ether and butyl acetate in a ratio by volume of 8 : 2. |

A highly light-sensitive reproduction material is obtained which, analogously to Example 57, can be processed into printing formes yielding long printing runs.

EXAMPLE 59

An aluminum support, precoated according to U.S. Pat. No. 3,220,832 with polyvinylphosphonic acid and roughened by means of metal brushes, is coated with the following coating solution.

| | |
|---|---|
| 0.4 | part by weight of one of the mixed condensates described below, |
| 0.0605 | part by weight of p-toluenesulfonic acid, |
| 0.080d | part by weight of 4-methoxy-4'-dimethylaminoazobenzene, and |
| 100.0 | parts by volume of a mixture of ethylene glycol monomethyl ether and butyl acetate in a ratio by volume of 8 : 2. |

By image-wise exposure through a negative, a distinctly visible positive contrast image is obtained. Development to obtain a printing forme can be performed with Developer I (Examples 36 to 43).

The mixed condensates are prepared analogously to Example 57 as follows:

| | (a) | (b) |
|---|---|---|
| 86 % phosphoric acid | 120 p.b.w. | 170 p.b.w. |
| 4-methoxy-diphenylamine-4'-diazoniumsulfate (Diazo 3, Table 1) | 32.3 p.b.w. | 32.3 p.b.w. |
| 4,4'-bis-methoxymethyl-diphenyloxide (Component $B_1$ No. 41, Table 1) | 12.9 p.b.w. | 25.8 p.b.w. |
| Duration of condensation (40°C) | 20 hours | 3.5 hours |

The condensation mixtures form a clear solution in warm water. The condensation products are precipitated, with hydrochloric acid, as the chlorides.

| | (a) | (b) |
|---|---|---|
| Yield | 22.1 p.b.w. | 44.5 p.b.w. |
| Atomic ratio C : N in the condensation product | 29.5 : 3 | 34.2 : 3 |
| Analysis | C: 64.2 % N: 7.6 % | 65.6% 6.7% |

According to analysis, it can be assumed that the mixed condensate in case (a) contains about 1.2, and in case (b) about 1.5 moles of second component per mole of diazo compound.

EXAMPLE 60

The procedure is analogous to that of Example 59 but the following solution is used for coating:

| | |
|---|---|
| 0.4 | part by weight of the diazo compound described in Example 3, |
| 0.069 | part by weight of p-toluenesulfonic acid, |
| 0.02 | part by weight of 4-methoxy-4'-dimethylamino-azobenzene, |
| 10.0 | parts by volume of water, and |
| 90.0 | parts by volume of a mixture of 60 parts by volume of ethylene glycol monomethyl ether and 40 parts by volume of dimethyl formamide |

As in Example 59, a colored contrast image is obtained by imagewise exposure to light.

EXAMPLE 61

According to the procedure described in Example 54, a zinc plate is coated with the following coating solution:

| | |
|---|---|
| 0.3 | part by weight of the condensation product described in Example 15, |
| 1.0 | part by volume of water, |
| 0.54 | part by volume of 1 N hydrochloric acid, |
| 1.0 | part by weight of the phenol-formaldehyde resin used in Example 54, |
| 6.0 | parts by weight of ethylene glycol monomethyl ether, and |
| 4.0 | parts by weight of dimethyl formamide. |

A positive relief printing form is obtained by processing in the manner described in Example 54.

EXAMPLES 62 TO 67

Examples 62 to 67 show the suitability of a number of other mixed condensates as constituents of light-sensitive reproduction layers of reproduction materials which are useful for the photomechanical preparation of offset printing forms. The supports used are aluminum foils roughened by means of metal brushes and pretreated according to U.S. Pat. No. 3,220,832 with polyvinylphosphonic acid.

The coating solutions used as well as details about the mixed condensates employed are given in Table 4 below.

Also in the case of Example 63, the reproduction layer containing the mixed condensate has a higher light-sensitivity than a reproduction layer of the same thickness but containing only the corresponding formaldehyde condensate of the diazo compound or a mixture of this formaldehyde condensate with a corresponding quantity of a formaldehyde condensate of the 4-methyl-diphenylamine.

Referring to Example 65, it should be pointed out that the reproduction layer has a very good light-sensitivity and also a very good storability. It is thus possible to copy and develop the presensitized printing plate after storage for 8 hours at 100°C, without the non-image areas tending to scum.

Referring to Example 67, it should be noted that a printing form can be produced even after very brief exposure to light. It is thus sufficient to expose the copy for 10 to 20 seconds to a 5 kw xenon impulse lamp at a distance of 1 m. The printing form can be reinforced with the usual lacquers.

The preparation of the diazo condensates used in Examples 62 to 67 is described below.

Table 4

| Ex. | Mixed Condensate (MC) | | | | | | | Coating Solution | | Developer |
|---|---|---|---|---|---|---|---|---|---|---|
| | Diazo Compound $A(D)_n$ | Component B or | $B_1$ | Active CO compound | Separated as | Ratio $A(D)_n$ to B or $B_1$ in MC (approx.) | % MC | Other Additives | Solvent (Mixtures, | |
| 62 | Diazo 10, inner salt | 1 | — | $CH_2O$ | inner salt | 1 : 0.35 | 0.1 | — | $DMF:H_2O$ 92 : 8 | $H_2O$ |
| 63 | Diazo 2, $H_2PO_4^-$ | 5 | — | $CH_2O$ | $H_2PO_4^-$ $.H_3PO_4$ | 1 : 0.75 | 0.1 | 0.3 ml of 0.1 100 ml of solution | EGMME/-BA/$H_2O$ | $H_2O$ |
| 64 | Diazo 1, $Cl^-$ | 19 | — | $CH_2O$ | $CH_3SO_3^-$ | 1 : 1.40 | 0.4 | — | EGMME/-BA/$H_2O$ 54 : 36: 10 | 0.5% of trisodium pho phosphate, in $H_2O$ |
| 65 | Diazo 2, $HSO_4^-$ | — | 47 | — | naphthyl-(2)-$SO_3^-$ | 1 : 0.85 | 0.5 | — | EGMME/BA 80 : 20 | " (Ex. 36 to 43) |
| 66 | Diazo 5, $HSO_4^-$ | — | 41 | — | $Cl^-$ | 1 : 1.1 | 1.0 | 1.5 moles of $H_3PO_4$ per mole of diazo groups | EGMME/BA 80 : 20 | " (Ex. 36 to 43) |
| | Diazo 11, $Cl^-.ZnCl_2/2$ | — | 41 | — | naphthyl-(2)-$SO_3^-$ | 1 : 1.75 | 0.5 | — | EGMME | " (Ex. 36 to 43) |

DMF = dimethyl formamide
EGMME = ethylene glycol monomethyl ether
BA = butyl acetate
p.b.v. = parts by volume

EXAMPLE 62

6.1 parts by weight of 3,5-dimethyl-aniline (Component B No. 1, Table 1) are dissolved in 50 parts by weight of 80% sulfuric acid by heating to 70°C. The solution is then cooled to room temperature and, after adding 13.8 parts by weight of the diazo compound, further cooled to 0°C. Three parts by weight of paraformaldehyde, dissolved in 15 parts by weight of 80 % sulfuric acid, are added to the crystal slurry and a clear crude condensate is thereby obtained. After being stirred for five hours at room temperature and standing over night, it is introduced into 1,000 parts by volume of water, the precipitate is filtered off with suction, thoroughly washed with water and dried. Yield: 11 parts by weight. (C 50.9 %, N 12.5 %, ND 7.4 %, S 10.1 %; atomic ratio 16.1:3.38:2:1.2) The analysis indicates a content of about 0.35 mole of second component per mole of diazo compound.

EXAMPLE 63

Preparation of mixed condensate performed as in Example 2.

EXAMPLE 64

Preparation of mixed condensate performed as in Example 12.

EXAMPLE 65

The procedure is similar to that of Example 57 but the following substances are used: 16.2 parts by weight of 3-methoxy-diphenylamine-4-diazonium-sulfate (Diazo 2, sulfate, Table 1), 36 parts by volume of 86 % phosphoric acid, 6.86 parts by weight of 4,4'-bismethoxy-methyl-diphenylsulfide (Component $B_1$ No. 47, Table 1). Condensation is performed for 1.5 hours at room temperature and 20 hours at 40°C.

The crude condensate is dissolved in water and the condensation product is precipitated from this solution by the addition of hyrochloric acid. The viscous precipitate is redissolved in water and again precipitated by the addition of hydrochloric acid. The precipitate is again redissolved in water and, from this solution, by means of the sodium salt of naphthalene-2-sulfonic acid, the corresponding sulfonate of the condensation product is precipitated. After drying at 40°C, the yield is 12.9 parts by weight. (C 64.7 %, N 6.4 %, S 9.1 %; atomic ratio 35.4:3:1.86).

About 0.86 mole of second component is then present per mole of diazo compound.

A similarly good result is obtained with the working conditions of Example 65 when using a condensation product prepared from the same components but in different quantities.

In this case the condensation is as follows: 16.2 parts by weight of 3-methoxy-diphenylamine-4-diazonium-sulfate (Diazo 2, sulfate, Table 1), 50 parts by volume of 86 % phosphoric acid, and 13.7 parts by weight of 4,4'-bis-methoxy-methyl-diphenylsulfide (Component $B_1$ No. 47, Table 1) are condensed for 4 hours at 40°C. The crude condensate is dissolved in water, cleared of a slight turbidity by means of activated charcoal, the product is precipitated with common salt solution, separated and washed with common salt solution. The chloride is again dissolved in water and the condensate is precipitated as a salt of mesitylene sulfonic acid. Yield: 24.8 parts by weight. (C 65.9 %, N 6.5 %, S 10.2 %; atomic ratio 35.4:3:2.05).

The condensate contains about 1 mole of second component per mole of diazo compound.

EXAMPLE 66

8.3 parts by weight of Diazo Compound 5 (sulfate, somewhat wet; N 6.2 %) are dissolved in 60 parts by volume of 93 % phosphoric acid and 5.2 parts by weight of 4,4'-bis-methoxymethyl-diphenylether (Component $B_1$ No. 41, Table 1) are dropwise added within 12 minutes. The mixture is stirred for one hour without further heating and for 2 hours at 40°C.

The clear water-soluble crude condensate is dissolved in water, the condensation product is precipitated by the addition of aqueous hydrochloric acid and the precipitate is separated again with hydrochloric acid, after dissolving it again in fresh water. After drying, 10 parts by weight of the cloride of the condensation product are obtained. (C 62.3 %, N 4.3 %; atomic ratio 33.8:2).

This means that about 1.1 moles of second component are present per mole of diazo compound.

EXAMPLE 67

0.94 part by weight of diazo compound No. 11 (zinc chloride double salt, N 8.9 %) is dissolved in 10 parts by volume of 92 % phosphoric acid and dry air is passed through the mixture until no more hydrochloric acid escapes, i.e. until the mixture is substantially free from chloride ions.

0.52 part by weight of 4,4'-bis-methoxymethyl-diphenylether (Component $B_1$ No. 41, Table 1) is introduced and condensation is performed for 15 hours at room temperature. The condensation mixture is dissolved in 100 parts by volume of water, clarified with activated charcoal and the sulfonate of the diazo compound is precipitated with 0.92 part by weight of the sodium salt of naphthalene 2-sulfonic acid in 100 parts by volume of water. Yield after drying: 0.9 part by weight (C 64.4 %, N 3.8 %, S 4.8 %; atomic ratio 59.3:3:1.66).

Analysis shows that about 0.66 molecule of the sodium salt of the sulfonic acid has been entrained during precipitation. Considering this fact, the resxult of the analysis is a condensation ratio of diazo compound to second component of about 1:1.75.

EXAMPLES 68 TO 73

Examples 68 to 73 show the use of some mixed condensates for the preparation of planographic printing forms on aluminum supports roughened only by metal brushes, and not otherwise pretreated. Further details are summarized in Table 5 and the description of the preparation of the diazo mixed condensates follows the table.

It is noteworthy that, according to Examples 68 and 69, positive printing forms are obtained from positive originals. But the developer resistance is not particularly high, particularly in Example 69. The other examples (70 to 73) yield again negative-working reproduction materials, i.e. positive printing forms are obtained by exposure under a negative original. Whereas the printing forms prepared according to Example 70 have an only moderate acid resistance, the printing forms obtained according to Examples 71 to 73 are very resistant to aqueous phosphoric acid, even when the condensates are used in the form of metal halide double salts. This is already shown by the fact that dilute aqueous phosphoric acid serves as a developer.

Table 5

| Ex. | Mixed Condensate | | | | | Coating Solution | | Developer |
|---|---|---|---|---|---|---|---|---|
| | Diazo Compound $A(D)_n$ | Component B | Active CO compound | Separated as | Ratio $A(D)_n$ to B in MC (approx.) | % MC (Mixtures, | Solvent p.b.v.) | |
| 68 | Diazo 1, $Cl^-$ | 8 | $CH_2O$ | $Cl^-$ | 1 : 7 | 3 | EGMME | 0.95 % $Na_2SiO_3$ (anhydrous) + 0.6% $Na_3PO_4$ + 0.15% |
| 69 | Diazo 3, $cl^-$ | 9 | do. | $Cl^-$ | 1 : 2.1 | 1 | do. | 15 seconds with 0.5% $Na_2HPO_4$ in water, then treatment with emulsion lacquer according to U.S. Patent Application Ser. No. 8,522 |
| 70 | Diazo 2, $H_2PO_4^-$ | 5 | do. | $H_2PO_4^-$ $.H_3PO_4$ | 1 : 0.75 | 0.1 | EGMME/DMF/$H_2O$ 54:36:10 | $H_2O$ |
| 71 | Diazo 2, $HSO_4^-$ | 20 | do. | $Cl^-.ZnCl_2/2$ | 1 : 0.5 | 0.5 | $H_2O$/EGMME 98:2 | 2% $H_3PO_4$ |
| | Diazo 3, | 21 | do. | $HSO_4^-$ | 1 : 0.2 | 0.5 | $H_2O$ | 2% $H_3PO_4$ |
| | Diazo 3, $Cl^-$ | 21 | do. | $HSO^-$ | 1 : 0.2 | 0.5 | $H_2O$ | 2% $H_3PO_4$ |
| 73 | Diazo 1, $HSO_4^-$ | 22 | do. | $Cl^-.ZnCl_2/2$ | 1 : 0.3 | 0.5 | $H_2O$ | 2% $H_3PO_4$ |

EGMME = ethylene glycol monomethyl ether
DMF = dimethyl formamide
p.b.v.= parts by volume The mixed condensates are prepared as follows:

EXAMPLE 68

A solution is prepared from 25.2 parts by weight of diphenylamine-4-diazonium-chloride (Diazo 1, chloride, Table 1) (92.5 %), 18.8 parts by weight of phenol (Component B No. 8, Table 1) and 40 parts by volume of acetic acid. The solution is poured with stirring at room temperature into a mixture of 200 parts by volume of 36.5 % aqueous hydrochloric acid, 29.6 parts by weight of 30.4 % aqueous formaldehyde solution, and 40 parts by volume of glacial acetic acid. After about 1 minute, the reaction product precipitates as a viscous mass. Stirring is continued for 10 minutes, the aqueous solution is poured off, and the condensate is kneaded 5 times with 200 parts by volume of water. For purification, the reaction product is dissolved in 360 parts by volume of ethylene glycol monomethyl ether and precipitation is effected by pouring the solution into 4,000 parts by volume of water to which 40 parts by volume of 36.5 % aqueous hydrochloric acid have been added. The precipitate is thoroughly washed with water and dried, finally under reduced pressure over phosphorus pentoxide. A deep-yellow resin is obtained in a quantity of 22 parts by weight, which, according to analysis, has a nitrogen content of 2.2 %. The ratio to be calculated thereon is about 7 phenol units per each diazol group.

EXAMPLE 69

13.6 parts by weight of 4-methoxy-diphenylamine-4'-diazoniumchloride (Diazo 3, chloride, Table 1) are dissolved together with 7.5 parts by weight of 4-tert.-butyl-phenol (Component B No. 9, Table 1) in a mixture of 49.1 parts by weight of methanesulfonic acid (98 %) and 49.1 parts by weight of glacial acetic acid, and the solution is cooled down to +10°C. At this temperature, a solution of 3 parts by weight of paraformaldehyde in 20 parts by volume of 98 % methanesulfonic acid are dropwise added with stirring, during 10 minutes. Stirring is continued for 20 minutes at this temperature, the mixture is heated to room temperature, stirred for another hour, and finally heated for 10 minutes to 40°C. The mixture is stirred into 1,000 parts by volume of water. For purification, the precipitate is dissolved in 200 parts by volume of ethanol and precipitation is effected at 70°C. by stirring into a mixture of 50 parts by volume of 36.5 % aqueous hydrochloric acid and 1,000 parts by volume of water. Purification is repeated in the same manner.

A deep-yellow colored resin is obtained in a yield of 10.3 parts by weight. According to analysis, the condensation ratio of diazo compound to phenol is about 1:2.1 (C 67.6 %, N 6.3 %; atomic ratio C : N = 37.6:3).

EXAMPLE 70

Preparation of the mixed condensate performed as in Example 2.

EXAMPLE 71

3.03 parts by weight of 3-methyl-phenoxymethyl-phosphonic acid (Component B No. 20, Table 1) and 9 parts by weight of diphenylamine-4-diazoniumsulfate (97.6 %) (Diazo 1, sulfate, Table 1) are dissolved in 36 parts by volume of 90 % methanesulfonic acid. A solution of 1.4 parts by weight of paraformaldehyde in 14 parts by volume of 90 % methanesulfonic acid is then slowly added, with cooling, and the mixture is finally heated for 3 hours at 40°C.

The crude condensate is then diluted with water to 1,000 parts by volume and the condensation product is precipitated from this solution with zinc chloride. Yield 11.6 parts by weight. (C 47.4 %, N 9.4 %, P 3.3 %; atomic ratio 17.7:3:0.48).

The mixed condensate contains about 0.5 mole of second component per mole of diazo compound.

EXAMPLE 72

8.2 parts by weight of 96.2 % 4-methoxy-diphenylamine-4'-diazoniumchloride (Diazo 3, chloride, Table 1) are dissolved in 40 parts by volume of 80 % sulfuric acid. To this solution, there is added, with stirring, a solution of 3.3 parts by weight of 4-chloro-phenoxymethylphosphonic acid (Component B No. 21, Table 1) in 10 parts by volume of N-methyl-pyrrolidone, in which 1.4 parts by weight of paraformaldehyde have been suspended.

After condensation for 1 hour at 40°C, the condensation mixture is stirred into 1,000 parts by volume of isopropanol, the precipitate is filtered off with suction, washed and dried.

Yield: 6.4 parts by weight. (C 46.1 %, N 10.8 %, P 1.18 %; atomic ratio 15.8:3:0.16)

The condensation product contains about 0.2 mole of second component per mole of diazo compound.

The condensate contains about 0.3 mole of second component per mole of diazo compound.

EXAMPLES 74 TO 77

These examples show that, in principle, not only the mixed condensate in the form of the diazonium salts, but also the azides and diazonamino compounds obtainable from these, by reaction with sodium azide or with secondary amines, may be used as light-sensitive components of reproduction layers, and in special cases of reproduction layers suitable for the production of tanned images.

Table 6 contains the most important data of these examples.

In all cases, the coating compositions are whirl-coated onto the supports used, and the coating is then dried. After image-wise exposure, the areas not struck by light are removed with water, and, after drying, the cross-linked image areas are dyed by means of an aqueous solution of crystal violet.

Table 6

| Ex. | Mixed Condensate (MC) | | | | | | Support | Coating Composition | | | Developer |
|---|---|---|---|---|---|---|---|---|---|---|---|
| | Diazo Compound $A(D)_n$ | Component B or | $B_1$ | Active CO Compound | Separated as | Ratio $A(D)_n$ to B or $B_1$ (approx.) | | % MC | Further Additives | Solvent (Mixtures, p.b.v.) | |
| 74 | Diazo 1, $HSO_4^-$ | 13 | — | $CH_2O$ | inner salt | 1 : 1 | electrolytically roughened Al | 0.60 | 0.11 p.b.w. $NaN_3$/0.6 p.b.w. MC (yields azide of MC) +2 p.b.w. polyvinylpyrrolidone (K value 90) | EGMME/BA/$H_2O$ 72:18:10 | hot water |
| 75 | Diazo 1, $HSO_4^-$ | 23 | — | $CH_2O$ | inner salt | 1 : 1.1 | electrolytically roughened Al | 0.6 | 0.1 p.b.w. $NaN_3$/0.6 p.b.w. MC (yields azide of MC) + 2 p.b.w. polyvinylpyrrolidone (K value 90) | EGMME/BA/$H_2O$ 72:18:10 | hot water |
| 76 | Diazo 2, $H_2PO_4^-$ | — | 28 | — | $H_2PO_4^-$ . $H_3PO_4$ | C : N 10: 3 | sandblasted polyester | 0.55 | 5.5 p.b.w. polyvinylmethyl acetamide (K value 91)/0.55 w. of MC | $H_2O$ | water |
| 77 | Diazo 2, $HSO_4^-$ | — | 41 | — | $Cl^-$ | 1 : 1.1 | electrolytically roughened Al | ++ | coating solution see below | | water |

++) 1 part by weight of the mixed condensate is dissolved in 10 p.b.v. of water and 0.39 p.b.w. of morpholine is added. The colloidal prepcipitate is drawn off by suction, briefly washed with water, and then introduced into 100 p.b.v. of dimethyl formamide in which 2 p.b.w. of polyvinyl methylacetamide (K value 91) are previously dissolved:

EGMME = ethylene glycol monomethyl ether
BA = butyl acetate
p.b.v. = parts by volume
p.b.w. = parts by weight

EXAMPLE 73

The procedure is the same as that in Example 71 but the following starting materials are used:

15.0 parts by volume of 90 % methanesulfonic acid,
3.0 parts by weight of Diazo 1, sulfate (97.6 %),
0.6 part by weight of 4-tert.-butyl-phenoxymethylphosphonic acid (Component B No. 22, Table 1), and
0.38 part by weight of paraformaldehyde in 5 parts by volume of methanesulfonic acid.

Condensation is performed for 3 hours at 40°C and the product is separated as the zinc chloride double salt.

Yield: 3.8 parts by weight (C 44.8 %, N 9.3 %, P 1.9 %; atomic ratio 16.9:3:0.28).

The mixed condensates are prepared as follows:

EXAMPLE 74

5.68 parts by weight of 2-naphthol-6-sulfonic acid (sodium salt, 87 %, Component B No. 13) are dissolved in 80 parts by volume of methanesulfonic acid (90 %) while heating. The solution is then cooled to 20°C, whereupon first 6.17 parts by weight of diphenylamine-4-diazonium sulfate (Diazo 1, sulfate) and then 1.2 parts by weight of paraformaldehyde are introduced while agitating. After the condensation mixture has been stirred for 24 hours at 20°C, it is poured into 1,000 parts by volume of water. The mixed condensate separates in the form of the inner salt which is sparingly soluble in water. It is drawn off by suction, washed by suspending it several times in water, and dried. Yield:

7.1 parts by weight. The product contains the diazo compound and the sulfonic acid in a molar ratio of about 1:1. The sparingly water-soluble mixed condensate (inner salt) may be converted into the completely water-soluble azide by treatment with sodium azide, which proves that it is a genuine mixed condensate. (C 58.2 %, N 8.5 %, S 6.9 %; atomic ratio 24 : 3 : 1.06).

EXAMPLE 75

5.58 parts by weight of 2-methoxy-naphthalene-6-sulfonic acid (93.3 %, Component B No. 23, Table 1) are dissolved in 80 parts by volume of methanesulfonic acid (90 %) heated to 60°C. After cooling, 6.17 parts by weight of diphenylamine-4-diazoniumsulfate (Diazo 1, sulfate, Table 1) are dissolved in the solution, while stirring, and then 1.2 parts by weight of paraformaldehyde are added, while stirring. After condensing the mixture for 20 hours at room temperature, it is poured into 1,000 parts by volume of water heated to 40°C and maintained at this temperature for 1.5 hours. The condensation product is drawn off by suction, washed by suspending it in water, and dried. Yield: 8.2 parts by weight. According to analysis, the product, which is in the form of an inner salt, contains diazo compound and sulfonic acid in a ratio of approximately 1 : 1.1. (N 7.8 %, S 6.2 %; atomic ratio: 3 : 1.04). By treatment with an aqueous sodium azide solution, the practically water-insoluble condensation product may be converted into an azido compound which is soluble in water. This proves that it is a mixed condensate.

For the preparation of the coating compositions used in Examples 74 and 75, the diazo compound is dissolved in water, reacted with the quantity of sodium azide stated in Table 6, and the reaction mixture is then added to a solution of the polymer in the other solvents.

EXAMPLE 76

6.5 parts by weight of 3-methoxy-diphenylamine-4-diazoniumphosphate (Diazo 2, phosphate) are dissolved in 50 parts by volume of 86 % phosphoric acid, then 3.9 parts by weight of hexa-methoxymethylmelamine (Component $B_1$ No. 28, Table 1) are introduced while vigorously stirring, and the mixture is condensed for 20 hours at room temperature.

The condensation product is separated out of the crude condensate by precipitation with isopropanol. Yield: 9.1 parts by weight. (C 32.9 %, N 11.6 %, P 14.9 %) According to analysis, the product contains the elements C and N in a ratio of about 10 : 3.

EXAMPLE 77

The diazo mixed condensate is prepared as described in Example 44.

EXAMPLE 78

A water-resistant paper support having a hydrophilic mat layer of baryta, kaolin, and finely divided silica in hardened polyvinyl alcohol is coated by swabbing with the following solution, and then dried:

| | |
|---|---|
| 2.0 | parts by weight of the mixed condensate described below, |
| 0.52 | part by volume of 10 N hydrochloric acid, |
| 10.0 | parts by volume of water, |
| 50.0 | parts by volume of ethylene glycol monomethyl ether, and |
| 50.0 | parts by volume of dimethyl formamide. |

After image-wise exposure under a negative, the material is developed with an aqueous solution containing 2.2 per cent of $Na_2HPO_4 \cdot 12\ H_2O$ and 2.7 per cent of ammonium chloride. A printing form of good ink receptivity is thus obtained.

The mixed condensate employed is prepared as follows:

3.0 parts by weight of 3-methoxy-diphenylamine (Component B No. 4, Table 1) and 3.1 parts by weight of 4-chloro-diphenylamine (Component B No.3, Table 1) are quickly dissolved in 150 parts by weight of 80 % sulfuric acid heated to 80°C. As soon as all components have been dissolved, the mixture is rapidly cooled to +30°C. and then 14.7 parts by weight of diphenylamine-4-diazonium sulfate (Diazo 1, sulfate, Table 1) are dissolved therein at this temperature. Then, a solution of 2.4 parts by weight of paraformaldehyde in 25 parts by volume of 80 percent sulfuric acid is slowly added, drop by drop, at room temperature, while a temperature rise above 25°C. is avoided by cooling. After condensing for 1 hour at 40°C., a water-soluble crude condensate is obtained. It is diluted with 50 parts by volume of methanol, precipitated by adding 2,000 parts by volume of isopropanol, the precipitate is drawn off by suction, twice washed by suspension in 500 parts by volume of isopropanol, and finally dried under reduced pressure at 40°C. Yield: 17.5 parts by weight. According to analysis, the mixed condensate (sulfate) contains approximately 0.26 mole of 3-methoxy-diphenylamine and approximately 0.08 mole of 4-chlorodiphenylamine per mole of diazo compound. (C 50 %, N 11 %, Cl 0.7 %, $OCH_3$ 1.9 %, S 9.5 %; atomic ratio: 68:12.8:0.32:1:4.84)

EXAMPLE 79

The procedure described in Example 51 is repeated using, however, a solution of the following composition for coating:

| | |
|---|---|
| 1.0 | part by weight of the mixed condensate described below, |
| 4.0 | parts by weight of polyvinyl pyrrolidone (K value 90), |
| 0.1 | part by weight of Crystal Violet (C.I. 42555), |
| 88.0 | parts by weight of water, and |
| 12.0 | parts by weight of ethanol. |

By processing as described in Example 51, a positive printing forme is obtained from a positive original by the reversal process.

However, when the reproduction material is exposed under a negative master and then developed by showering with water, a positive tanned image in a blue color is obtained.

The mixed condensate is prepared as follows:

3.42 parts by weight of 2-dimethylamino-naphthalene (Component B No. 7, Table 1) and 6.17 parts by weight of 95 % diphenylamine-4-diazonium sulfate (Diazo 1, sulfate, Table 1) are dissolved in 40 parts by volume of 90 % methanesulfonic acid. At room temperature, 1.2 parts by weight of paraformaldehyde are slowly added while agitating. After condensing for 50 hours at room temperature, the mixture is diluted with 300 parts by volume of water and the condensate is precipitated at 80°C. by adding 50 parts by volume of a 50 % aqueous solution of zinc chloride. After cooling to 20°C., the condensate is separated, dissolved in 300 parts by volume of water at 50°C., reprecipitated by adding 30 parts by volume of the above-mentioned zinc chloride solution, drawn off by suction, and dried. Yield: 9.4 parts by weight. According to analysis, the mixed condensate contains about 0.6 mole of the amine per mole of diazo compound. (N 9.2 %, ND 5.1 %; atomic ratio: 3.61 : 2)

EXAMPLE 80

The paper support used in Example 47 is coated by swabbing with the following coating solution:

| | |
|---|---|
| 0.5 | part by weight of the mixed condensate described below: |
| 50.0 | parts by volume of ethylene glycol monomethyl ether, and |
| 50.0 | parts by volume of water. |

After drying, the reproduction layer is image-wise exposed under a negative original and then wiped over with water. A highly ink-receptive, positive printing form is thus obtained.

The mixed condensate used in prepared as follows:

13.8 parts by weight of 4-hydroxy-benzoic acid (Component B No. 12, Table 1) are dissolved at 40°C. in a mixture consisting of 100 parts by volume of 90 % sulfuric acid and 40 parts by volume of 96 % sulfuric acid. The solution is rapidly cooled to room temperature, then 30 parts by weight of 97.6 % diphenylamine-4-diazonium sulfate (Diazo 1, sulfate, Table 1) are dissolved therein, and cooling is continued to +5°C to 10°C. At this temperature, a solution of 6 parts by weight of paraformaldehyde in 20 parts by volume of 90 percent sulfuric acid is cautiously added, drop by drop. Stirring is continued for 30 minutes at the same temperature and then the mixture is poured into 1,000 parts by volume of ice water. The precipitating product is drawn off by suction, suspended in 500 parts by volume of water, drawn off again, and dried. Yield: 46.6 parts by weight. According to analysis, the condensate contains 4-hydroxy-benzoic acid and diazo compound approximately in a molar ratio of 1:1. (C 49.7 %, N 8.5 %, ND 5.6 %, S 6.9 %; atomic ratio: C : N : ND : S = approx. 20.7 : 3 : 2: 1.08)

Example 81

The procedure described in Example 80 is repeated except that the following coating solution is used:

| | |
|---|---|
| 2.0 | parts by weight of the mixed condensate described below, |
| 10.75 | part by weight of 86 % phosphoric acid, and |
| 100.0 | part by volume of water. |

Processing is also as stated in Example 80, and the result is very similar.

The mixed condensate is prepared as follows:

15.42 parts by weight of diphenylamine-4-diazonium sulfate (Diazo 1, sulfate, Table 1) are dissolved in 100 parts by volume of 80 % sulfuric acid. While vigorously stirring, 8.83 parts by weight of finely pulverized dimethylol-succinic diamide (Component $B_1$ No. 26, Table 1) are introduced, with cooling to maintain a temperature of +25°C. The mixture is condensed for 15.5 hours at room temperature, the crude condensate is dissolved in 500 parts by volume of water, and the condensate is precipitated by adding 80 parts by volume of a 50 % zinc chloride solution. The precipitate is separate, dissolved in 500 parts by volume of water at 50°C, reprecipitated by adding 50 parts by volume of a 50 % zinc chloride solution, drawn off by suction, and dried under reduced pressure. Yield: 18.6 parts by weight. (C40.8 %, N 11.6 %, ND 5.35 %; atomic ratio: 17.8 : 4.35 : 2). From the analysis, it may be assumed that a second component is incorporated, but the carbonamide groups appear to have become saponified to some degree.

EXAMPLE 82

This example proves the superiority of certain mixed condensates over known diazo diphenylamine formaldehyde condensates for the hydrophilic hardening of water-soluble colloids. Hydrophilic hardened colloids are of importance for a special type of positive-working, presensitized printing plate (see U.S. Pat. No. 3,085,008). With plates of this type, a mixture of a hydrophilic polymer and a diazo compound is coated onto the surface of a support, which has been rendered oleophilic. During image-wise exposure under a positive master, the colloid is cross-linked and anchored to the oleophilic support. The unexposed areas of the layer are then removed, and the oleophilic support is bared in these areas and will represent the image areas transferring the printing ink. A positive printing form is thus obtained.

Since the light-decomposition products of known formaldehyde condensates have oleophilic properties, the proportion of diazo condensate should not be too high; on the other hand, cross-linking of the layer must be as complete as possible in order to make it more resistant to attack during the printing process, and this is effected by a high proportion of diazo compound.

This example shows a comparison between two printing plates of this type, in which a. one was prepared with the chloride of the formaldehyde condensate of diphenylamine-4-diazonium chloride produced in accordance with Example 1 of U.S. Pat. No. 3,311,605.
b. while the other was prepared with the chloride of a mixed condensate of diphenylamine-4-diazonium salt and dimethylolurea prepared as described below.

A presensitized planographic printing plate produced in accordance with U.S. Pat. No. 3,396,019, Example 1 is completely exposed without using an original, e.g. under an arc lamp. Then, the plate is rinsed with water and dried. The plate is cut in half, and of the two halves one is coated with coating solution 1 and the other with coating solution 2, described below, and the coatings are then dried.

| | | |
|---|---|---|
| 1. | 0.125 | part by weight of the condensate described at a), |
| | 0.38 | part by weight of polyacrylamide (Cyanamer P 250), and |
| | 100.0 | parts by volume of water. |
| 2. | 0.125 | part by weight of the mixed condensate described at b), |
| | 0.38 | part by weight of polyacrylamide (Cyanamer P 250), and |
| | 100.0 | parts by volume of water. |

After image-wise exposure under a positive original, the plates are developed by wiping them over with water and then are inked up with greasy ink.

While in Case 1 a positive printing form is obtained which shows excessive scumming in the non-image areas, a positive planographic printing plate is produced with solution 2 which, apart from minor coating deficiencies, is fully acceptable and the non-image areas of which (hardened hydrophilic colloid) do not accept greasy ink.

The mixed condensate employed in this example is prepared as follows: 23.2 parts by weight of diphenylamine-4-diazonium chloride (Diazo 1, chloride, Table 1) are dissolved in 50 parts by volume of a 36.5 % aqueous solution of hydrochloric acid. With vigorous stirring, 12 parts by weight of finely pulverized dimethylol-urea (Component $B_1$ No. 29, Table 1) are introduced into the solution and stirring is continued, first for 3 hours at room temperature and then for 1 hour at 40°C. After standing overnight in a refrigerator, the mixture is diluted with 80 parts by volume of methanol and then introduced into 1,200 parts by volume of isopropanol. The precipitate is drawn off by suction, washed twice briefly each time with 400 parts by volume of isopropanol, and dried under reduced pressure at 40°C. Yield: 15 parts by weight (chloride). A yellow, water-soluble powder is thus obtained which, according to analysis, contains about 0.9 molecule of urea pre diazo group. (N 19.6 %, ND 8.2 %, Cl 10.8 %; atomic ratio: 4.8 : 2 : 1.04).

EXAMPLE 83

The aluminum support used in Example 57 is coated with a coating solution of the following composition:

1.0 part by weight of the mixed condensate described below
2.0 parts by volume of 1 N hydrochloric acid,
0.4 part by weight of the diazo condensate prepared according to Example 1 of U.S. Pat. No. 3,406,159 and adjusted to 2.8 molecules of phosphoric acid per diazo group,
1.0 part by weight of a polyvinyl acetate of a medium molecular weight of 110,000 (determined by light diffusion),
4.0 parts by weight of water,
77.0 parts by weight of ethylene glycol monomethyl ether, and
19.0 parts by weight of butyl acetate.

By drying the coating, a highly light-sensitive reproduction material is produced. It may be converted into a printing forme by means of the developer solution mentioned in Example 57.

An additional treatment with the developer II described in Examples 36 to 43 may be of advantage.

The mixed condensate is prepared as follows: 7.33 parts by weight of diphenylamine-4-diazonium sulfate (Diazo 1, sulfate, Table 1) are dissolved in 100 parts by volume of 90 % methanesulfonic acid. Then 2.1 parts by weight of diphenylene oxide (Component B. No. 24, Table 1) are dissolved in 35 parts by volume of glacial acetic acid, and 3.75 parts by weight of an 30 % aqueous formaldehyde solution in 5 parts by volume of glacial acetic acid, the two acetic acid solutions are combined, and the mixture is then added dropwise, with stirring, to the diazo solution first prepared. The mixture is further stirred for 4 hours at 40°C. After standing for 36 hours at room temperature, the crude condensate - which dissolves in water without leaving any residue - is stirred into 1,250 parts by volume of isopropanol. The suspension thus formed is stirred at 40°c. until a precipitate deposits when the stirrer is turned off. The precipitate is drawn off with suction, washed twice in 250 parts by volume of isopropanol each time, with suspension, and then dried under reduced pressure. Yield: 5.9 parts by weight. According to analysis, the mixed condensate contains about 1 mole of diphenylene oxide per mole of diazo compound. (C 60.8%, N 8.1%, s 6.1%; atomic ratio: 26 : 3 : 1)

A suitable reproduction material is also obtained by coating the same support with a solution of the following composition:

1.0 part by weight of the mixed condensate described in Example 15,
1.8 parts by volume of 1 N hydrochloric acid in ethylene glycol monomethyl ether (for conversion of the diazo compound into the chloride),
2.0 parts by weight of an epoxy resin based on bisphenol A and having a melting range of 96–104°C. and an epoxy equivalent weight of 875–975 (Epikote 1004),
4.0 parts by volume of water,
75.0 parts by volume of ethyleneglycol monomethyl ether, and
20.0 parts by volume of butyl acetate.

EXAMPLE 84

A trimetal plate consisting of layers of aluminum, copper, and chromium is covered with a coating solution of the composition stated below, excess solution is allowed to drain, and the plate is dried:

2 parts by weight of the chloride of the mixed condensate described below,
1 part by weight of polyvinyl alcohol (residual acetyl content 12 per cent, viscosity of a 4% aqueous solution 6.5 to 8.8 cp at 20°C.), and
50 parts by volume of water.

After image-wise exposure under a positive original, the plate is developed by means of the developer II described in Examples 36 to 43, and then the chromium is etched away to the copper layer in the areas not covered by the reproduction layer, using an aqueous etching solution containing 30 percent by weight of calcium chloride, 20 percent by weight of zinc chloride, and about 1.5 to 3 percent by weight of ammonium chloride, tartaric acid and concentrated hydrochloric acid, for the chromium layer. the plate is decoated by treatment with a paste consisting of powdered chalk and dimethyl formamide. A positive multi-metal printing form is thus obtained from which very long runs can be printed.

The diazo mixed condensate is prepared in a manner similar to that described in Example 44, using, however, the following reactants and reaction conditions:

32.3 parts by weight of 3-methoxy-diphenylamine-4-diazonium sulfate (Diazo 2, sulfate, Table 1),
170.0 parts by weight of 86% phosphoric acid, and
64.4 (parts by weight of methoxymethyl·diphenylether made from CMDPO-32 (Component $B_1$, No. 48; see below).

The mass is condensed for 4.5 hours at 40°C., dissolved in water, filtered until clear, precipitated by means of hydrochloric acid, dissolved again, and again precipitated with hydrochloric acid. Yield: 44 parts by weight.

According to the information given by the manufacturer (cf. U.S. Pat. No. 3,316,186, column 3, lines 41 to 64), the chloromethylated diphenylether CMDPO-32 of Dow Chemical Co. has a $CH_2$ Cl substitution degree of 2.8 and consists of the following components:

| | |
|---|---|
| 2,4'-di-chloromethyl-diphenylether | 1.9% |
| 4,4'-di-chloromethyl-diphenylether | 8.6% |
| 2,2',4'-tri-chloromethyl-diphenylether | 17.0% |
| 2,4,4'-tri-chloromethyl-diphenylether | 72.0% |
| 2,2',4,4'-tetra-chloromethyl-diphenylether less than | 2.0% |

The ether mixture obtained by replacing halogen atoms by methoxy groups had a methoxy content of 28.9%. It was used for the preparaation of a condensation product the elemental analysis of which was as follows: (C 67.5%, N 4.4%, Cl(total) 4.3%, Cl (ionogen) 3.8%, $OCH_3$ 12.7%; atomic ratio: 53.6 : 3 : 1.16 : 1.03 : 3.92)

The result of the analysis shows that considerable quantities of reactive methoxymethyl groups are contained in the mixed condensate.

A reproduction material which also may be used with good success is produced by coating the same support with a coating solution of the following composition and drying the coating:

1 part by weight of the mixed condensate described in Ex. 44,
2 parts by weight of the polyvinyl alcohol used above in this example, and
50 parts by volume of water.

After image-wise exposure, the plate is developed by rinsing with water. Further processing to yield a multimetal printing form is as described at the beginning of this example.

Instead of a support consisting of layers of aluminum, copper and chromium, a brass foil may be used which is coated with a thin chromium layer.

EXAMPLE 85

A copper plate is bathed for a few seconds in a 1 to 2% ferric chloride solution, rinsed with water, cleaned with powdered chalk, again rinsed, and then dried.

Then a solution consisting of 8 parts by weight of the mixed condensate described below and
100 parts by volume of a mixture of 8 parts by volume of ethylene glycol monomethyl ether and 2 parts by volume of butyl acetate is poured over the plate and the coating is dried by blowing warm air thereon.

After image-wise exposure under a positive screen original, the plate is wiped over for a few seconds with a 10% aqueous solution of n-propanol and developed with the Developer I used in Examples 36 to 43 until the reproduction layer has been removed from the unexposed areas.

After drying, the plate is etched in the normal manner with a 40% iron-III-chloride solution. A half-tone gravure form is thus obtained.

The mixed condensate is prepared as described in Example 84 using, however, the following components and conditions:

32.3 parts by weight of Diazo 2, sulfate (Table 1),
170.0 parts by weight of 86% phosphoric acid, and
32.3 parts by weight of Component $B_1$, No. 48 (Table 1).

The reaction mixture is condensed for 4.5 hours at 40°C., the condensation product is precipitated from an aqueous solution by adding a common salt solution, dissolved again, and reprecipitated with a common salt solution. Final precipitation is in the form of the mesitylene sulfonate. Yield: 55.7 parts by weight. (C 66.7%, N 5.8%, S 4.7%, $OCH_3$ 7.8%; atomic ratio: 40.2 : 3 : 1.06 : 1.82)

The result of the analysis shows that this condensate, too, contains reactive methoxymethyl groups in significant quantities.

By the procedure described in Example 55, printed circuits may be produced using the same coating composition.

EXAMPLES 86 to 98

These examples show the suitability of a series of mixed condensates produced from different components and separated in different forms (light-sensitive sulfonic acids and poly-functional sulfonic acids) for light-sensitive reproduction layers useful in the photomechanical production of planographic printing plates.

It is surprising that the precipitation product of the poly functional mixed condensate and the bivalent sulfonic acids used in Examples 91 and 92 is readily soluble in organic solvents.

Table 7 contains the data concerning the mixed condensates used, the coating solutions, and the development.

In some cases, phosphoric acid was added to the coating solution. The addition of phosphoric acid, e.g., even in quantities from 0.1 to 0.3 mole per mole of diazo groups, has a favorable influence upon the storability of the coated materials and their developing characteristics.

After image-wise exposure under a negative, an image becomes clearly visible which is normally blueish-green, but more brown in the case of Example 91.

Development may be effected using one of Developers I or II described in Examples 36 to 43.

After inking up with greasy ink, printing plates are obtained from which a large number of flawless prints can be made. The printing run may be considerably increased by reinforcing the thoroughly developed printing plate with a conventional lacquer.

The printing plates coated in accordance with Examples 86 to 93 are more light-sensitive than those produced using the formaldehyde condensate of the diazo compound described in Example 1 of U.S. Pat. No. 3,406,159. The most essential increase in light-sensitivity is achieved by Examples 90, 95, and 96, the materials of Examples 95 and 96 being particularly advantageous because of their easier synthesis and the improved solubility of the products. The storability of the printing plates prepared with the two last-mentioned materials is remarkable.

The support used in Examples 86 to 96 was an aluminum foil which had been electrolytically roughened, then anodized, and finally treated with polyvinyl phosphonic acid. In Examples 97 and 98, an aluminum foil was used which had been roughened by means of metal brushes and then treated with polyvinyl phosphonic acid.

In addition to these supports, a series of supports also may be used in combination with the reproduction layers according to the invention, which are recommended for the so-called "wipe-on" process with known diazo resins which are commercially available.

Table 7

| Ex. | Mixed Condensate (MC): Diazo Compound A(D)n | Comp. $B_1$ | Separated in the form of: | Proportion of A(D) to $B_1$ in MC (approx.) | % MC | Coating Solution: Acid Added: | Solvent used (parts b. vol.) | Developer |
|---|---|---|---|---|---|---|---|---|
| 86 | Diazo 2 $HSO_4^-$ | 35 | naphthalene-1-$SO_3$ | 1 : 0.57 | 2 % | — | ethyleneglycol-monomethylether/ butyl acetate 8 : 2 | I or II |
| 87 | do. | 35 | $PF_6^-$ | 1 : 0.42 | 2 % | — | ethyleneglycol-monomethylether/ dimethylformamide 6 : 4 | do. |
| 88 | Diazo 2 $HSO_4^-$ | 36 | naphthalene-1-$SO_3$ | 1 : 0.57 | 2 % | — | ethyleneglycol-monomethylether/ butyl acetate 8 : 2 | do. |
| 89 | do. | 36 | $PF_6^-$ | 1 : 0.31 | 2 % | — | do. | do. |
| 90 | Diazo 2, $H_2PO_4^-$ | 43 | $Cl^-$ | 1 : 0.63 | 2 % | — | do. | do. |
| 91 | Diazo 2, $HSO_4^-$ | 36 | diazidostilbene -disulfonate- | 1 : 1 | 2 % | 0.06 p.b.w. of 86% $H_3PO_4$/p.b.w. MC | do. | do. |
| 92 | do. | 36 | di-tert.butyl-naphthalene-di-$SO_3^-$ | 1 : 0.75 | 2 % | 0.036 p.b.w. of 86% $H_3PO_4$/p.b.w. MC | do. | do. |
| 93 | do. | 36 | naphthalene-2-$SO_3$ | 1 : 0.96 | 2 % | 0.031 p.b.w. of 86% $H_3PO_4$/p.b.w. MC | do. | do. |
| 94 | Diazo 2, $H_2PO_4^-$ | 37 | $Cl^-$ | 1 : 0.77 | 2 % | 0.22 p.b.w. of 86% $H_3PO_4$/p.b.w. MC dimethylformamide | ethyleneglycol-monomethylether/ 6 : 4 | do. |
| 95 | Diazo 2, $HSO_4^-$ | 41 | 2-diazo-1-naphthol-5-SO $_3^-$ | 1 : 1.1 | 2 % | 0.035 p.b.w. 86% $H_3PO_4$/p.b.w. MC | ethyleneglycolmono-methylether/dimethyl formamide 6 : 4 | do. |
| 96 | Diazo 2, | 41 | mesitylene-$SO_3^-$ | 1 : 1 | 2 % | — | ethyleneglycolmono-methylether/butyl acetate 8 : 2 | do. |
| 97 | Diazo 2, $H_2PO_4^-$ | 43 | $Cl^-$ | 1 : 0.63 | 0.4% | 0.355 p.b.w. of p-toluene sulfonic acid $.H_2O$/p.b.w. MC | do. | II |
| 98 | Diazo 2, $H_2PO_4^-$ | 37 | $Cl^-$ | 1 : 0.77 | 0.4% | 0.425 p.b.w. p-toluene sulfonic acid $.H_2O$/p.b.w. MC | do. | II |

The diazo compounds used in Examples 86 to 96 are prepared as follows:

EXAMPLES 86 and 87

Condensation is performed as described in Example 44, using, however, the following conditions and substances:

120.0 parts by weight of 86% phosphoric acid,
32.2 parts by weight of Diazo 2, sulfate, and
8.3 parts by weight of 1,3-dimethyl-4,6-dimethylolbenzene (Component $B_1$, No. 35, Table 1).

The mixture is condensed for 20 hours at 40°C. For Example 86, half of the mixture is dissolved in water, the condensate is precipitated by adding a common salt solution, the precipitate is dissolved in water, and reprecipitated in the form of the naphthalene-1-sulfonic acid salt. Yield: 11.5 parts by weight. (C 65.5%, N 8.0%, S 6.1%; atomic ratio: 28.7:3:1)

The mean molecular weight of the dyestuff produced with phenylmethyl-pyrazolone is 1256.

For Example 87, the other half of the crude condensation mixture is dissolved in water and the corresponding hexafluorophosphate is precipitated by adding hexafluorophosphoric acid. Yield: 21.2 parts by weight. (C 45.4%, N 9.2%; atomic ratio: 17.2:3) The precipitate contains a small quantity of uncondensed diazo compound.

EXAMPLES 88 AND 89

The procedure used in Examples 86 and 87 is repeated, using, however, the following substances and conditions:

120.0 parts by weight of 86% phosphoric acid,
32.3 parts by weight of Diazo 2, sulfate (Table 1), and
11.1 parts by weight of 4,6-diisopropyl-1,3-dimethylolbenzene (Component $B_1$, No. 36, Table 1).

The mixture is condensed for 20 hours at 40°C. For Example 88, half of the mixture is dissolved in water, the condensate is precipitated by adding a common salt solution, the precipitate is dissolved again in water, and then reprecipitated in the form of the naphthalene-1-sulfonic acid salt. Yield: 13.3 parts by weight. (C 66.3%, N 7.5%, S 5.6%; atomic ratio: 31:3:0.98) Mean molecular weight of the pyrazolone dyestuff: 1299.

As Example 89, the second half of the mixture is dissolved in water, and the hexafluorophosphate is precipitated from the solution by adding hexafluorophosphoric acid. Yield: 11.1 parts by weight. (C 52.9%, N 10.7%; atomic ratio: 17.3:3)

The product contains some uncondensed diazo compound.

EXAMPLE 90

The procedure is similar to that described in Example 42, but the following conditions and substances are employed:

200.0 parts by volume of phosphoric acid,
3.23 parts by weight of Diazo 2, phosphate (Table 1), and
1.33 parts by weight of 9,10-bis-methoxymethyl-anthracene (Component $B_1$, No. 43, Table 1), in
20.0 parts by volume of glacial acetic acid.

The second component is dissolved in boiling glacial acetic acid and the solution is then poured into the diazo solution. Condensation extends over 20 hours at 40°C. The condensation product is separated in the form of the chloride. Yield: 2.8 parts by weight. (C 51.1%, N 7.8%; atomic ratio: 23:3)

EXAMPLES 91 AND 92

The condensation product is prepared in a similar manner as in Example 25, employing, however, the following conditions and substances:

240.0 parts by weight of 86% phosphoric acid,
64.6 parts by weight of Diazo 2, sulfate (Table 1), and
44.4 parts by weight of Component $B_1$, No. 36 (see Ex. 88–89).

The mixture is condensed for 20 hours at 40°C. The crude condensation mixture is dissolved in water and the solution is divided into two parts.

From the first half (Example 91), the condensate is precipitated first with hydrochloric acid to yield the chloride, and finally in the form of the 4,4'-diazido-stilbene-disulfonic acid salt. Yield: 41.9 parts by weight. (C 63.7%, N 12.9%, S 4.8%; atomic ratio: 70.6:12.3:2)

From the second half (Example 92), the condensate is directly precipitated as the 2,6-di-tert.butyl-naphthalene-disulfonic acid salt. Yield: 38.3 parts by weight. (C 68.1%, N 7.7%, S 4.9%; atomic ratio: 31:3:0.835)

EXAMPLE 93

Condensation is effected as in Examples 91 and 92. The condensate is precipitated first with hydrochloric acid and then with naphthalene-2-sulfonic acid. (C 68.3%, N 6.6%, S 4.9%; atomic ratio: 36.2:3:0.98)

EXAMPLE 94

A procedure similar to that described in Example 18 is followed, employing, however, the following substances and conditions:

4.85 parts by weight of Diazo 2, phosphate (Table 1),
15.00 parts by volume of methane-sulfonic acid (90%), and
2.04 parts by weight of 1,5-di-acetoxymethyl-naphthalene (Component $B_1$, No. 37, Table 1).

Condensation is effected for 2 hours at room temperature. The condensation product is precipitated in the form of the chloride. Yield: 3.2 parts by weight. (C 64.0%, N 9.4%; atomic ratio: 23.8:3)

EXAMPLE 95

The condensate described in Example 57 is precipitated in the form of the 2-diazo-1-naphthol-5-sulfonic acid salt and dried over phosphorus pentoxide until a constant weight is obtained.

EXAMPLE 96

The condensate corresponds to the one used in Example 57 for the preparation of the azo dyestuff to be fractionated.

EXAMPLE 97

The condensate described in Example 90 is employed.

EXAMPLE 98

The condensate described in Example 94 is employed.

EXAMPLE 99

A screen printing form is prepared as described in Example 53, except that the diazo compound is replaced by the same quantity of the mixed condensate described in Example 82 and the coating solution is diluted with 200 parts by volume of water.

EXAMPLE 100

An aluminum foil, roughened by means of metal brushes, is treated with polyvinyl phosphonic acid as described in U.S. Pat. No. 3,220,832. This plate is then coated with a 0.5% solution of the mixed condensate described in Example 57 (starting material for the preparation of the dyestuff to be fractionated) in an ethyleneglycol monomethylether/butyl acetate mixture (parts by volume: 8 to 2), and the coating is superficially dried.

The plate is then coated with the following solution:

12.0 parts by weight of a diallyl isophthalate prepolymer commercially available under the designation "Dapon M".
55.0 parts by weight of xylene,
33.0 parts by weight of 4-methoxy-4-methyl-2-pentanone
0.1 part by weight of Michler's ketone,
0.1 part by weight of benzil, and
0.4 part by weight of xanthone.

After the plate has dried, it is image-wise exposed under a negative master. It is developed by rinsing it with a suitable solvent, e.g. 1,1,1-trichloroethane. After drying, development is completed with the Developer II described in Examples 36 to 43 and the plate is then inked up with greasy ink. A printing plate is thus obtained which yields longer runs than a printing plate which was produced from a reproduction material without the second coating (of a second reproduction layer). The composition described in this example displays a relatively good light-sensitivity, because the mixed condensate contained in the first layer has a higher light-sensitivity.

Instead of the coating solution just described, a corresponding solution of polyvinyl cinnamate may be used for the second coating, which has been made sensitive to light of a longer wave-length by the addition of 5% of Michler's ketone.

EXAMPLE 101

The support used in Examples 1 to 35 is coated with a 1 per cent aqueous solution of the diazo mixed condensate described below, to which 50 % by weight -based on the weight of the mixed condensate - of a 85% phosphoric acid has been added. (The coating solution is somewhat turbid.)

After drying, the material is image-wise exposed and then developed as described in Examples 1 to 35, to yield a printing plate of good ink-receptivity.

The mixed condensate is prepared as follows:

4.6 parts by weight of diphenylamine-4-diazonium sulfate and 2.2 parts by weight of 3-amino-pyrene are dissolved, with gentle heating, in 30 parts by volume of 90% methane sulfonic acid. After cooling down to room temperature, 0.75 part by weight of paraformaldehyde is added with stirring. After stirring for another 3.5 minutes, the crude product is immediately introduced into aqueous hydrochloric acid heated to 90°C. (200 parts by volume of water and 100 parts by volume of 18% aqueous hydrochloric acid). After rapidly cooling in an ice bath, the precipitate is filtered off with suction, washed with 0.5 N hydrochloric acid and dried. Yield: 4.8 parts by weight. According to analysis, the product has an atomic ratio of C:N = 31.4:4, whereas the diazo homocondensate will have a ratio of 17.3:4 and the amine homocondensate one of 68:4 (C 65.1%, N 9.7%)

EXAMPLE 102

An electrolytically roughened aluminum support is coated with the following composition and the coating is then dried:

- 5.0 parts by weight of polyvinyl alcohol (saponification degree: 88%; viscosity of a 4% aqueous solution at 20°C: 6.5 to 8.8 cP),
- 0.5 part by weight of the diazo mixed condensate described below, and
- 94.5 parts by weight of water.

AFter image-wise exposure, development is effected by rinsing with water. By dyeing with an aqueous solution of Crystal Violet (C.I. 42555), a blue-colored tanned image is obtained.

A mechanically roughened polyethylene terephthalate film may also be used as the support.

The mixed condensate is prepared as follows:

8.5 parts by weight of 2-phenyl-amino-pyridine are dissolved in 50 parts by volume of 80% sulfuric acid at a temperature not exceeding 35°C. The solution is cooled down to 15° – 20°C. and, during 10 minutes, a mixture of 15 parts by weight of 97.6% diphenylamine-4-diazonium sulfate and 3 parts by weight of paraformaldehyde is added with stirring. The mass is stirred for another three hours at room temperature and left standing for 14 hours. For separation of the mixed condensate, it is diluted, with cooling, with 70 parts by volume of methanol and stirred into 700 parts by volume of isopropanol. The product is filtered off by suction and suspended and washed twice in 500 parts by volume of isopropanol. Yield: 25.6 parts by weight, as the sulfate. According to analysis, the product contains about 0.8 mole of the second component per mole of diazo compound. (N 10.4%, ND 4.6%; atomic ratio: 4.52:2)

EXAMPLE 103

For the preparation of a screen printing stencil, the following procedure is employed:

90 parts by weight of polyvinyl alcohol (viscosity of a 4% aqueous solution at 20°C.: 8 to 11 cP) are dissolved in 423 parts by weight of water. Then 15 parts by weight of finely distributed silica, 30 parts by weight of dibutyl phthalate, and 0.5 part by weight of Crystal Violet are added while stirring.

30 parts by weight of this mass are diluted with 10 parts by weight of water and then mixed with a solution containing 1 part by weight of the mixed condensate described in Example 80 in a mixture consisting of 6.3 parts by weight of ethyleneglycol monomethylether and 3.7 parts by weight of water. A screen is coated in known manner with this composition. By image-wise exposure of the negative-working reproduction layer and development with a water-spray, a screen printing stencil is produced.

EXAMPLE 104

This example proves that the oleophilic properties of the exposure products of the novel diazo condensates are distinctly perceptible even under extreme conditions:

A superficially saponified cellulose acetate film is coated, by swabbing, with a solution containing 2 parts by weight of the crude condensate described below in 98 parts by weight of water, and the coating is dried. Despite the fact that the solution is highly diluted and contains about 75 molecules of phosphoric acid per diazo group, the image areas of the image-wise exposed foil repel the water when the foil is wiped over with water, but accept greasy ink.

For comparison, a plate is coated in a similar manner with a solution containing a quantity of diazo groups which is equivalent to that of the above-described coating solution, but for which a formaldehyde condensate was used as diazo compound, which was prepared as described in Example 1 of U.S. Pat. No. 3,406,159, with no second component taking part in the reaction. The relation of diazo groups to phosphoric acid was adjusted to the same value as in the above mixture containing the mixed condensate.

After image-wise exposure, both the unexposed and the exposed areas of the layer are hydrophilic. The exposure products can not be inked up with greasy ink.

The diazo mixed condensate is prepared as follows:

1.29 parts by weight of 3-methoxy-diphenylamine-4-diazonium phosphate are dissolved in 33.8 parts by weight of 86% phosphoric acid. At room temperature, first 0.36 part by weight of paraformaldehyde and immediately thereafter 0.68 part by weight of thiophene are added with vigorous stirring. The mixture is stirred for 3 hours at room temperature and then allowed to stand overnight. With the exception of a slight deposition of resin at the stirrer, the crude condensate formed is clear and forms a clear solution in water. The crude condensate is used in this form for the preparation of the coating solution.

EXAMPLE 105

The procedure used in Example 85 is repeated, except that the coating solution used is a solution of 6 parts by weight of the mixed condensate described in Example 19 in 12 parts by weight of an ethyleneglycol monomethyl ether/butyl acetate mixture (proportion by volume: 8:2).

After image-wise exposure under a positive screen, the material is developed with the Developer II stated in Examples 36 to 43. By treatment with a 40% aqueous solution of iron-III-chloride, the copper in the unexposed areas is deep-etched. For decoating, the material is wiped over with dimethyl formamide. A half-tone gravure plate is thus obtained.

When the material is exposed under a negative and further processed appropriately, a positive relief printing form may be obtained.

EXAMPLE 106

This example shows that mixed condensates containing only very little diazo compound still yield useful reproduction materials.

An electrolytically roughened aluminum foil is coated with a 2 per cent ethyleneglycol monomethyl ether solution of a mixed condensate (which according to analysis contains about 18 p-cresol units per unit of 3-methoxy-4-diazo-diphenylamine) and the coating is then dried.

After image-wise exposure under a negative original, the foil is developed by rinsing it with acetone, dried, wiped over with water, and inked up with greasy ink.

A positive printing form is thus obtained which shows a slight scum, but may be cleaned by wiping over with a solution containing 75 parts by volume of water, 35 parts by volume of n-propanol, and 2 parts by weight of $NaH_2PO_4 \cdot 2 H_2O$.

When a condensate consisting only of p-cresol units is prepared under identical conditions and a quantity of 3-methoxy-diphenylamine-4-diazonium chloride corresponding to the quantity of diazo compound incorporated above is added afterwards, a mixture is obtained from which a reproduction layer is produced which also yields a scumming positive printing form by image-wise exposure and development with acetone. However, in an attempt to clean this printing form by wiping it with the solution described above, this printing form is completely destroyed.

Even when ten times the quantity of diazo compound is added afterwards, no better results are obtained.

For the preparation of the mixed condensate, 0.323 part by weight of Diazo 2, sulfate (Table 1) is dissolved in 100 parts by volume of 86% phosphoric acid and this solution is mixed, while vigorously stirring, with a solution of 3.36 parts by weight of 2,6-dimethylol-4-methyl phenol in 20 parts by volume of warm methanol. At the instant of mixing, a clear solution is formed which rapidly becomes turbid while the condensate precipitates. After stirring for 1 hour and allowing to stand overnight, the mass was diluted with 400 parts by volume of water and mixed with 150 parts by volume of saturated common salt solution. The precipitate was drawn off by suction, washed neutral with water, and dried. Yield: 2.8 parts by weight. (C 71.0%, N 1.4%; atomic ratio: 177:3)

An analysis of the 2,6-dimethylol-p-cresol homocondensate prepared under identical conditions yielded the following values: C 71.6%, H 7.1%. This analysis indicates a dibenzylether-like linkage of the units.

EXAMPLE 107

For the photomechanical preparation of a screen printing stencil, the following procedure is used:

120 parts by weight of a 25% aqueous solution of polyvinyl alcohol (residual acetate content: less than 2 per cent; viscosity of a 4% aqueous solution at 20°C.: 17 - 23 cp) were thoroughly mixed with 100 parts by weight of an aqueous dispersion of a copolymer on the basis of vinyl acetate/maleic acid ester (protective colloid: polyvinyl alcohol; solids content: 55%; viscosity 5 - 25 poises measured by a Hoppler viscosimeter).

100 parts by weight of this emulsion are thoroughly mixed with a solution of 1.5 parts by weight of the mixed condensate described in Example 44 in 10 parts by volume of water. The emulsion thus prepared is used in known manner for the coating of screens from which screen printing stencils are produced photomechanically. The layers possess an exceptionally good light-sensitivity.

As compared with known screens sensitized by means of chromates, these screens are distinguished by a considerably improved storability at room temperature.

The novel diazonium salts may also be used for sensitizing commercial pre-coated, but not yet sensitized screens.

The above-mentioned unsensitized emulsion, e.g., was applied to a screen and dried, and the layer thus produced was then thoroughly wetted with a 5% solution of the mixed condensate described in Example 44 in a 1:1 mixture of methanol and water. After drying, a screen printing stencil was obtained by the usual method.

Examples 108 to 117 show again the good oleophilic properties of the exposure products of some of the diazo mixed condensates when applied to superficially saponified cellulose acetate film. The mixtures obtained during condensation are diluted and then directly used for coating, in order to show that the inventive effect can be produced without separation of the high quantities of acid present. Of course, still better results are achieved when lower quantities of acid are added. For practical purposes, acid additions of less than 3 moles of acid per mole of diazo groups will be preferred for this type of support.

Detailed data concerning the condensation procedure and the coating solutions are listed in Table 8.

Examples 111, 113, 115, 116, and 117 yielded the most favorable results. Due to their high acid content, Examples 109 and 110 showed the weakest effects.

For comparison, a condensation product is prepared analogously to Example 1 of U.S. Pat. No. 3,406,159 from Diazo 2, chloride (Table 1) and formaldehyde in 2.8 basic moles of phosphoric acid, and the phosphoric acid content is then adjusted to 15 basic moles. Superficially saponified cellulose acetate films coated with a 1 % and a 10% aqueous solution of this mixture, respectively, show almost no ink-receptivity in the image areas after image-wise exposure and development with water.

Table 8

| Example | Mixed Condensate | | | | Coating Solution | | Developer |
|---|---|---|---|---|---|---|---|
| | Diazo Compd. | Component $A(-D)_n$ | Approx. Ratio of $B_1$ in Cond. Mixture | Mole $H_3PO_4$ $A(-D)_n$ and $B_1$ groups (approx.) | Percentage of per mole diazo Condensate | Solvent Crude | |
| 108 | Diazo-2-sulfate | 54 | 1 : 1 | 15 | 1 % | $H_2O$ | $H_2O$ |
| 109 | do. | 49 | 1 : 1 | 150 | 10 % | $H_2O$/methanol 1 : 1 | $H_2O$ |
| 110 | do. | 50 | 1 : 1 | 130 | 10 % | $H_2O$/methanol 1 : 1 | $H_2O$ |
| 111 | do. | 51 | 1 : 1 | 15 | 2 % | $H_2O$ | $H_2O$ |

Table 8 – Continued

| Example | Mixed Condensate | | | | Coating Solution | | Developer |
|---|---|---|---|---|---|---|---|
| | Diazo Compd. | Component $A(-D)_n$ | Approx. Ratio of $B_1$ in Cond. Mixture | Mole $H_3PO_4$ $A(-D)_n$ and $B_1$ groups (approx.) | Percentage of per mole diazo Condensate | Solvent Crude | |
| 112 | do. | 57 | 1 : 1 | 15 | 2 % | $H_2O$ | $H_2O$ |
| 113 | do. | 55 | 1 : 1.3 | 20 | 2 % | $H_2O$ | $H_2O$ |
| 114 | do. | 56 | 1 : 1 | 20 | 2.5% | $H_2O$ | $H_2O$ |
| 115 | do. | 52 | 1 : 1 | 32 | 4 % | $H_2O$ | $H_2O$ |
| 116 | do. | 53 | 1 : 1 | 80 | 2% and 10% | $H_2O$ | $H_2O$ |
| 117 | do. | 58 | 1 : 1 | 42 | 2 % | $H_2O$ | $H_2O$ |

The mixed condensates are prepared as follows:

EXAMPLE 108

Preparation of Component $B_1$ 12.4 parts by weight of 4,4'-dimethyldiphenylether are dissolved in 27 parts by volume of glacial acetic acid, and then first 5.7 parts by weight of paraformaldehyde, then 28 parts by weight of 63% aqueous hydrobromic acid solution, and finally 16.5 parts by weight of 95% sulfuric acid are added to the solution while stirring. After heating for 2 hours to 90° - 95°C., the mixture is allowed to cool overnight.

The crystals contained in the mixture are drawn off by suction, washed with water, and recrystallized from acetone without intermediate drying. Yield: 14.75 parts by weight. Melting point: 109° - 110°C.

The compound is dissolved in benzene and the solution is then introduced into a boiling solution of caustic soda in methanol (large excess of NaOH). After heating for two hours with reflux, the solution is mixed with water, the benzene phase is separated, washed, dried, and evaporated.

9.2 parts by weight of an oily substance are obtained (Component $B_1$, No. 54). ($OCH_3$ content: 21.7%)

4.85 parts by weight of Diazo 2, sulfate (Table 1) are dissolved in 15 parts by volume of 86% phosphoric acid, and 4.3 parts by weight of the above described Component $B_1$, No. 54, are added to the solution while stirring. A clear, homogeneous reaction mixture is obtained. After condensing for 5 hours at 40°C., the mass is dissolved in water and the condensation product is precipitated in the form of the chloride by adding an aqueous common salt solution.

Yield: 6.9 parts by weight. (C 65.0%, N 7.4%; atomic ratio: C : N = 30.8 : 3)

EXAMPLE 109

Component $B_1$, No. 49, is prepared from the potassium salt of p-hydroxy-benzaldehyde and 2,2'-dichlorodiethyl ether (cf. "Makromolekulare Chemie," Vol. 17, page 156, 1955-56) and subsequent reduction with sodium boronhydride in a water-methanol mixture.

For the preparation of the condensate, 1.62 parts by weight of DIazo 2, sulfate (Table 1) are dissolved in 50 parts by volume of 86% phosphoric acid and this solution is then mixed with a solution of 1.6 parts by weight of Component $B_1$, No. 49, in 5 parts by volume of almost boiling glacial acetic acid. After 5 hours' condensation at 40°C. and standing overnight, a crude condensate is formed which is used for the preparation of the coating solution.

EXAMPLE 110

Component $B_1$, No. 50, is prepared analogously to Component $B_1$, No. 49, from the potassium salt of p-hydroxy-benzaldehyde and 1,3-dibromo-propane, and subsequent reduction of the dialdehyde produced to the di-alcohol by means of sodium boronhydride.

For the preparation of the condensation product, 0.213 part by weight of Diazo 2, sulfate (Table 1 ) is dissolved in 1.5 parts by volume of 93% phosphoric acid and mixed with a hot solution of 0.19 part by weight of Component $B_1$, No. 50, in 1 part by volume of glacial acetic acid. After the addition of 3.5 parts by volume of 93% phosphoric acid, the mixture is maintained for 5 hours at a temperature of 40°C. The clear crude condensate which forms is used for preparing the coating solution.

EXAMPLES 111 and 112

For the preparation of Component $B_1$, No. 51, 100 parts by weight of diphenylene oxide are bromomethylated, analogously to Example 108, in a mixture of 300 parts by volume of glacial acetic acid, 54 parts by weight of paraformaldehyde, 500 parts by weight of 63% hydrobromic acid, and 294 parts by weight of 96% sulfuric acid at a temperature of 75°C., and the reaction product is then recrystallized from acetone, (bis-bromomethyl-diphenyleneoxide: calculated values - C 47.5%, Br 45.3%; values found: C 47.7%, Br. 46.2%) and then caused to react with excess caustic soda solution in methanol.

For the preparation of the condensation product, 16.2 parts by weight of Diazo 2, sulfate (Table 1) are dissolved in 50 parts by volume of 86% phosphoric acid and 12.8 parts by weight of Component $B_1$, No. 51, are heated to 35°C and then added dropwise.

The mixture is condensed for 5 hours at 40°C. The clear crude condensate is used directly for the experiment. The remainder of the mixture (less 0.2 part by weight) is dissolved in water, and the reaction product is precipitated from the aqueous solution by the addition of a common salt solution. Yield: 22.6 parts by weight. ( C 65.7%, N 8.2%; atomic ratio: 28 : 3)

Component $B_1$, No. 57, and the condensation product prepared therefrom, which is used in Example 112, are prepared analogously to Example 111, except that dibenzothiophene is used as the starting material.

EXAMPLES 113 and 114

For the preparation of Component $B_1$, No. 55, thymylphenyl ether prepared in accordance with "Liebig's Annalen der Chemie", vol. 350, page 89 (1906) is bromomethylated for 3.5 hours at 90° - 95°C analogously to Example 108 and the reaction product obtained is reacted with caustic soda solution in methanol without further purification. The reaction product thus obtained, which is a viscous oil, has an $OCH_3$ content of 18.6%.

For the preparation of the condensate, 4.85 parts by weight of Diazo 2, sulfate (Table 1) are dissolved in 20 parts by volume of 86% phosphoric acid, 6.0 parts by weight of Component $B_1$, No. 55, are added, and the mixture is condensed for 4 hours at 40°C.

The crude condensate thus obtained (1 part by weight) was used for the preparation of the coating solution. the remainder is dissolved in water and the condensation product is precipitated in the form of the chloride by adding a common salt solution. Yield: 9 parts by weight. (C 66.9%, N 6.7%; atomic ratio: 35 : 3)

The condensate used in Example 114 is prepared analogously to Example 113, except that 3-bromo-4-methoxy-diphenylether (prepared in accordance with J. Am. Chem. Soc. 61, 2702, 1939) is used as the starting material for the preparation of Component $B_1$, No. 56.

EXAMPLE 115

For the preparation of Component $B_1$, No. 52, diphenyl methane is bromomethylated for 5 hours at 90° – 95°C in analogy to Example 108, and the pure 4,4'-bis-bromomethyl-diphenylmethane (melting point 153° – 154°C) obtained by recrystallization from benzene is then reacted with sodium hydroxide in methanol.

For the preparation of the condensate, 4.85 parts by weight of Diazo 2, sulfate (Table 1) are dissolved in 15 parts by volume of 86% phosphoric acid and 3.85 parts by weight of Component $B_1$, No. 52, are added dropwise. After adding 15 parts by volume of 93% phosphoric acid, the mixture is condensed for 10 hours at 40°C.

2 parts by weight of the crude condensate are used for the preparation of the coating solution. The remainder is dissolved in water and a common salt solution is added to precipitate the condensate in the form of the chloride, which is then separated and dried. (C 68.6%, N 8.0%; atomic ratio: 30 : 3)

EXAMPLE 116

For the preparation of Component $B_1$, No. 53, diphenyl is bromomethylated for 5 hours at 90° – 92°C in analogy to Example 108, and the component of the reaction product which is sparingly soluble in acetone is reacted with sodium hydroxide and methanol ($OCH_3$ content: 23.8%).

For the preparation of the condensate, 6.4 parts by weight of Diazo 2, sulfate (Table 1) are dissolved in 50 parts by volume of 86% phosphoric acid, and 4.8 parts by weight of Component $B_1$, No. 53, are dissolved in 10 parts by volume of warm methanol and this solution is added to the diazo solution. After heating for 2 hours to 40°C, 50 parts by volume of 93% phosphoric acid are added to the mixture which is condensed for 12.5 hours at 40°C.

A sample of the crude condensate is used for the preparation of the coating solution. The remainder is dissolved in water, and hydrochloric acid is added to the aqueous solution to precipitate the chloride of the condensate, which is then separated and dried. (C 68.2%, N 8.2%; atomic ratio: C : N = 29.1 : 3)

EXAMPLE 117

For synthesizing Component $B_1$, No. 58, 1.4-diphenoxy-benzene prepared in accordance with "Liebig's Annalen der Chemie," vol. 350, pages 98 (1906) is bromomethylated for 3 hours at 90° – 92°C analogously to Example 108 and the reaction product obtained is reacted with methanolic caustic soda solution. ($OCH_3$ content: 19.2%)

For the preparation of the mixed condensate, 2.3 parts by weight of Diazo 2, sulfate (Table 1) are dissolved in 20 parts by volume of 86% phosphoric acid, and 2.3 parts by weight of Component $B_1$, No. 58, are added as a hot solution in 1 part by volume of glacial acetic acid. After condensing for 6 hours at 40°C and standing overnight, a crude condensate has formed which is used for preparing the coating solution.

The mixed condensate may be precipitated from an aqueous solution by adding hydrochloric acid, methane sulfonic acid, or benzene sulfonic acid, e.g.

EXAMPLE 118

The diazo mixed condensate described in Example 57, in the form of the chloride, is dissolved in water and the aqueous solution is then added to an aqueous solution of sodium azide. The azide, which precipitates with the evolution of nitrogen, is dissolved in toluene, and a 1 per cent toluene solution prepared in this manner is used for sensitizing an aluminum foil precoated with polyvinyl phosphonic acid.

After image-wise exposure under a negative original, a brownish image becomes visible. By development with the developer described in Example 1 of U.S. Pat. No. 2,994,609, an offset printing form having good oleophilic properties is produced.

EXAMPLE 119

An aluminum support which has been roughened by wire brushes and pretreated with polyvinyl phosphonic acid in accordance with U.S. Pat. No. 3,220,832 is sensitized with a blue-colored sensitizing solution of the following composition:

| | |
|---|---|
| 0.55 | part by weight of the mixed condensate described in Example 57, |
| 1.65 | parts by weight of a polyvinyl formal resin (Formvar) containing 5.5 – 7.0% of hydroxyl groups, 22 – 30% of acetate groups ($CH_3COO—$), and 50% of formal groups and having a viscosity of 18 – 22 cp (5% solution in ethylenechloride, measured by means of an Ostwald viscosimeter), |
| 0.10 | part by weight of Crystal Violet, |
| 0.55 | part by volume of 1 M ortho-phosphoric acid, |
| 60.00 | parts by volume of ethyleneglycol monomethyl ether, |
| 32.00 | parts by volume of tetrahydrofurane, and |
| 8.00 | parts by volume of ethyleneglycol methylether acetate. |

After drying, the coated aluminum foil is insensitive to humidity and has an excellent shelf-life, so that it can be stored for many months, if kept in the dark.

For the preparation of a printing form, the material is exposed for 1 minute under a conventional xenon lamp, developed with the Developer II mentioned in Examples 36 – 43, to which 30% of n-propanol have been added, and then inked up in the customary manner with greasy ink. The printing form thus produced may be used for printing approximately 100,000 prints in an offset machine.

EXAMPLES 120 and 121

Aluminum foil roughened by means of metal brushes and precoated with polyvinyl phosphonic acid is coated with solutions of the following compositions the coatings are dried.

| | 120 | 121 |
|---|---|---|
| MC of Example 115 (chloride) | 0.83 p.b.w. | – |

-Continued

| | 120 | 121 |
|---|---|---|
| MC of Example 116 (chloride) | — | 0.81 p.b.w. |
| p-toluenesulfonic acid · 1 $H_2O$ | 0.3 p.b.w. | 0.3 p.b.w. |
| mixture of 80 p.b.v. of ethylene glycol monomethylether and 20 p.b.v. of butyl acetate | 100 p.b.v. | 100 p.b.v. |

After image-wise exposure under a screen negative development is performed with one of the developers given in Examples 36 to 43 and the foil is inked up with greasy ink. Efficient printing forms with good oleophilic properties are obtained.

For the described reproduction materials, about one quarter of the exposure time required for a material according to Example 45, Test 1, which contains a formaldehyde condensate of the same diazo compound but without second component, is sufficient.

It is possible to satisfactorily process the presensitized printing plates produced according to Examples 120 and 121 into printing forms, even if they have been heated for 6 hours to 100°C. before exposure to light.

The printing forms can be improved in their efficiency in the usual manner by lacquering.

The mixed condensates used in Examples 120 and 121 also may be first isolated as salts of organic sulfonic acids and then be employed, as it is already described as a particularly advantageous modification in the case of the corresponding condensation products of the bis-methoxymethyl-diphenylether (Example 57) and the bis-methoxymethyl-diphenylsulfide (Example 65).

As sulfonic acids for the separation of the condensation products, there are preferably used in this connection aromatic monosulfonic acids, i.e. such of the benzene and naphthalene series containing up to 12 carbon atoms, e.g. benzene sulfonic acid, toluene sulfonic acid, mesitylene sulfonic acid, p-chloro-benzene sulfonic acid, p-methoxybenzene sulfonic acid, naphthalene-1-sulfonic acid, and naphthalene-2-sulfonic acid; especially advantageous are the mesitylene sulfonic acid and the naphthalene-2-sulfonic acid.

The condensates of 3-methoxy-diphenylamine-4-diazonium salts described in Examples 65 (1:1 condensate), 120, and 121, in the form of the salts of such sulfonic acids, are, similarly to the corresponding condensation products with bis-methoxymethyl-diphenylether, particularly suitable for the combination with resins insoluble in water, as they are described in Example 57, to produce storable and especially efficient presensitized planographic printing plates.

Particularly long printing runs are obtained also in this case by the addition of polyvinyl formals, e.g. when the coating solution is prepared analogously to Example 119, with the exception that, instead of the mixed condensate used there, the same quantity of the mesitylene sulfonates of the diazo condensates according to Examples 65, 120, or 121 is used.

As described in Example 57, the mesitylene sulfonates of the diazo condensates are prepared from the corresponding chlorides.

For developing the image-wise exposed plates, it is possible to use the Developer II mentioned in Examples 36 to 43, to which about 30 per cent of n-propanol are advantageously added.

The following examples show the suitability of a number of further compounds for the production of mixed condensates.

EXAMPLE 122

An intimate mixture of 10.8 parts by weight of 3-methoxy-diphenylamine-4-diazonium chloride (Diazo 2, chloride, Table 1) (97.3 %) and 0.96 part by weight of paraformaldehyde is introduced with stirring into 11.8 parts by weight of 93 % phosphoric acid. 1.57 parts by weight of 2,6-bis-(methoxymethyl)-4-methyl-phenol (Component $B_1$, No. 59, Table 1) are then added with adequate stirring. The mixture is then condensed with stirring for 24 hours at 40°C and a crude condensate is obtained which forms a clear solution in water and does not lose this property even after storage for several months at room temperature.

If, however, 2,6-bis-(methoxymethyl)-4-methyl-phenol is introduced into the phosphoric acid in the absence of diazo compound and of formaldehyde, the product rapidly dissolves but, after several seconds, a condensation product very scarcely soluble in the acid and in hot water separates.

EXAMPLE 123

32.3 parts by weight of 3-methoxy-diphenylamine-4-diazonium sulfate (Diazo 2, sulfate, Table 1) are dissolved in 200 parts by weight of 86 % phosphoric acid. While vigorously stirring, 8.5 parts by weight of molten diphenyl ether (Component B, No. 60, Table 1) are added, and then, over 10 minutes, 3.0 parts by weight of paraformaldehyde are added in portions. After condensing for 1.5 hours at room temperature and 15 hours at 40°C, the mixture is poured into water and the water-insoluble components are removed after adding characoal. By adding a saturated common salt solution to the aqueous solution, the condensation product is precipitated in the form of the chloride and is then again reprecipitated by means of a common salt solution from water. Yield after drying under reduced pressure: 18.3 parts by weight (C 54.2 %, N 10.2 %; atomic ratio: 18.55 : 3). From the analysis it can be assumed that the diazo compound and the second component are contained in the condensate at a molar ratio of about 1 : 0.4. The average molecular weight of the azo dyestuff produced with 1-phenyl-3-methyl-pyrazolone-(5), determined by the method described in Example 57, is 1611.

EXAMPLE 124

32.3 parts by weight of 3-methoxy-diphenylamine-4-diazonium sulfate (Diazo 2, sulfate, Table 1) are dissolved in 180 parts by volume of 93 % phosphoric acid. Separately, 17 parts by weight of diphenyl ether (Component B, No. 60, Table 1) are dissolved in 34 parts by weight of glacial acetic acid. While stirring, the latter solution is poured, together with 45 parts by weight of a 40 % aqueous formaldehyde solution, into the solution of the diazo compound. The mixture is stirred for 6.5 hours without additional heat supply and then allowed to stand overnight. The very turbid crude condensate is introduced into 1,000 parts by volume of water, extracted by shaking with ether, and treated with so much charcoal that a clear filtrate is obtained. The condensate is separated from the filtrate by adding zinc chloride and common salt. Yield: 27 parts by weight (C 47.5 %, N 8.1 %; atomic ratio: 20.6 : 3). This means that the mixed condensate has an excess content of 7.6 gram atoms of carbon per mole of diazo compound.

The condensation products prepared according to Examples 123 and 124 yield printing forms of good ink receptivity when used as described in detail in Examples 1 to 35.

EXAMPLE 125

A mixture of the following components is condensed as described in Example 65:

| | a) | b) |
|---|---|---|
| 4-diazo-diphenylamine-3-carboxylic acid (inner salt) (Diazo 12, inner salt, Table 1) | 5.5 p.b.w. | 11.0 p.b.w. |
| 86 % phosphoric acid | 51.0 p.b.w. | 51.0 p.b.w. |
| 4,4-bis-(methoxymethyl)-diphenylether (Component $B_1$, No. 41, Table 1) | 5.2 p.b.w. | 5.2 p.b.w. |

The clear crude condensates are introduced a) into 290 parts by volume of methanol and b) into 370 parts by volume of methanol, and the precipitates formed are washed a) with 80 parts by volume of methanol and b) three times 100 parts by volume of methanol, and then dried.

a) 8 parts by weight (C 59.1 %, N 6.1 %, P 5.6 %; atomic ratio: 34 : 3 : 1.25)
b) 6.8 parts by weight (C 63.5 %, N 7.3%, P 3.3 %; atomic ratio: 30.4 : 3 : 0.61)

From the result of the analysis, it can be assumed that the diazo compound and the second component are present in the condensate in a proportion of about 1 : 1.5 (in the case of a) and about 1 : 1.24 (in the case of b).

EXAMPLE 126

15.42 parts by weight of diphenylamine-4-diazonium sulfate (Diazo 1, sulfate, Table 1) are dissolved in 100 parts by volume of 96.5 % phosphoric acid and 7.4 parts by weight of dimethyloloxamide (Component $B_1$, No. 61, Table 1) are then added with stirring in small portions. Condensation is carried out for 24 hours at room temperature. THe condensation mixture is dissolved in 0.5 liter of water and 80 parts by volume of 50 % zinc chloride solution are slowly added dropwise with stirring at 40°C. After cooling down to +10°C, the precipitate is filtered by suction, again dissolved in 0.5 liter of water at 50°C, the product is again precipitated by adding dropwise zinc chloride solution (45 parts by volume) and isolated as described above. Yield: 16.3 parts by weight. According to analysis, the condensation product contains 3 N atoms per 10.6 C atoms. (C 43.0 %, N 14.2 %). The diazo homocondensate would have a C : N ratio of 13 : 3.

EXAMPLE 127

30.9 parts by weight of diphenylamine-4-diazonium sulfate (Diazo 1, sulfate, Table 1) (95 %) and 14.4 parts by weight of adipic acid diamide (Component B, No. 62, Table 1) are mixed and the mixture is dissolved in 200 parts by volume of 90 % methane sulfonic acid. 6 parts by weight of paraformaldehyde are added with stirring within 10 minutes and the mixture is condensed for 24 hours at room temperature. THe crude condensate is dissolved in 750 parts by volume of water, 25 parts by weight of zinc chloride (anhydrous) are also dissolved, and the zinc chlroide double salt of the condensation product is precipitated by the additionn of 10 parts by volume of ethanol and 100 parts by volume of 36.5 % hydrochloric acid. The product is filtered by suction, washed with 300 parts by volume of 2 N aqueous hydrochloric acid and dried at +35°C. Yield: 45.2 parts by weight. According to analysis, the condensation product contains about 0.5 mole of acid amide per mole of diazo compound.

EXAMPLE 128

15.42 parts by weight of diphenylamine-4-diazonium sulfate (Diazo 1, sulfate, Table 1) (95 %) are dissolved in 100 parts by volume of methane sulfonic acid (90 %). 10.8 parts by weight of finely powdered dimethylol adipic acid diamide (Component $B_1$, No. 63, Table 1)(94.7 %) are added in portions with adequate stirring. When the slight spontaneous heating caused by the reaction has vanished, the mass is condensed for 25 hours at room temperature. The crude condensate is dissolved in 500 parts by volume of water. By the addition of 80 parts by volume of 50 % zinc chloride solution, the condensate separates as a tacky precipitate at room temperature. The mother liquor is decanted, the precipitate is dissolved in 500 parts by volume of water at 50°C and again precipitated after cooling down to +10°C by the addition of 50 parts by volume of 50 % zinc chloride solution. The product is filtered by suction and dried under reduced pressure. According to analysis, the condensate contains about 0.7 molecule of the acid amide per molecule of diazo compound.

EXAMPLE 129

4.47 parts by weight of diphenylamine-4-diazonium phosphate (Diazo 1, phosphate, Table 1) (98.4 %) are dissolved in 60 parts by volume of 92 % phosphoric acid. 4.85 parts by weight of trimethylolcitramide (Component $B_1$, No. 64, Table 1) (86.3 %, remainder water) are then added and the mass is condensed for 45 hours at room temperature. The condensation mixture forming a clear solution in water is diluted with 30 parts by volume of methanol and the mixture is stirred into 500 parts by volume of isopropanol. The precipitating reacting product is filtered by suction and dried under reduced pressure. Yield: 10.8 parts by weight. According to analysis, the ratio N : C is 3 : 10.8 (C 28.8 %, N 9.3 %)

EXAMPLES 130 and 131

In these examples, it is shown how two further diazo compounds (Nos. 13 and 14, Table 1) may be condensed with a component $B_1$ in an acid condensation medium to form mixed condensates.

In both examples, the diazo compounds are dissolved in the condensation medium in the form of their metal halide double salts. Dry air is passed through the mixture until hydrogen chloride ceases to escape. Then the second component is added and condensation is effected at room temperature for the periods of time stated. Mixed condensates result which form clear solutions in water.

If the component $B_1$ is introduced alone into the condensation medium, a homocondensate of component $B_1$ is formed during a condensation process of the same duration, which separates readily from the condensation mixture and is not dissolved by the addition of water.

In the following table, the quantities used and the duration of the condensation process are stated:

| | Example 130 | Example 131 |
|---|---|---|
| Condensation Medium: | 90% methane sulfonic acid (10 p.b.v.) | 90% methane sulfonic acid (10 p.b.v.) |
| Diazo Compound: | 2,5-dimethoxy-4-(N-methyl-N-phenyl-mercaptoacetylamino)-benzene diazonium chloride + ½ mole of zinc chloride (N 8.8%) (0.95 p.b.w.) | 4-[N-methyl-N-(β-phenyl-mercaptoethyl)-amino]-benzene diazonium chloride + ½ mole of tin tetrachloride (N 6.3%) (1.33 p.b.w.) |
| Second Component: | 1,4-bis-hydroxymethyl-benzene (0.14 p.b.w.) (Component $B_1$, No. 38, Table 1) | 1,4-bis-hydroxymethyl-benzene (0.14 p.b.w.) (Component $B_1$, No. 38, Table 1) |
| Duration of Condensation Process: | 4 hours | 4 hours |

EXAMPLES 132 to 137

In each of the following examples, 0.74 part by weight of diphenylamine-4-diazonium sulfate (Diazo 1, sulfate, Table 1) (2.5 millimoles) are dissolved in as much of 90 % methane sulfonic acid as to yield 5 parts by volume of solution. The respective second component (2.5 millimoles) is mixed with 0.5 part by volume of a 30 % aqueous formaldehyde solution, the mixture is heated for a few seconds on a steam bath, and then dissolved in as little organic solvent as possible, if necessary while heating.

Half the solution of the second component is then introduced, with stirring, into the diazo solution first prepared (Test Series a). The other half of the solution of the second component is added to 5 parts by volume of 90 % methane sulfonic (Test Series b - blank test). After standing for about 20 hours, the resulting reaction mixtures are first estimated visually and then further processed.

Solutions of Components B (Second Components)

| Example: | 132 (p.b.w.) | 133 (p.b.w.) | 134 (p.b.w.) | 135 (p.b.w.) | 136 (p.b.w.) | 137 (p.b.w.) |
|---|---|---|---|---|---|---|
| p-toluenesulfonic acid anilide (Component B, No.65, Table 1) | 0.62 | — | — | — | — | — |
| p-toluenesulfonic acid ethylamide (Component B, No.66, Table 1) | — | 0.5 | — | — | — | — |
| 1,3-benzene-disulfonic acid diamide (Component B, No. 67, Table 1) | — | — | 0.59 | — | — | — |
| phenylthiourea (Component B, No.68, Table 1) | — | — | — | 0.38 | — | — |
| phenylurea (Component B, No.69, Table 1) | — | — | — | — | 0.34 | — |
| 2-benzoylamino-1,4-diethoxy-benzene (Component B, No.70, Table 1) | — | — | — | — | — | 0.68 |
| 30% aqueous formaldehyde solution | 0.5 | 0.5 | 0.5 | 0.5 | 0.5 | 0.5 |
| methanol | 1.8 | 0.9 | — | 1.6 | 1.1 | — |
| glacial acetic acid | — | — | 2.0 | — | — | 2.0 |

Visual Estimate of the Condensation Mixtures

| | Example: | 132 | 133 | 134 | 135 | 136 | 137 |
|---|---|---|---|---|---|---|---|
| Test Series a | | | | | | | |
| | after 3 hours | clear | clear | almost clear (was very turbid) | clear | clear | clear |
| | after 20 hours | clear | clear | clear | clear | clear | clear |
| | diluted with water to 10 times the original quantity | heavy yellow precipitation | slightly turbid | very turbid | clear | very turbid | slightly turbid |
| Test Series b | | | | | | | |
| | after 3 hours | heavy precipitation | clear | thick flaky precipitate | clear | clear | clear |
| | after approx. 20 hours | heavy precipitation | clear | thick flaky precipitate | clear | clear | clear |
| | diluted with water to 10 times the original quantity | heavy precipitation | oily precipitate | thick flaky precipitate | clear, but becomes turbid after standing a long time | flaky precipitate | thick precipitate |

The condensation mixtures of Test Series b) are diluted with water and then freed from precipitates and turbidity by adding some charcoal and drawing off with suction. Clear solutions are thus obtained which do not produce precipitates when a saturated NaCl solution or a zinc chloride solution is added.

The solutions obtained by Test Series a) (Examples 133 to 137) are made clear with charcoal where necessary (Examples 133, 134, 136, and 137) and then mixed with saturated common salt solution and zinc chloride. The precipitating metal halide double salts of the condensates are separated, dried, and analyzed.

The precipitate produced according to Example 132 is dissolved in warm water, reprecipitated by adding hydrochloric acid, separated, dried, and analyzed in this form.

From the following results of the analysis, in combination with the above stated results of a visual observation, it can be assumed that mixed condensates were formed. In addition thereto, the result of the analysis seems to indicate a certain partial saponification of the second component during condensation in some cases.

Results of the Analysis

| | Example | 132 | 133 | 134 | 135 | 136 | 137 |
|---|---|---|---|---|---|---|---|
| | C | 60.2% | 41.0% | 33.7% | 42.2% | 27.1% | 39.5% |
| | N | 9.85 | 9.75 | 8.6% | 12.4% | 6.9% | 7.85 |
| | ND | 3.47% | 5.06% | 4.31% | 6.11% | 3.16% | — |
| Atomic Ratios | | | | | | | |
| | c | 40.2 | 18.9 | 18.3 | 16.2 | 20.0 | 17.7 |
| | N | 5.65 | 3.83 | 4.0 | 4.06 | 4.36 | 3.0 |
| | ND | 2.0 | 2.0 | 2.0 | 2.0 | 2.0 | — |

EXAMPLE 138

15.5 parts by weight of diphenylamine-4-diazonium sulfate (Diazo 1, sulfate, Table 1) are dissolved in 100 parts by volume of 80 % sulfuric acid. With stirring, a mixture of 6.9 parts by weight of 2-phenoxyethanol (Component B, No. 18, Table 1), 14.8 parts by weight of a 50 % aqueous solution of glyoxylic acid, and 2 parts by volume of glacial acetic acid is poured into this solution, whereby the temperature rises to 58°C within a short time. By cooling, it is reduced to 40°C within 4 minutes. Subsequently, the mixture is cooled to room temperature, stirred for 5 hours at this temperature, and then allowed to stand overnight. A clear condensation mixture is the result. Upon adding 350 parts by volume of water, a condensation product precipitates, which is drawn off by suction, carefully washed with water, and dried. 21.1 parts by weight of a greenish-brown powder are obtained which is almost insoluble in aqueous solutions and in organic solvents. (C 56.0 %, N 7.0 %; atomic ratio: 28 : 3).

Since, by condensation of phenoxyethanol with glyoxylic acid under the conditions stated, a condensate of relatively good watersolubility is produced, which, being a polyacid, has a precipitating action on diazonium salts, it is not impossible that the isolated product contains also such a precipitate.

It will be obvious to those skilled in the art that many modifications may be made within the scope of the present invention without departing from the spirit thereof, and the invention includes all such modifications.

What is claimed is:

1. An aromatic diazonium compound comprising repeating units of each of the general types A - $N_2X$ and B which are linked by methylene groups, in which A-$N_2X$ is a radical of a compound of one of the general formulae $(R_1\text{-}R_3\text{-})_pR_2\text{-}N_2X$ and $R_1 - R_2\text{-}N_2X$ (with $R_1$ and $R_2$ also bridged by Y)

wherein $R_1$ is an arylene group of the benzene or naphthalene series $R_2$ is a phenylene group $R_3$ is a single bond or one of the groups —$(CH_2)_q$-$NR_4$—

—O-$(CH_2)_r$-$NR_4$—

—S-$(CH_2)_r$-$NR_4$—

—S-$CH_2$-CO-$NR_4$—

—O-$R_5$-O—

—O-

—S- or

—CO-$NR_4$— the left-hand free valence of the specified groups is attached to $R_1$ and the right-hand free valence is attached to $R_2$ wherein

*q* is a number from 0 to 5

*r* is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms, $R_5$ is an arylene group having 6 to 12 carbon atoms —Y— is one of the groups —NH—, and —O—

X is the anion of the diazonium compound, and

*p* is a number from 1 to 3, and

B is a radical of a compound selected from the group consisting of aromatic amines, phenols, thiophenols, phenol ethers, aromatic thioethers, aromatic heterocyclic compounds, aromatic hydrocarbons and organic acid amides, in which the aromatic nuclei are unsubstituted or substituted by at least one substituent activating condensation and selected from the group consisting of —$NR_7R_8$, —$N(R_8)_2$, —$OR_7$, —$OR_8$, —$R_8$, and —$SR_8$, wherein $R_7$ is -H, -CO-alkyl, -CO-aryl, -$SO_2$-alkyl, -$SO_2$-aryl, -$CONH_2$, or -$CSNH_2$, and $R_8$ -H, -alkyl, -aryl or -aralkyl, the alkyl groups having 1 to 10, the aryl groups 6 to 20, and the aralkyl groups 7 to 20 carbon atoms, which diazonium compound contains, on the average, about 0.01 to 50 B units per unit of A-$N_2X$.

2. A compound according to claim 1 having a molecular weight from 500 to 10,000.

3. A compound according to claim 1 in which the compound of which A is a radical is a 2,4',5-triethoxy-diphenyl-4-diazonium salt.

4. A compound according to claim 1 in which the compound of which A is a radical is a 4-(4-methyl-phenylmercapto)-2,5-dimethoxy-benzene diazonium salt.

5. A compound according to claim 1 in which the compound of which A is a radical is a 4-(4-methoxy-phenyl-mercapto)-2,5-diethoxy-benzene diazonium salt.

6. A compound according to claim 1 containing, on the average, about 0.1 to 20 B units per unit of $A-N_2X$.

7. A compound according to claim 1 in which the $A-N_2X$ units are derived from a compound of the general formula

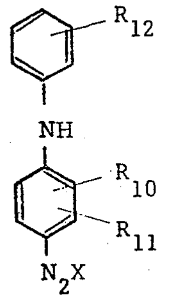

wherein $R_{10}$, $R_{11}$, and $R_{12}$ are selected from the group consisting of hydrogen, halogen, alkyl groups with 1 to 3 carbon atoms, and alkoxy groups with 1 to 5 carbon atoms, and X is the anion of the diazonium compound.

8. A compound according to claim 1 in which the compound of which B is a radical is an aromatic amine.

9. A compound according to claim 1 in which the compound of which B is a radical is a phenol.

10. A compound according to claim 1 in which the compound of which B is a radical is an aromatic heterocyclic compound.

11. A compound according to claim 1 in which the compound of which B is a radical is a phenolic ether.

12. A compound according to claim 1 in which the compound of which B is a radical is an aromatic thioether.

13. A compound according to claim 1 in which the compound of which B is a radical is an aromatic hydrocarbon.

14. A compound according to claim 1 in which the compound of which B is a radical is an organic acid amide.

15. A compound according to claim 14 in which the compound of which B is a radical is a carboxylic acid amide.

16. A compound according to claim 14 in which the compound of which B is a radical is a sulfonic acid amide.

17. A compound according to claim 1 in which the compound of which A is a radical is a diazo diphenylamine and the compound of which B is a radical is selected from the group consisting of diphenyl ethers and diphenyl sulfides.

18. A compound according to claim 1 in which the compound of which A is a radical is 3-methoxy-diphenylamine-4-diazonium dihydrogenphosphate and the compound of which B is a radical is 4-methyl-diphenylamine.

19. A compound according to claim 1 in which the compound of which A is a radical is 3-methoxy-diphenylamine-4-diazonium chloride and the compound of which B is a radical is phenol.

20. A compound according to claim 1 in which the compound of which A is a radical is diphenylamine-4-diazonium hydrogensulfate and the compound of which B is a radical is mesitylene.

21. A compound according to claim 1 in which the compound of which A is a radical is 3-methoxy-diphenylamine-4-diazonium hydrogensulfate and the compound of which B is a radical is 1,3-diisopropyl-benzene.

22. A compound according to claim 1 in which the compound of which A is a radical is diphenylamine-4-diazonium hydrogen sulfate and the compound of which B is a radical is anisole.

23. A compound according to claim 1 in which the compound of which A is a radical is diphenylamine-4-diazonium hydrogensulfate and the compound of which B is a radical is a mixture of phenanthrene and benzene.

24. A compound according to claim 1 in which the compound of which A is a radical is diphenylamine-4-diazonium hydrogensulfate and the compound of which B is a radical is 3-methylphenoxymethyl phosphonic acid.

25. A compound according to claim 1 in which the compound of which A is a radical is 3-methoxy-diphenylamine-4-diazonium hydrogensulfate and the compound of which B is a radical is diphenyl methane.

26. A compound according to claim 1 in which the compound of which A is a radical is 3-methoxy-diphenylamine-4-diazonium chloride, zinc chloride double salt, and the compound of which B is a radical is diphenyl ether.

27. A compound according to claim 1 in which the compound of which A is a radical is 3-methoxy-diphenylamine-4-diazonium hydrogensulfate and the compound of which B is a radical is diphenyl sulfide.

28. A compound according to claim 1 in which the compound of which A is a radical is diphenylamine-4-diazonium hydrogensulfate and the compound of which B is a radical is diphenyleneoxide.

29. A compound according to claim 1 in which the compound of which A is a radical is a mixture of diphenylamine-4-diazonium dihydrogenphosphate and 3-methoxy-diphenylamine-4-diazonium dihydrogenphosphate and the compound of which B is a radical is thiophene.

30. A process for the preparation of an aromatic diazonium compound which comprises reacting one molar part of at least one compound of one of the general formulae $(R_1-R_3)_p-R_2-N_2X$ and

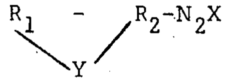

in which $R_1$ is an arylene group of the benzene or naphthalene series $R_2$ is a phenylene group $R_3$ is a single bond or one of the groups —$(CH_2)_q$-$NR_4$—

—O-$(CH_2)_r$-$NR_4$—

—S-$(CH_2)_r$-$NR_4$—

—S-$CH_2$-CO-$NR_4$—

—O-$R_5$-O—

—O—

—S— or

—CO-$NR_4$— the left-hand free valence of the specified groups is attached to $R_1$ and the right-hand free valence is attached to $R_2$ wherein $q$ is a number from 0 to 5

$r$ is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms,
-Y- is one of the groups -NH-, and -O-
X is an anion, and
*p* is a number from 1 to 3, and from 0.01 to 50 molar parts of at least one compound free of diazonium groups selected from the group consisting of aromatic amines, phenols, thiophenols, phenol ethers, aromatic thioethers, aromatic heterocyclic compounds, aromatic hydrocarbons and organic acid amides, in which the aromatic nuclei are unsubstituted or substituted by at least one substituent activating condensation and selected from the group consisting of $-NR_7R_8$, $-N(R_8)_2$, $-OR_7$, $-OR_8$, $-R_8$ and $-SR_8$,
wherein
$R_7$ is -H, -CO-alkyl, -CO-aryl, $-SO_2$-alkyl, $-SO_2$-aryl, $-CONH_2$, or $-CSNH_2$, and
$R_8$ is -H, -alkyl, -aryl or -aralkyl,
the alkyl groups having 1 to 10, the aryl groups 6 to 20, and the aralkyl groups 7 to 20 carbon atoms, with at least 0.5 molar part of formaldehyde in a strongly acid medium.

31. A process according to claim 30 which comprises reacting one molar part of a compound of the general formula

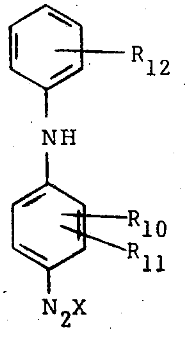

wherein
$R_{10}$, $R_{11}$, and $R_{12}$ are selected from the group consisting of hydrogen, halogen, alkyl groups with 1 to 3 carbon atoms, and alkoxy groups with 1 to 5 carbon atoms, and
X is an anion and from 0.1 to 20 molar parts of at least one compound free of diazonium groups selected from the group consisting of aromatic amines, phenols, thiophenols, phenol ethers, aromatic thioethers, aromatic heterocyclic compounds, aromatic hydrocarbons and organic acid amides, in which the aromatic nuclei are unsubstituted on substituted by at least one substituent activating condensation and selected from the group consisting of $-NR_7-R_8$, $-N(R_8)_2$, $-OR_7$, $-OR_8$, $-R_8$ and $-SR_8$, wherein
$R_7$ is -H, -CO-alkyl, -CO-aryl, $-SO_2$-alkyl, $-SO_2$-aryl, $-CONH_2$, or $-CSNH_2$, and
$R_8$ is -H, -alkyl, -aryl or -aralkyl,
the alkyl groups having 1 to 10, the aryl groups 6 to 20, and the aralkyl groups 7 to 20 carbon atoms, with at least 0.5 molar part of formaldehyde in a strongly acid medium.

32. A process according to claim 30 in which the condensation medium used is a concentrated acid.

33. A process according to claim 32 in which the condensation medium used is selected from the group consisting of phosphoric acid, methane sulfonic acid, and sulfuric acid, in a concentration in the range of about 70 to 100%.

34. A process according to claim 50 in which the condensation is performed in a temperature range of about 10°C. to 50°C.

35. Light-sensitive material comprising a base material having a layer thereon including an aromatic diazonium compound comprising repeating units of each of the general types $$A\text{-}N_2X \text{ and } B$$

which are linked by methylene groups, in which $A\text{-}N_2X$ is a radical of a compound of one of the general formulae

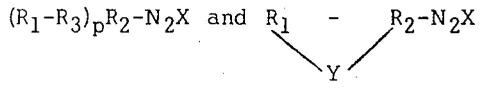

wherein
$R_1$ is an arylene group of the benzene or naphthalene series
$R_2$ is a phenylene group
$R_3$ is a single bond or one of the groups
$-(CH_2)_q-NR_4-$
$-O-(CH_2)_r-NR_4-$
$-S-(CH_2)_r-NR_4-$
$-S-CH_2-CO-NR_4-$
$-O-R_5-O-$
$-O-$
$-S-$ or
$-CO-NR_4-$
the left-hand free valence of the specified groups is attached to $R_1$ and the right-hand free valence is attached to $R_2$
wherein
*q* is a number from 0 to 5
*r* is a number from 2 to 5
$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
-Y- is one of the groups -NH-, and -O-
X is the anion of the diazonium compound, and
*p* is a number from 1 to 3, and
B is a radical of a compound selected from the group consisting of aromatic amines, phenols, thiophenols, phenol ethers, aromatic thioethers, aromatic heterocyclic compounds, aromatic hydrocarbons and organic acid amides, in which the aromatic nuclei are unsubstituted or substituted by at least one substituent activating condensation and selected from the group consisting of $-NR_7R_8$, $-N(R_8)_2$, $-OR_7$, $-OR_8$, $-R_8$ and $-SR_8$, wherein
$R_7$ is -H, -CO-alkyl, -CO-aryl, $-SO_2$alkyl, $-SO_2$-aryl, $-CONH_2$, or $-CSNH_2$, and
$R_8$ is -H, -alkyl, -aryl, or -aralkyl,
the alkyl groups having 1 to 10, the aryl groups 6 to 20, and the aralkyl groups 7 to 20 carbon atoms, which diazonium compound contains, on the average, about 0.01 to 50 B units per unit of $A\text{-}N_2X$.

36. Light-sensitive material according to claim 35 in which the base material is a screen.

37. Light-sensitive material according to claim 35 in which the diazonium compound contains, on the average, about 0.1 to 20 B units per unit of $A\text{-}N_2X$.

38. Light-sensitive material according to claim 35 in which the A-$N_2X$ units are derived from a compound of the general formula

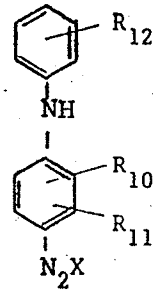

wherein $R_{10}$, $R_{11}$, and $R_{12}$ are selected from the group consisting of hydrogen, halogen, alkyl groups with 1 to 3 carbon atoms, and alkoxy groups with 1 to 5 carbon atoms, and X is the anion of the diazonium compound.

39. Light-sensitive material according to claim 35 in which the compound of which B is a radical is an aromatic amine.

40. Light-sensitive material according to claim 37 in which the compound of which B is a radical is a phenol.

41. Light-sensitive material according to claim 35 in which the compound of which B is a radical an aromatic heterocyclic compound.

42. Light-sensitive material according to claim 35 in which the compound of which B is a radical is a phenolic ether.

43. Light-sensitive material according to claim 35 in which the compound of which B is a radical is an aromatic thioether.

44. Light-sensitive material according to claim 35 in which the compound of which B is a radical is an aromatic hydrocarbon.

45. Light-sensitive material according to claim 35 in which the compound of which B is a radical is an organic acid amide.

46. Light-sensitive material according to claim 45 in which the compound of which B is a radical is carboxylic acid amide.

47. Light-sensitive material according to claim 45 in which the compound of which B is a radical is sulfonic acid amide.

48. Light-sensitive material according to claim 35 in which the compound of which A is a radical is a diazo diphenylamine and the compound of which B is a radical is selected from the group consisting of diphenyl ethers and diphenyl sulfides.

49. Light-sensitive material according to claim 35 in which the compound of which A is a radical is 3-methoxy-diphenylamine-4-diazonium dihydrogenphosphate and the compound of which B is a radical is 4-methyl-diphenylamine.

50. Light-sensitive material according to claim 35 in which the compound of which A is a radical is 3-methoxy-diphenylamine-4-diazonium chloride and the compound of which B is a radical is phenol.

51. Light-sensitive material according to claim 35 in which the compound of which A is a radical is diphenylamine-4-diazonium hydrogensulfate and the compound of which B is a radical is mesitylene.

52. Light-sensitive material according to claim 35 in which the compound of which A is a radical is 3-methoxy-diphenylamine-4-diazonium hydrogen sulfate and the compound of which B is a radical is 1,3-diisopropyl-benzene.

53. Light-sensitive material according to claim 35 in which the compound of which A is a radical is diphenylamine-4-diazonium hydrogen sulfate and the compound of which B is a radical is anisole.

54. Light-sensitive material according to claim 35 in which the compound of which A is a radical is diphenylamine-4-diazonium hydrogensulfate and the compound of which B is a radical is a mixture of phenanthrene and benzene.

55. Light-sensitive material according to claim 35 in which the compound of which A is a radical is diphenylamine-4-diazonium hydrogensulfate and the compound of which B is a radical is 3-methylphenoxymethyl phosphonic acid.

56. Light-sensitive material according to claim 35 in which the compound of which A is a radical is 3-methoxy-diphenylamine-4-diazonium hydrogensulfate and the compound of which B is a radical is diphenyl methane.

57. Light-sensitive material according to claim 35 in which the compound of which A is a radical is 3-methoxy-diphenylamine-4-diazonium chloride, zinc chloride double salt, and the compound of which B is a radical is diphenyl ether.

58. Light-sensitive material according to claim 35 in which the compound of which A is a radical is 3-methoxy-diphenylamine-4-diazonium hydrogensulfate and the compound of which B is a radical is diphenyl sulfide.

59. Light-sensitive material according to claim 35 in which the compound of which A is a radical is diphenylamine-4-diazonium hydrogensulfate and the compound of which B is a radical is diphenyleneoxide.

60. Light-sensitive material according to claim 35 in which the compound of which A is a radical is a mixture of diphenylamine-4-diazonium dihydrogenphosphate and 3-methoxy-diphenylamine-4-diazonium diphydrogenphosphate and the compound of which B is a radical is thiophene.

61. Light-sensitive material according to claim 35 in which the base material is aluminum.

62. Light-sensitive material according to claim 35 in which the base material is paper.

* * * * *

UNITED STATES PATENT OFFICE
CERTIFICATE OF CORRECTION

Patent No. 3,867,147 Dated February 18, 1975

Inventor(s) Leon A. Teuscher

It is certified that error appears in the above-identified patent and that said Letters Patent are hereby corrected as shown below:

Item [73] "Hoeschst" should read - - - Hoechst - - -.

Column 7, line 25, "advanageous" should read - - - advantageous - - - Line 45, "comm-"should read - - - com- - - -.

Column 8, line 46, "$-CHR_1-OR_b$" should read - - - $-CHR_a-OR_b$ - - -. Line 54, "daizo" should read - - - diazo - - -.

Column 9, line 29, after "When" insert - - - the - - -.

Column 11, line 45, "NH-" should read - - - -NH- - - -.

Column 12, line 11, "Suitably" should read - - - Suitable - - -. Line 15, "40' " should read - - - 4' - - -.

Column 13, line 11, "13 $R_8$" should read - - - $R_8$ - - -. Line 17, "-COHN-alkyl" should read - - - CONH-alkyl - - -. Line 19, "aralyl" should read - - - aralkyl - - -. Line 61, "frequency" should read - - - frequently - - -.

Column 14, line 28, "thiphenolethers" should read - - - thiophenolethers - - -. Line 64, "Sh" should read - - - SH - - -.

Column 20, line 36, "silicia" should read - - - silicic - - -.

Column 29, line 56, "started" should read - - - stated - - -.

Column 34, Table 2, Example 25, under "Further Additives", delete "0.1%" and substitute - - - 1/2 molecule - - -. Under "Solvent", delete

UNITED STATES PATENT OFFICE

CERTIFICATE OF CORRECTION

Patent No. 3,867,147 Dated February 18,1975

Inventor(s) Leon A. Teuscher

It is certified that error appears in the above-identified patent and that said Letters Patent are hereby corrected as shown below:

"1/2 molecule". Column 34, line 44, after "the" insert - - - addition of phosphoric acid to the coating solutions. The coating solutions - - -

Column 35, line 46, "ZN" should read - - - Zn - - -.

Column 37, line 3, "4acid" should read - - - 4-hydroxy-cinnamic acid - - -.

Column 38, line 38, after "10" insert - - - minutes - - -.

Column 41, line 3, after "36" insert - - - % - - -.

Column 46, line 61, "C:N:PP" should read - - - C:N:P - - -.

Columns 47/48 and 49/50, Table 3, "Proportion of A(D)" should read - - - "Proportion of $A(D)_n$ - - -, each occurrence.

Columns 47/48,Table 3, under "Other Additives" in Example 36, "2 molecules of $H_3PO_4$" should read - - - 2 molecules of $H_3PO_4$ per diazo group - - -.

Column 57, line 9, "Recinene-modified" should read - - - Ricinene-modified - - -.

Columns 59/60, Table 4, under "Other Additives", Example 63, "0.3 ml of 0.1 100 ml of solution" should read - - - 0.3 ml of 0.1 M $H_3PO_4$ per 100 ml of solution - - -. Same Table, the heading "Solvent (Mixtures," should read - - - Solvent (Mixtures, p.b.v.) - - -. Under "Solvent", Example 63, "EGMME/BA/$H_2O$" should read - - - EGMME/BA/-

UNITED STATES PATENT OFFICE
CERTIFICATE OF CORRECTION

Patent No. 3,867,147 Dated February 18, 1975

Inventor(s) Leon A. Teuscher

It is certified that error appears in the above-identified patent and that said Letters Patent are hereby corrected as shown below:

$H_2O$ 54 : 36 : 10 - - - . Same Table, under "Developer", Example 64, delete "pho" after "trisodium".

Column 62, line 15, "cloride" should read - - - chloride - --. Line 42, "resxult" should read - - - result - - -.

Columns 63 and 64, Table 5, under "Ex." insert - - - 72 - - - before "Diazo 3, $Cl^-$". Under "Diazo Compound $A(D)_n$", Example 72, delete "Diazo 3", second occurence and remainder of this item across the complete Table. Same Table, under "Solvent", Example 70, after "EGMME/DMF/$H_2O$" insert - - - 54 : 36 : 10 - - -. Under "Developer", Example 70, delete "54 : 36 : 10". Under "Developer", Example 68, after "+0.15%", insert - - - $NaH_2PO_4$ in water - - -.

Column 63, line 57, "diazol" should read - - - diazo - - -.

Column 66, line 7, "diazonamino" should read - - - diazoamino - - -. Example 76 of Table 6, under "Further Additives", after "0.55" insert - - - p.b. - - -.

Column 69, line 51, "10.75" should read - - - 0.75 - - -. Line 52, "part" should read - - - parts - - -. Line 67, "separate" should read - - - separated - - -.

Column 71, line 62, "$^o$c" should read - - - $^o$C - - -.

Column 72, line 2, "s" should read - - - S - - -.

UNITED STATES PATENT OFFICE
CERTIFICATE OF CORRECTION

Patent No. 3,867,147 Dated February 18, 1975

Inventor(s) Leon A. Teuscher

It is certified that error appears in the above-identified patent and that said Letters Patent are hereby corrected as shown below:

Columns 75/76, the heading "Proportion of A(D) in $B_1$ in" should read --- Proportion of $A(D)_n$ in $B_1$ in ---. Same Table, Example 94, under "Acid Added", "dimethylformamide" should be deleted from this column and placed under the column headed "Solvent used". Same Table, Example 96, under the first column, "Diazo 2," should read --- "Diazo 2, $HSO_4^-$ ---.

Table 8, at the bottom of columns 81/82 and the top of columns 83/84, the headings under "Mixed Condensate" should read --- Diazo Compound $A(-D)_n$ ---; --- Component $B_1$ ---; Approx. Ratio of $A(-D)_n$ and $B_1$ in Cond. Mixture ---; --- Mole $H_3PO_4$ per mole diazo groups (approx.) ---. The headings under "Coating Solution: should read --- Percentage of Crude Condensate ---; and --- Solvent ---.

Column 88, line 36, "characoal" should read --- charcoal ---.

Column 89, line 17, "4,4-" should read --- 4,4'- ---. Line 27, insert --- Yield: --- prior to line 28.

Column 90, line 2, "additionn" should read --- addition ---.

Columns 91/92, Table entitled "Solutions of Components B (Second Components), delete "(p.b.w.)" from under each of the Example numbers. Same Table, after each of numbers "0.62"; "0.5"; "0.59"; "0.38"; "0.34"; and "0.68" in the first six items of the table, insert --- p.b.w. ---. Same Table, after each of the numbers in the last three items of the Table, insert --- p.b.v. ---.

USCOMM-DC 60376-P69
★ U.S. GOVERNMENT PRINTING OFFICE : 1969 O—366-334.

UNITED STATES PATENT OFFICE
CERTIFICATE OF CORRECTION

Patent No. 3,867,147 Dated February 18, 1975

Inventor(s) Leon A. Teuscher

It is certified that error appears in the above-identified patent and that said Letters Patent are hereby corrected as shown below:

Columns 93/94, Table entitled "Results of the Analysis:, Item "N", for Example 132, "9.85" should read - - - 9.8% - - -; Example 133, "9.75" should read - - - 9.7% - - -; and Example 137, "7.85" should read - - - 7.8% - - -. Same Table, under Atomic Ratios, "c" should read - - - C - - -.

Signed and sealed this 13th day of May 1975.

(SEAL)
Attest:

RUTH C. MASON
Attesting Officer

C. MARSHALL DANN
Commissioner of Patents
and Trademarks